United States Patent
Tsujimoto

(10) Patent No.: US 9,709,634 B2
(45) Date of Patent: Jul. 18, 2017

(54) BATTERY SYSTEM AND CHARGE/DISCHARGE MEASURING APPARATUS

(71) Applicant: OSAKA CITY UNIVERSITY, Osaka (JP)

(72) Inventor: Hiroaki Tsujimoto, Wakayama (JP)

(73) Assignee: OSAKA CITY UNIVERSITY, Osaka (JP)

( * ) Notice: Subject to any disclaimer, the term of this patent is extended or adjusted under 35 U.S.C. 154(b) by 390 days.

(21) Appl. No.: 14/375,575

(22) PCT Filed: Jan. 30, 2013

(86) PCT No.: PCT/JP2013/000476
§ 371 (c)(1),
(2) Date: Oct. 17, 2014

(87) PCT Pub. No.: WO2013/114865
PCT Pub. Date: Aug. 8, 2013

(65) Prior Publication Data
US 2015/0028878 A1    Jan. 29, 2015

(30) Foreign Application Priority Data

Jan. 31, 2012   (JP) ................................ 2012-019205
Dec. 18, 2012   (JP) ................................ 2012-275948

(51) Int. Cl.
G01N 27/416   (2006.01)
G01R 31/36    (2006.01)
(Continued)

(52) U.S. Cl.
CPC ....... G01R 31/362 (2013.01); G01R 31/3624 (2013.01); G01R 33/096 (2013.01);
(Continued)

(58) Field of Classification Search
CPC ................................................... G01R 31/362
(Continued)

(56) References Cited

U.S. PATENT DOCUMENTS 5,418,086 A    5/1995  Bailey
5,473,262 A   12/1995  Yoshimatsu et al.
(Continued)

FOREIGN PATENT DOCUMENTS

CN    2196835 Y    5/1995
CN    1166711 A   12/1997
(Continued)

OTHER PUBLICATIONS

Office Action for related Chinese Patent Application No. 201380012806.6 dated Nov. 30, 2015.
(Continued)

*Primary Examiner* — Edward Tso
*Assistant Examiner* — Ahmed Omar
(74) *Attorney, Agent, or Firm* — William F. Nixon; Millen, White, Zelano & Branigan, P.C.

(57) ABSTRACT

The present invention provides a charge/discharge measuring apparatus capable of appropriate charge/discharge management by accurately measuring a capacitance change of a secondary battery in charge/discharge. This charge/discharge measuring apparatus is configured such that a current from the secondary battery can be switched between a first connection circuit in which the secondary battery, a load resistor, and a conductor film are connected in series and a second connection circuit in which the secondary battery, a charger, and the conductor film are connected in series. Moreover, this charge/discharge measuring apparatus has a magnetic film arranged in parallel with the conductor film and connected in parallel with connection from the secondary battery to the load resistor and the charger and has a (Continued)

voltage detecting means for detecting a voltage change in the magnetic film.

8 Claims, 54 Drawing Sheets

(51) Int. Cl.
*H01M 10/44* (2006.01)
*H01M 10/48* (2006.01)
*G01R 33/09* (2006.01)
*H01M 10/42* (2006.01)

(52) U.S. Cl.
CPC ........... *H01M 10/44* (2013.01); *H01M 10/48* (2013.01); *H01M 10/425* (2013.01); *H01M 10/488* (2013.01); *H01M 2010/4271* (2013.01)

(58) Field of Classification Search
USPC ....................................................... 324/426
See application file for complete search history.

(56) References Cited

U.S. PATENT DOCUMENTS

| | | | |
|---|---|---|---|
| 5,834,922 A | 11/1998 | Ikawa et al. | |
| 6,522,361 B2 | 2/2003 | Higuchi et al. | |
| 2001/0008424 A1 | 7/2001 | Higuchi et al. | |
| 2006/0022676 A1 | 2/2006 | Uesaka et al. | |
| 2007/0046263 A1 | 3/2007 | Matsushima et al. | |
| 2007/0077395 A1 | 4/2007 | Masai et al. | |
| 2011/0171506 A1 | 7/2011 | Nozawa et al. | |
| 2012/0229131 A1 | 9/2012 | Takenaga et al. | |
| 2014/0028262 A1 | 1/2014 | Nozawa et al. | |

FOREIGN PATENT DOCUMENTS

| | | |
|---|---|---|
| CN | 1967740 A | 5/2007 |
| CN | 102067372 A | 5/2011 |
| EP | 1783789 A1 | 5/2007 |
| JP | 2146936 A | 6/1990 |
| JP | 02170061 A | 6/1990 |
| JP | H08179018 A | 12/1994 |
| JP | 0850929 A | 2/1996 |
| JP | 200896442 A | 4/2008 |
| JP | 2009232659 | 10/2009 |
| JP | 2011047731 A | 3/2011 |
| JP | 2001332310 | 11/2011 |

OTHER PUBLICATIONS

English Translation for JP2008-096442, Publication Date: Apr. 24, 2008.
English Abstract and Translation for JPH08179018, Publication Date: Jul. 12, 1996.
English Abstract for CN2196835, Publication Date: May 10, 1995.
Supplementary Partial European Search Report for EP13744078 dated Nov. 12, 2015.
English Abstract and Machine Translation for JP2011047731, Publication Date: Mar. 10, 2011.
English Abstract and Machine Translation for JP0850929, Publication Date: Feb. 20, 1996.
International Search Report for PCT/JP2013/000476 dated Apr. 23, 2013.
English Abstract and Machine Translation for JP-2009232659, Publication Date: Oct. 8, 2009.
English Abstract for JP-02-146936, Publication Date: Jun. 6, 1990.
English Abstract and Machine Translation for JP2001332310, Publication Date: Nov. 30, 2001.
Notice of Allowance for related Japanese Patent Application No. 2013-556263 dated Jun. 2, 2015.
English Abstract of JPH02-170061, dated Jun. 29, 1990.
Japanese Office Action for Related Japanese Patent Application No. 2013-556263 dated Mar. 24, 2015.

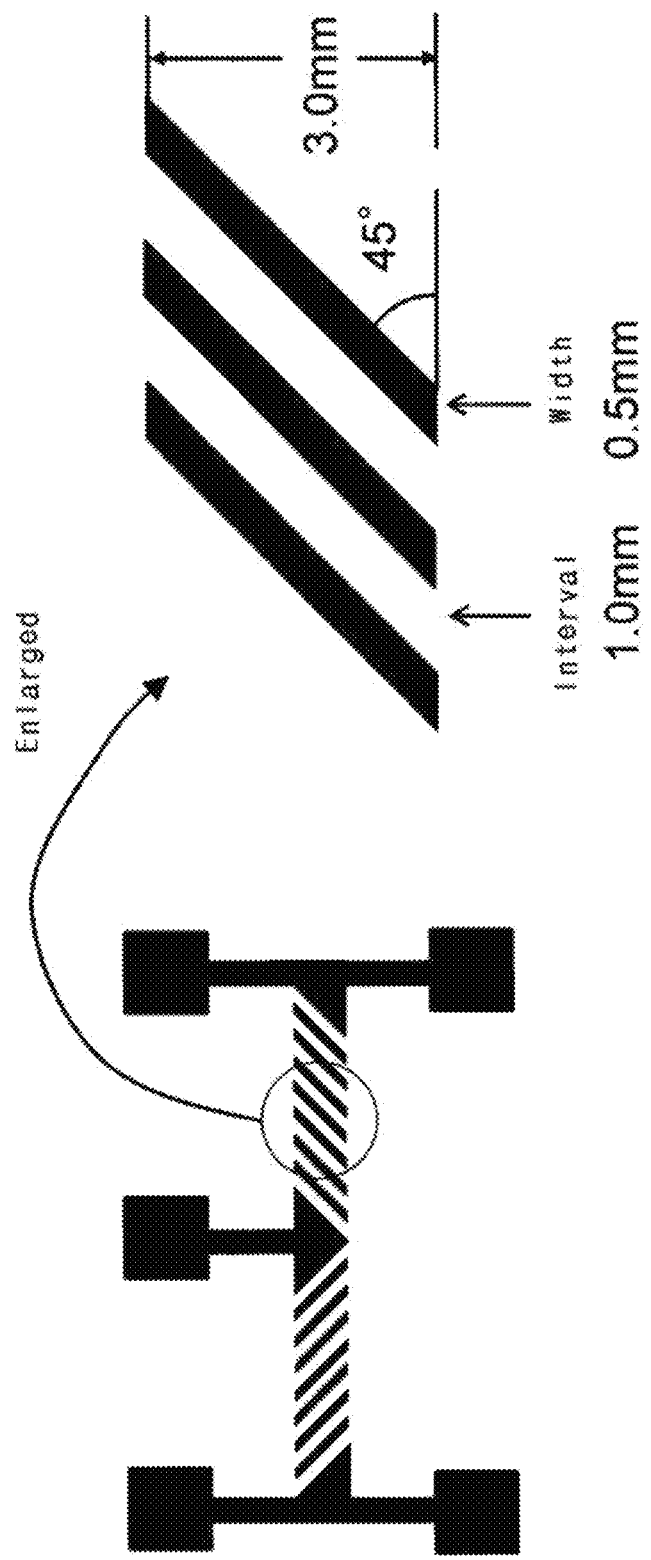

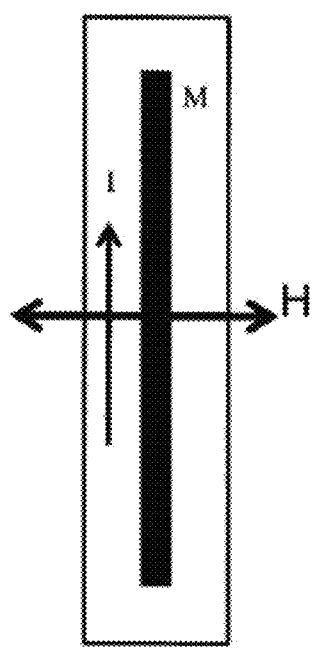
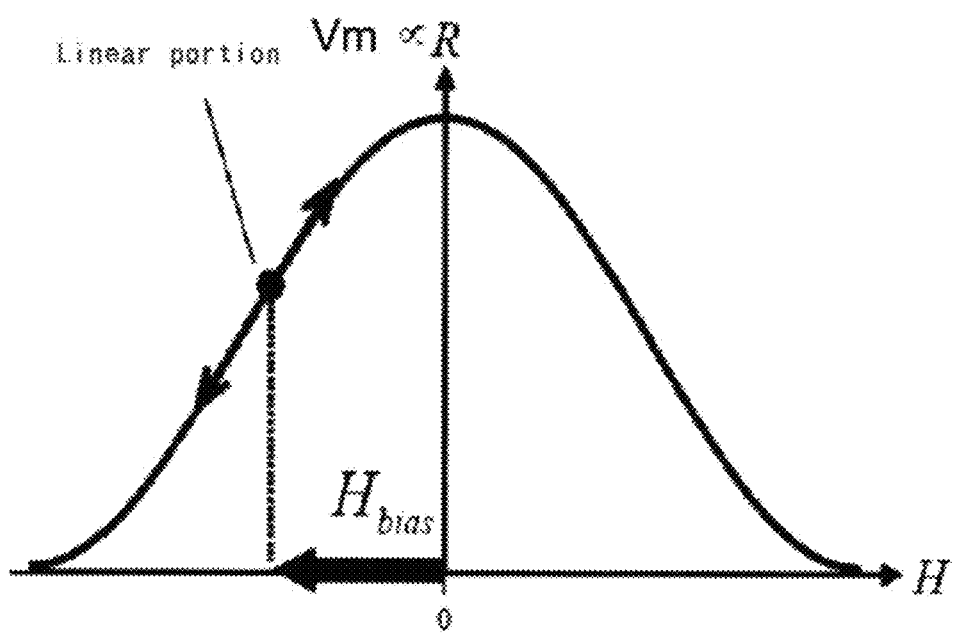
FIG. 30

BATTERY SYSTEM AND CHARGE/DISCHARGE MEASURING APPARATUS

TECHNICAL FIELD

The present invention relates to a power amount management system in charge and discharge of a secondary battery and a battery system using the same.

BACKGROUND ART

Recently, with a trend of higher density and expansion of applications, a storage battery (secondary battery) including a lithium ion battery is used in portable communication equipment such as a laptop computer, a mobile phone and the like, a hybrid/electric automobile or even in a storage battery for household. Demands for reduction of energy consumption and reduction of power consumption have risen with the recent environmental problems and the like as a background, and use of a storage battery is expected to be able to respond to the request. However, in order to utilize the storage battery for reduction of power consumption, power amount management (battery capacitance management) of the storage battery is an important problem.

Conventionally, the power amount management of the storage battery has been made by estimating and managing/controlling a charge/discharge amount by using experimental formulas and the like including time and temperature information on the basis of a terminal voltage of the storage battery.

However, in the case of the conventional method, an electricity storage condition of a storage battery (change of a battery capacitance) is estimated indirectly on the basis of the terminal voltage of the battery by considering time/temperature information and thus, the estimation accuracy is limited, and over-charging or insufficient charge might occur depending on an operating situation or a use environment condition. Moreover, a problem of over-discharging or the like also occurs in discharge (when the battery is in use) with the conventional method.

Moreover, a flammable material is used in a storage battery in many cases, and a problem in safety such as a risk of ignition caused by over-charging is also pointed out. Moreover, if a user does not accurately recognize insufficient charge of a storage battery, the user might feel inconvenience about a charge timing earlier than expected. On the other hand, over-discharging reduces a performance life of a battery due to a characteristic of a battery. Moreover, if a storage battery has indication of a remaining amount, if the remaining amount becomes small, drop of a terminal voltage becomes rapid due to the battery characteristic, and as a result, a sense of a "dead battery" comes earlier than expected and not match an actual feeling of use, which is inconvenient.

The above-described problems are caused by inability of accurate detection of a change in a battery capacitance in charge/discharge depending on an operating situation or a use environmental condition of a secondary battery.

CITATION LIST

Patent Literature

Patent Literature 1: Japanese Patent Laid-Open No. 2009-232659
Patent Literature 2: Japanese Patent Laid-Open No. 2001-332310

SUMMARY OF INVENTION

Technical Problem

The present invention was made in view of the above-described problems and has an object to provide a battery system and a charge/discharge measuring apparatus capable of appropriate charge/discharge management by accurately measuring a capacitance change of a secondary battery in charge/discharge.

Solution to Problem

Specifically, a battery system according to the present invention is characterized by having:
a secondary battery capable of charge/discharge;
an inspection resistor connected between terminals of the secondary battery via an inspection switch;
a pair of external terminals extended from both electrodes of the secondary battery and provided in parallel with the inspection resistor;
a voltmeter for measuring a voltage between the both electrodes of the secondary battery;
a discharge power measuring means for measuring a power amount discharged by the secondary battery;
a timer for measuring charge time and discharge time; and
a control unit,
wherein the control unit measures the charge time from a charge start voltage to a charge end voltage when the secondary battery is to be charged via the pair of external terminals;
after the charge is finished, an electric current is made to flow through the inspection resistor by the inspection switch; and
a remaining power amount is calculated on the basis of power consumed by the inspection resistor obtained by the discharge power measuring means and the charge time.

Moreover, the present invention provides a charge/discharge measuring apparatus capable of switching a current from the secondary battery between a first connection circuit in which the secondary battery, a load resistor, and a conductor film are connected in series and a second connection circuit in which the secondary battery, a charger, and the conductor film are connected in series. This charge/discharge measuring apparatus has a magnetic film arranged in parallel with the conductor film and connected in parallel with connection from the secondary battery to the load resistor and the charger, and has a voltage detecting means for detecting a voltage change in the magnetic film.

As will be described later, the present inventor obtained finding that measurement of a capacitance change of the secondary battery by a magnetic film power sensor is more useful than measurement of a voltage between the terminals of a battery as in a prior art. The charge/discharge measuring apparatus of the present invention is provided on the basis of this finding. Specifically, a circuit configuration is provided in which the first connection circuit of a discharge system for causing a current in parallel with the current from the secondary battery to a load to flow through the magnetic film of the magnetic film power sensor and a second connection circuit of a charge system for causing a current in parallel with a current from a storage battery to the secondary battery to flow through the same magnetic film can be switched alternately for each charge/discharge.

Moreover, the charge/discharge measuring apparatus of the present invention is the charge/discharge measuring apparatus described in claim 1, in which two of the magnetic films are connected in series, a magnetic field by a DC current is applied in an opposite direction, and the voltage detecting means detects a voltage change by applying differential amplification to an output voltage between end portions in a current direction of the two magnetic films.

In the case of this charge/discharge measuring apparatus, a magneto-resistance effect type magnetic film power sensor is utilized. The magneto-resistance effect type magnetic film power sensor measures a voltage change in a current direction, which is suitable for a narrow-shaped current path and is suitable for application to a smart grid and the like. On the other hand, a large bias voltage is generated in the output voltage of the magnetic film power sensor as will be described later. In order to cancel (reduce) this, in this charge/discharge measuring apparatus, a magnetic field by a current is applied in an opposite direction by connecting two magnetic film elements in series. As a result, an opposite bias voltage is generated in each of the magnetic films, and the bias voltage can be cancelled by subtracting the output voltage.

Moreover, the charge/discharge measuring apparatus may be configured such that a dummy resistor is connected in series with the magnetic film and the voltage detecting means detects a voltage change by applying differential amplification to the output voltage between the end portions in the current direction of the magnetic film and the dummy resistor.

This charge/discharge measuring apparatus also utilizes the magneto-resistance effect type magnetic film power sensor but the bias voltage is cancelled here by connecting the magnetic film element and the dummy resistor in series.

Moreover, regarding the above-described magnetic film, each of the short narrow-shaped magnetic films having a predetermined inclination angle θ1 with respect to the current direction is arranged in plural at intervals in the current direction depending on the case.

In the case of the magnetic film in this magneto-resistance effect type magnetic film power sensor, the magnetic films of the element are formed in a stripe state at intervals in a load current direction. Moreover, each of the stripe-state magnetic films is inclined with respect to the direction of the load current, respectively. For example, if the direction of the load current is from the left to the right, the magnetic film of the element is inclined to the right. The magnetic film with such a configuration is called herein a "barber-pole magnetic film". In this case, application of the magnetic field (bias magnetic field) by the above-described DC current is not necessary. That is because the magnetic field-resistance characteristic of the magnetic film of each element has a characteristic as if being biased by the bias magnetic field.

Moreover, in this charge/discharge measuring apparatus, two of the magnetic films are connected in series, and regarding one of the magnetic films, each of the short and narrow-shaped magnetic films having the predetermined inclination angle θ1 with respect to the current direction is arranged in plural at intervals in the current direction, while regarding the other of the magnetic films, each of the short and narrow-shaped magnetic films having a predetermined inclination angle θ2 opposite to that of the one magnetic film with respect to the current direction is arranged in plural at intervals in the current direction, and the voltage detecting means can detect a change in the output voltage between the end portions in the current direction of the entire two magnetic films.

In other words, that is a case in which the above-described barber-pole magnetic films are employed and connected in series so that the magnetic films have inclination opposite to each other to the direction of the load current, or in which the direction of the load current is from the left to the right, for example, the magnetic film of one of the elements is inclined to the right, while the magnetic film of the other element is inclined to the left. In such a configuration, each of the elements (magnetic films) is arranged in differential series, and only a change of an output voltage with a magnetic-field zero point as an operation point can be taken out.

Moreover, the voltage detecting means may detect a change in the output voltage between the end portions in a width direction with respect to the current direction of the magnetic film.

In the above-described magnetic film of the magnetic film power sensor, a change of an end-portion voltage in the current direction is measured as the magneto-resistance effect type magnetic film power sensor, but the charge/discharge management of the secondary battery may be performed by utilizing a so-called planar-hole effect type (PHE type) magnetic film power sensor for measuring displacement of the output voltage in the width direction of the magnetic film. In this case, a certain degree of a width needs to be ensured for the magnetic film, but on the other hand, an output of the bias voltage can be inherently avoided, which is advantageous.

Note that the magnetic film preferably has a metal magnetic body, a giant magneto-resistance (GMR) element, a tunnel magneto-resistance (TMR) element, a polymer magnetic body, and a semiconductor having a magneto-resistance effect, as main components.

Advantageous Effect of Invention

According to the charge/discharge measuring apparatus of the present invention, appropriate charge/discharge management can be performed by accurately measuring a capacitance change of the secondary battery in charge/discharge.

BRIEF DESCRIPTION OF THE DRAWINGS

FIG. 27 illustrate a diagonal conductor film and an electrode provided on an upper part of the magnetic film.

FIG. 30 illustrates a state of a change of electric resistance of the magnetic film by a normal magneto-resistance effect.

EMBODIMENTS

Specific embodiments of a charge/discharge measuring apparatus of the present invention and peripheral apparatus will be explained below. First, a magnetic film power sensor used as a power measuring means in this charge/discharge measuring apparatus will be explained.

Figure 1:
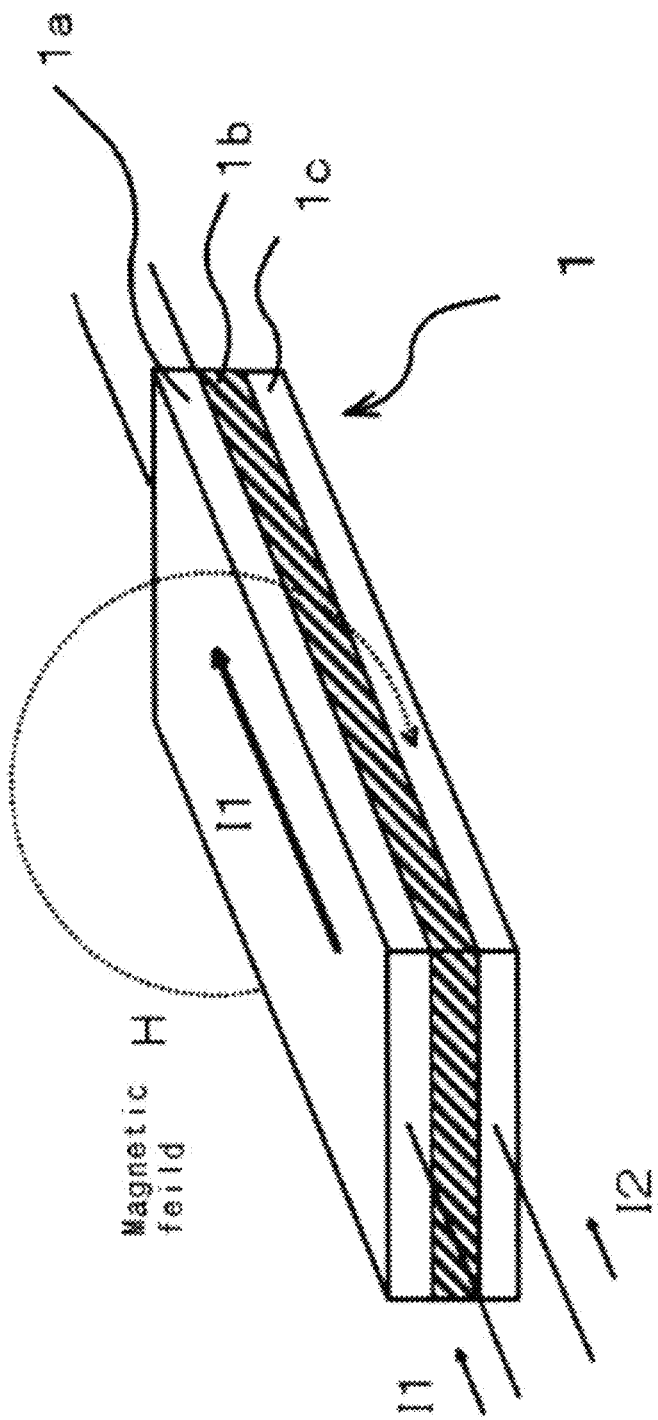
FIG. 1 is a schematic perspective view illustrating a structure of a magnetic film power sensor in the present invention.

This magnetic film power sensor 1 has, as illustrated in FIG. 1, a three-layer structure of a conductor film 1$a$, an insulating film 1$b$, and a magnetic film 1$c$ from above. For example, the conductor film 1$a$, the insulating film 1$b$, and the magnetic film 1$c$ are formed of copper Cu, polyimide base, and permalloy, respectively. When an electric current I1 is made to flow through the conductor film 1$a$, a magnetic field is generated. At this time, the magnetic field H is in proportion to the current I1 and thus, it can be expressed as H=$\alpha$I1.

Application of the magnetic field H causes a magneto-resistance effect in the magnetic film 1$c$, and a resistance value is changed. A change amount ($\Delta$R) of the resistance value is in proportion to the magnetic field H and thus, it can be expressed as $\Delta$R=$\beta$H. Finally, it becomes $\Delta$R=$\alpha$I1, and it is known that the change amount ($\Delta$R) of the resistance is in proportion to a current flowing through the conductor film 1$c$.

Figure 2:
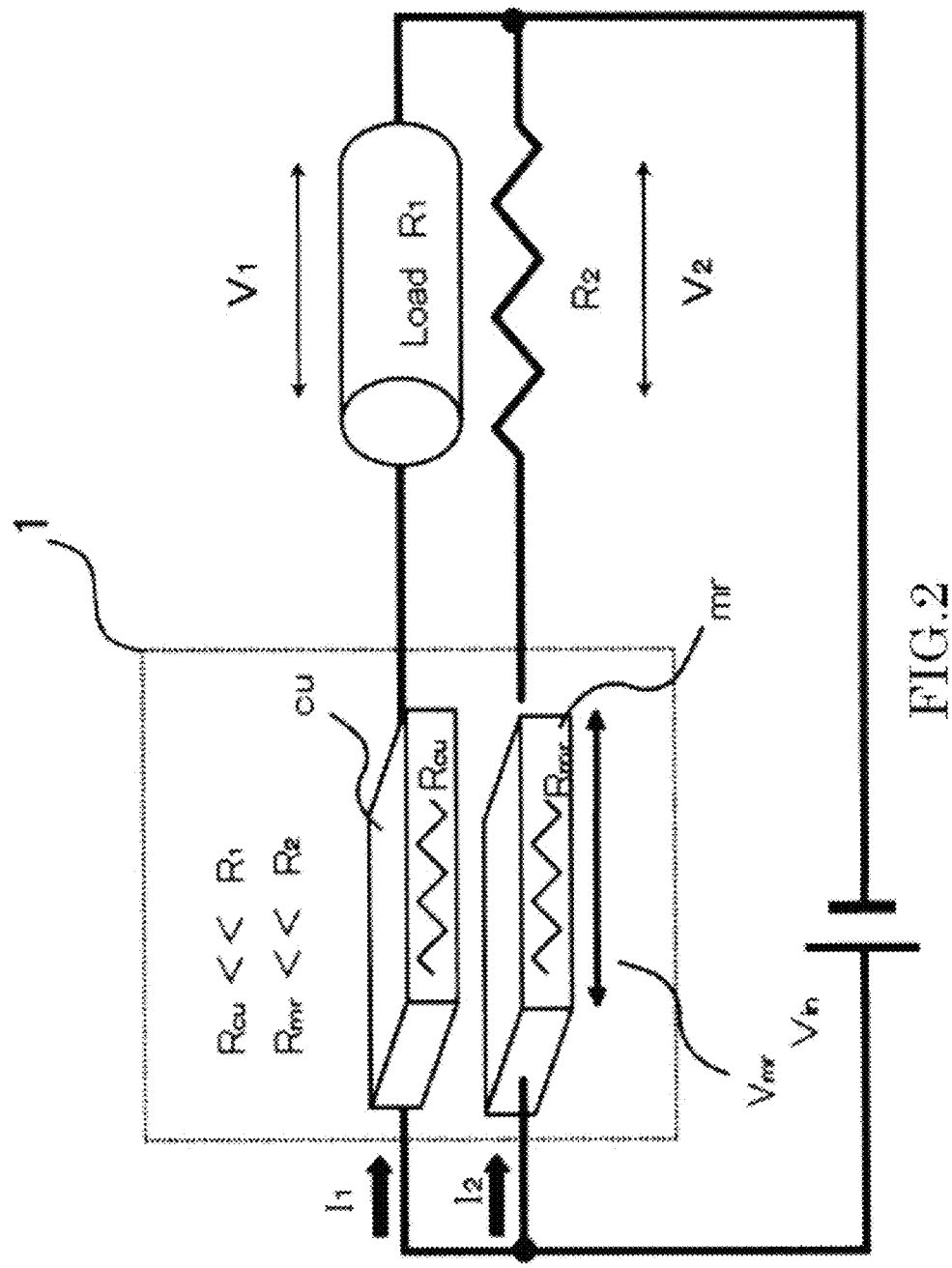
FIG. 2 is a schematic view for explaining a power measurement principle in the magnetic film power sensor illustrated in FIG. 1.

FIG. 2 explains a power measurement principle by the magnetic film power sensor 1 illustrated in FIG. 1. An input current is made to branch to currents I1 and I2 to the conductor film 1$a$ of the magnetic film power sensor 1 and the magnetic film 1$b$ arranged in parallel. A load R1 (Load R1) which becomes a power measurement target is arranged in series in the conductor film 1$a$, and a resistor R2 for ensuring the current I2 is arranged in series in the magnetic film 1$b$. A resistance Rcu of the conductor film 1$a$ and a resistance Rmr of the magnetic film are assumed to be sufficiently smaller than the load R1 and the resistor R2. Then, a voltage V2 applied to the resistor R2 can be approximated by an input voltage Vin. Similarly, a voltage V1 applied to the load R1 can be approximated by Vin.

At this time, a change amount $\Delta$Vmr of the voltage Vmr of the magnetic film 1$b$ can be expressed as $\Delta$Vmr=I2·$\Delta$Rmr, wherein a change amount of the resistor of the magnetic film is $\Delta$Rmr. The equation is approximated to I2$\approx$Vin/R2 and $\Delta$Rmr=$\alpha\beta$·I1 and as a result, $\Delta$Vmr=(Vin/R2) $\alpha\beta$·I1 is obtained.

As a result, the power consumption at the load can be expressed as V1·I1$\approx$(R2/$\alpha\beta$) $\Delta$Vmr. In this expression, the first term (R2/$\alpha\beta$) is a constant and thus, it is known that the change amount $\Delta$Vmr of the voltage applied to the magnetic film 1$b$ is in proportion to the power consumption. Thus, by measuring the value of this $\Delta$Vmr, the power consumption applied to the load is known.

In the battery system and the charge/discharge measuring apparatus of the present invention, such magnetic film power sensor 1 is used as a power measuring means. The magnetic film power sensor 1 has advantages that it is smaller in size and weight and easer to fabricate than a prior-art mechanical cumulative power meter and the like, self-consumed power is lower, and its output is an electricity amount. That is, the magnetic film power sensor 1 can be used as a built-in sensor to be incorporated into various electronic devices, batteries and electronic devices and is suitable for management and control of charge/discharge of a battery.

Subsequently, by referring to FIG. 3, a measurement system for DC power measurement is illustrated. The magnetic film power sensor 1 includes a PHE type (planar hole effect type) power sensor and a magneto-resistance effect type power sensor. In the planar hole effect type power sensor, a change of a voltage in a direction perpendicular to a current is used as an output when the current is made to flow through the magnetic film. In the magneto-resistance effect type power sensor, a change of a voltage in the same direction as a current is used as an output when the current is made to flow through the magnetic film.

The magneto-resistance type power sensor uses the terminal voltage in the same direction as the current flowing through the magnetic film as an output, and the element can be formed in an elongated shape. However, it has an inherent problem that a large bias voltage is generated. This leads to a problem that power by a DC voltage cannot be easily measured. If the barber-pole type which will be described later is employed, a bias voltage can be suppressed ideally. However, in actuality, somewhat bias voltage is generated due to ununiformity of the structure and imbalance of the magnetic characteristic.

On the other hand, in the planar hole effect type power sensor, the bias voltage is not generated in the output. However, since a width is required in a direction perpendicular to the current flowing through the magnetic film, there is a problem that it cannot be arranged easily in a connection line of a circuit.

Therefore, the magneto-resistance effect type power sensor cannot make DC power measurement singularly. It is necessary to remove this bias voltage and to obtain a voltage signal of only a change portion in the magneto-resistance effect type power sensor. In FIG. 3, in order to cancel the bias voltage, a resistor R3 having a resistance value equal to that of an offset resistor of the magnetic film of the magnetic film power sensor 1 is connected in series, and a connection point between the magnetic film and the resistor R3 is grounded (center-tap) so as to detect only a voltage change portion.

Note that the bias magnetic field is applied in a direction perpendicular to the direction of the current flowing through the magnetic film power sensor 1. Alternatively, an easy magnetization axis of the magnetic film is led in advance to the direction inclined to the direction in which the current flows.

Figure 3:
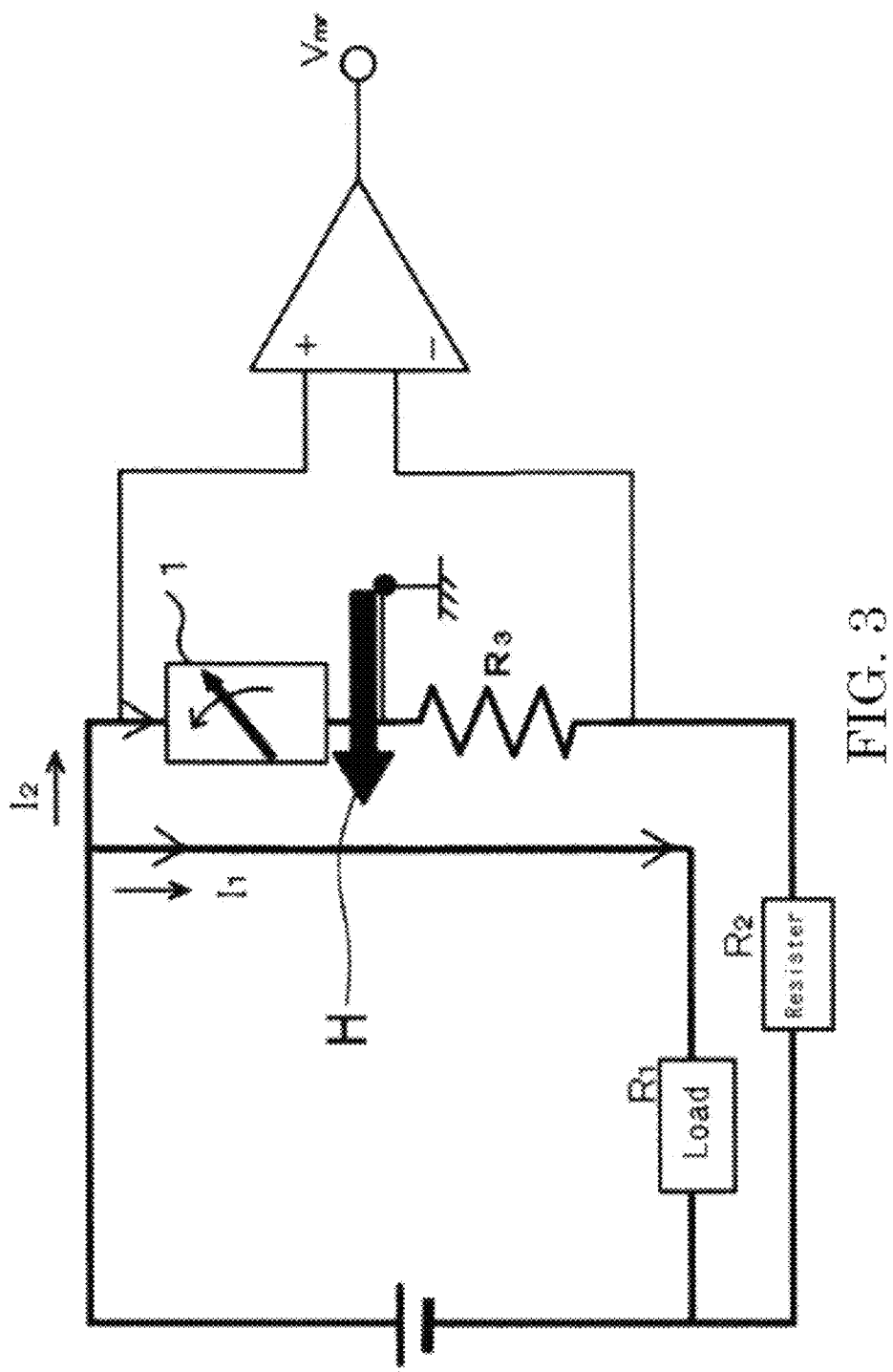
FIG. 3 is a schematic circuit diagram illustrating a measurement system for DC power measurement.
Figure 4:
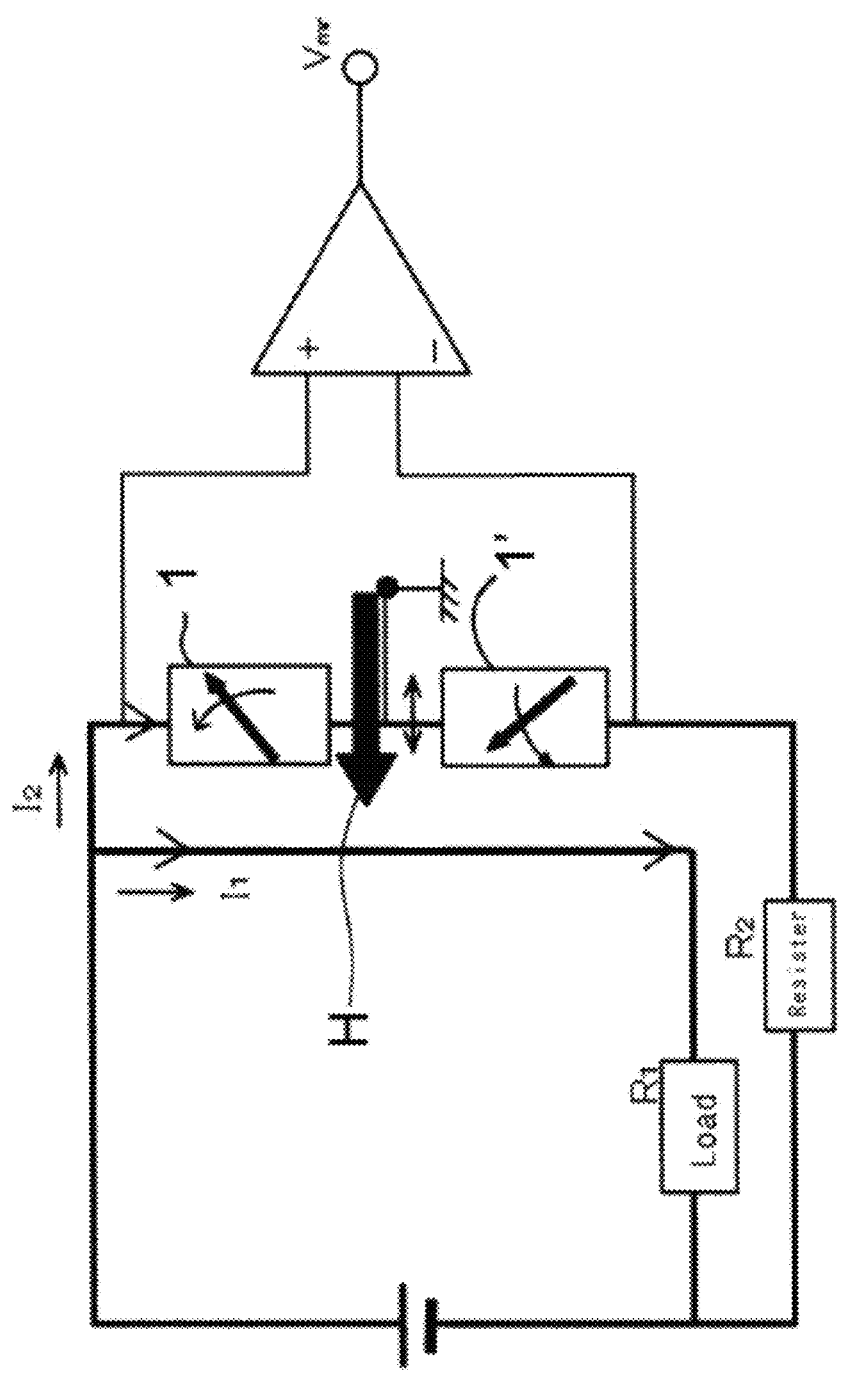
FIG. 4 is a variation of a connection circuit in FIG. 3, in which magneto-resistance effect type power sensors 1 and 1' are connected in series and installed so that an application direction of an external magnetic field H becomes opposite.

FIG. 4 is a variation of the connection circuit of FIG. 3, and the magneto-resistance effect type power sensors 1 and 1' are connected in series and installed so that the application direction of the external magnetic field H becomes opposite. Moreover, a connection point between each of the magneto-resistance effect type power sensors 1 and 1' is grounded. By employing this circuit configuration, offset voltages are cancelled by each other, and a change portion by the magnetic field H is changed in the opposite direction of the sign. Output voltages on both ends when the magneto-resistance effect type power sensors 1 and 1' are connected are differentially added together and the result becomes twice of that in FIG. 3.

Therefore, by using an element connecting method as in FIGS. 3 to 4, the problem of inability of DC power measurement due to an influence of a DC bias which is a defect of the power measurement by the magneto-resistance effect type power sensor can be solved.

Figure 5:
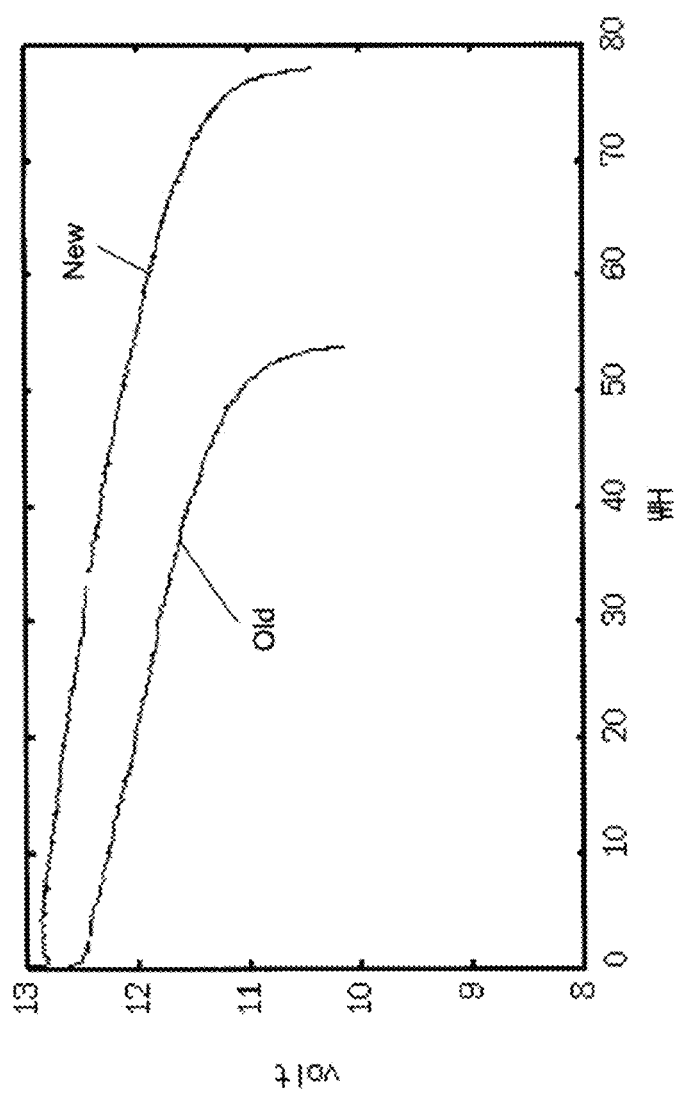
FIG. 5 is a graph illustrating a discharge characteristic of a battery.

Subsequently, a discharge characteristic of the battery will be explained. FIG. 5 is a graph illustrating the discharge characteristics of a lead storage battery. A vertical axis indicates a terminal voltage (Volt) and a lateral axis indicates a power amount (Wh). A line New indicates a battery not deteriorated and a line Old indicates the discharge characteristic of a deteriorated battery. As is known from this graph, the terminal voltage of the battery gradually drops with the discharge and a rapid drop of the terminal voltage is found in the end. Moreover, the power amount at which the terminal voltage lowers is different depending on a degree of deterioration of the battery.

Note that the secondary battery (chargeable) targeted by the present invention includes a lead storage battery mounted on many vehicles, a lithium ion battery, a nickel hydrogen battery, a widely sold nickel cadmium battery and the like. Any of the batteries basically has a difference in the discharge characteristic depending on a difference in deterioration indicated in FIG. 5.

Figure 6:
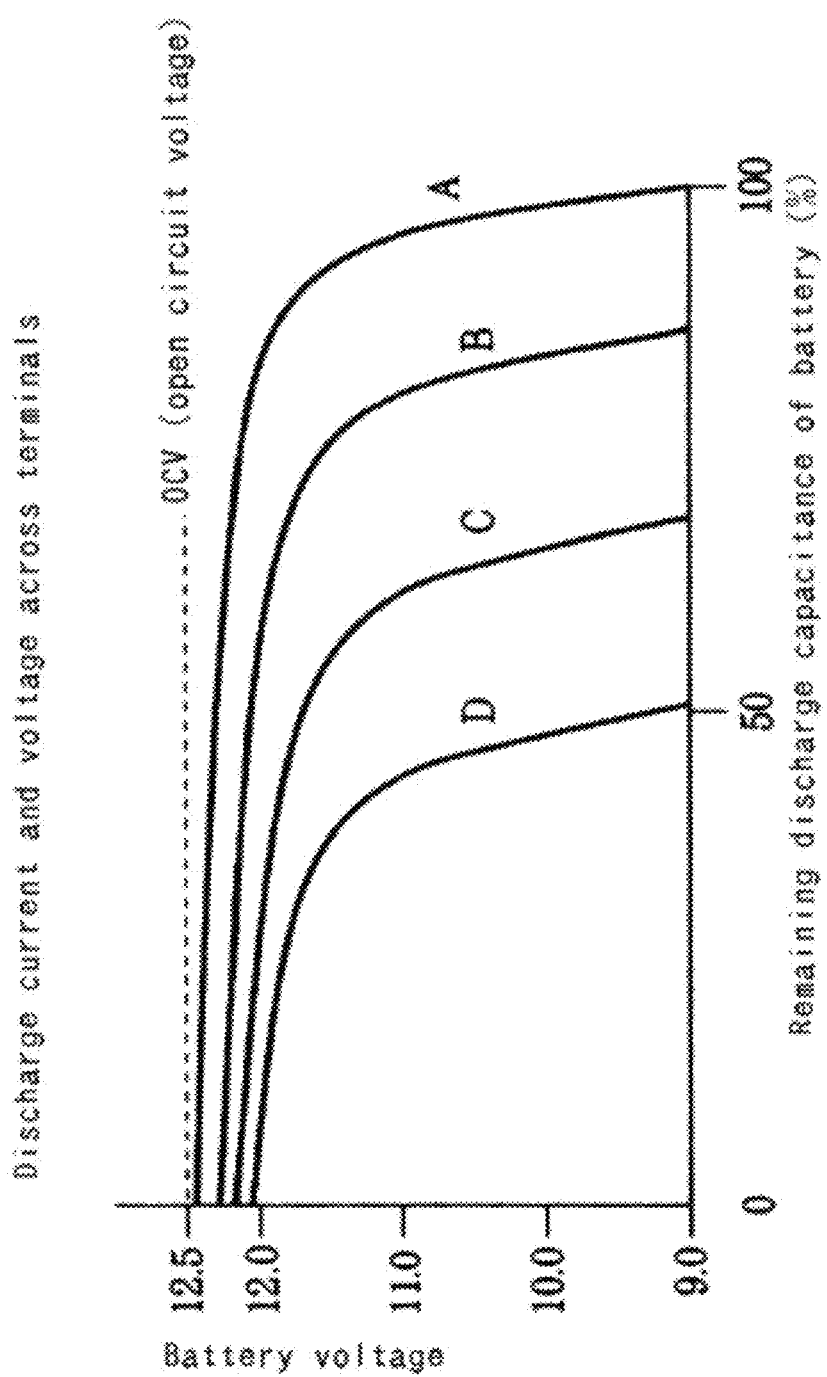
FIG. 6 illustrates an example of a change in a terminal voltage of the battery in different discharge currents.

An example of changes of the terminal voltages in different discharge current is shown in FIG. 6. The vertical axis indicates the terminal voltage of the battery, and the lateral axis indicates a remaining discharge capacitance (%) of the battery. A line A indicates changes in a battery voltage when a battery with 100 Ah is subjected to constant current discharge at 5 A (20 hour rate). A line B indicates changes in the battery voltage when a battery with 100 Ah is discharged at 10 A (10 hour rate). A line C indicates changes in the battery voltage when a battery with 100 Ah is discharged at 20 A (5 hour rate). A line D indicates changes in the battery voltage when a battery with 100 Ah is discharged at 100 A (1 hour rate).

It is known from this graph that, if the discharge current is different, a state of the change in the terminal voltage varies. Moreover, even if the terminal voltage is the same, it is known that the remaining discharge capacitance (remaining power) of the battery varies depending on a history of the discharge so far.

Figure 7:
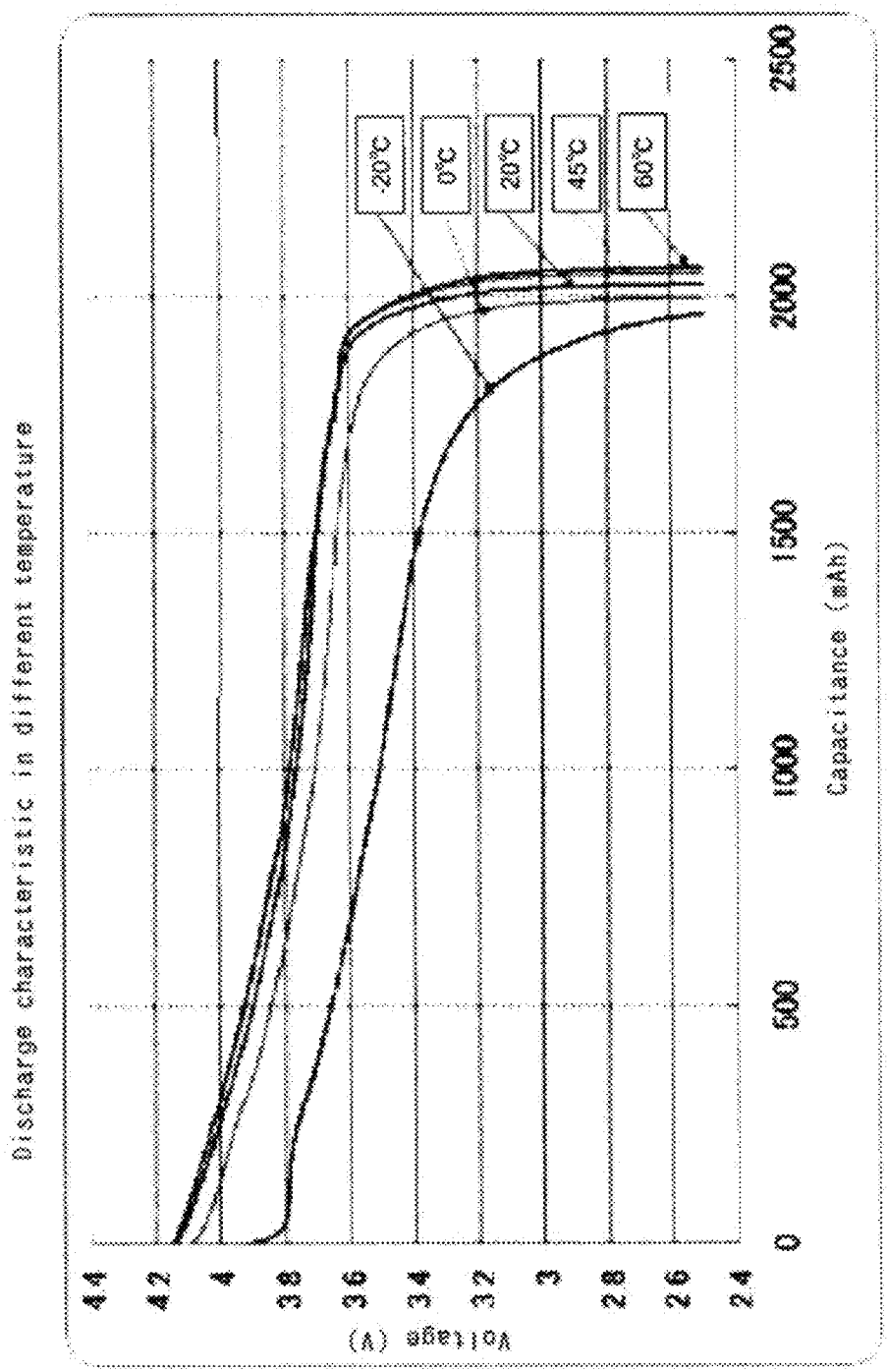
FIG. 7 illustrates the discharge characteristic of the battery in different temperature environments.

FIG. 7 illustrates the discharge characteristic of the battery in different temperature environments. The vertical axis indicates a battery voltage (2.4 V to 4.4 V) and the lateral axis indicates capacitance (0 to 2500 mAh). The discharge characteristic of a cylindrical type 18650 size with a nominal capacitance of 2000 mAh and the discharge current of 0.2 C (400 mA) is illustrated. Each of lines in the graph indicates a temperature environment during discharge. It is known that if a temperature environment is different, a change in the terminal voltage varies.

As described above, in the prior-art method of forecasting a remaining power amount of a battery by reading a terminal voltage of a battery which has been performed in general, it is known that an accurate remaining power amount of the battery cannot be measured since a drop curve of the battery terminal voltage varies depending on a use environment or a use state of the battery. Thus, this charge/discharge measuring apparatus for accurately measuring the remaining power amount of the battery is exemplified below.

Figure 8:
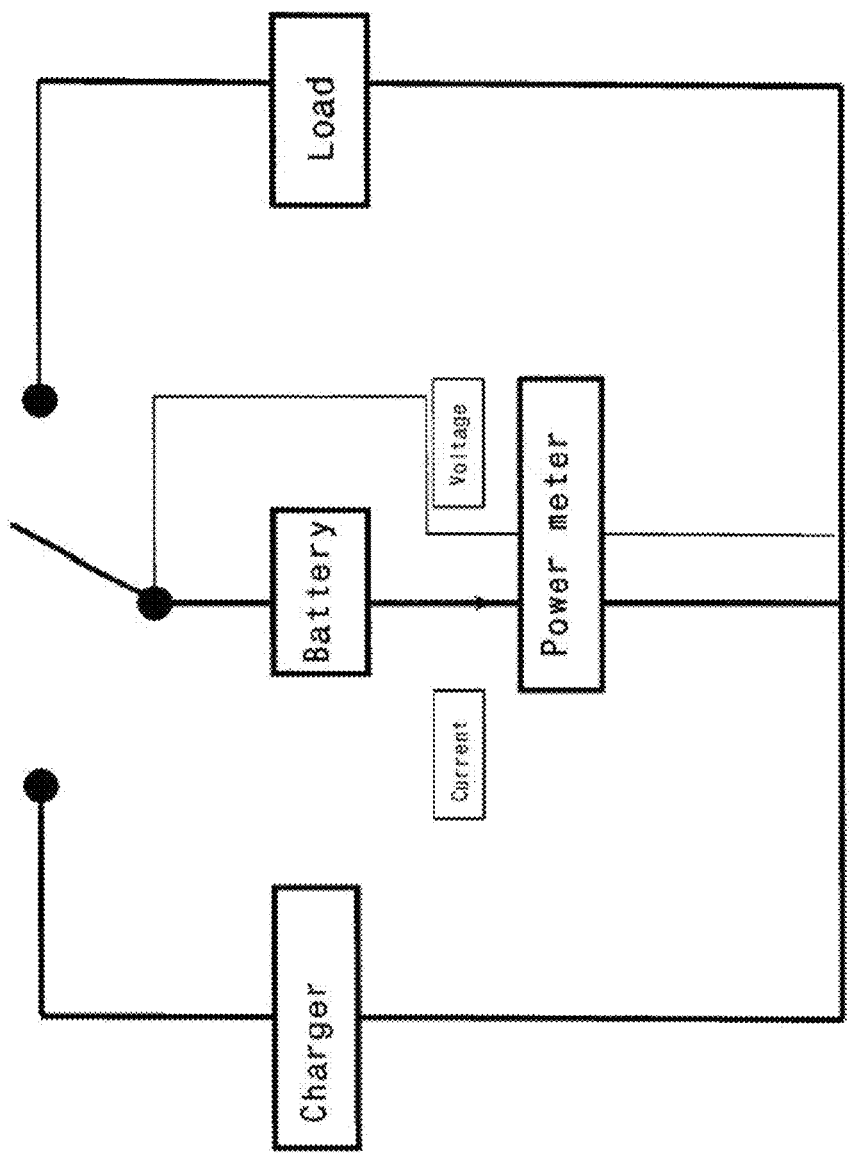
FIG. 8 illustrates a circuit for monitoring a movement amount (discharge amount, charge amount) of power when power is supplied to a load by the battery and when the battery is charged from an external power supply.

FIG. 8 illustrates a circuit for monitoring a power movement amount (discharge amount, charge amount) when power is supplied to a load by a battery and when the battery is charged by an external power supply. In charge/discharge, a direction in which a current flows changes to positive or negative. However, since a polarity of the terminal voltage of the battery is not changed, if an output of the power meter is positive in charge, a negative output is obtained in discharge, and a remaining power amount of the battery is obtained by integrating output signal in charge/discharge in an integration circuit. Since this power meter has bidirectionality, the remaining amount of the battery can be obtained by an extremely simple electric circuit.

Figure 9:
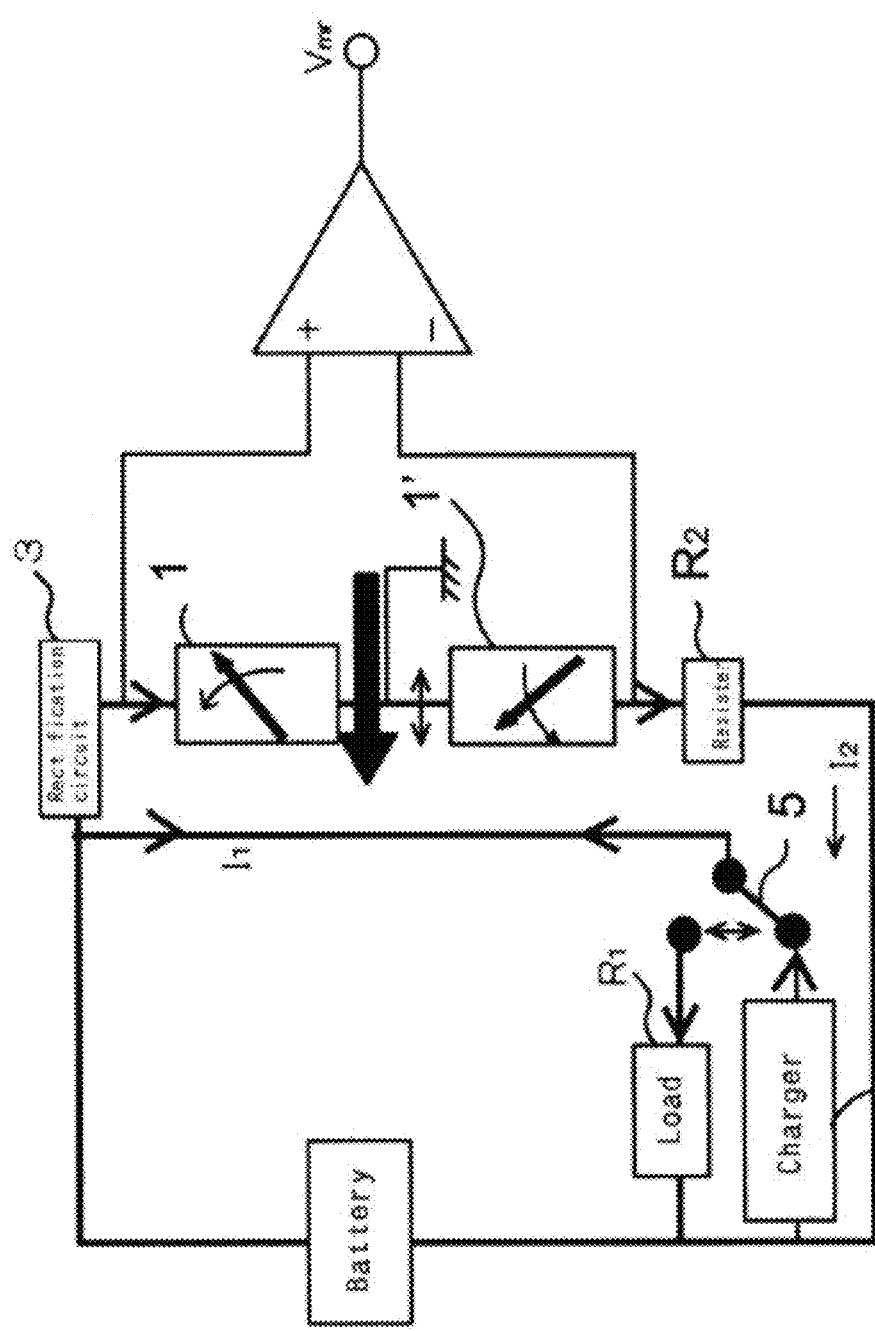
FIG. 9 illustrates an example of a connection circuit using a magnetic film power sensor element as a power meter in the circuit in FIG. 8.

FIG. 9 is an application example of FIG. 4. It illustrates an example of a connection circuit in which the magnetic film power sensor elements 1 and 1' illustrated in FIG. 4 are used for a portion which is made a power meter in the circuit in FIG. 8. Here, the magnetic film power sensors 1 and 1' use the magneto-resistance effect type power sensors for measuring a voltage displacement in a current direction of the magnetic film. In this connection circuit, a rectification circuit 3, a charger 4, and a selector switch 5 are added for power management of charge/discharge.

The rectification circuit 3 is to convert an AC current to a DC current, and a bridge circuit is a simplified configuration example. The charger 4 is to generate an AC current and to the charger 4, an external power supply or a driving device is connected, though not shown. It should be noted that, if the charger 4 generates a DC voltage, the rectification circuit 3 is not necessary.

In the case of the magneto-resistance effect type power sensor, in a connection configuration of a single magnetic film power sensor element, a large DC bias voltage is outputted when it handles a DC voltage. Therefore, in order to solve that, in the connection circuit in FIG. 9, two magneto-resistance effect type power sensor elements 1 and 1' are connected in series, and a contact is grounded. By employing this configuration, by applying a magnetic field by a current in an opposite direction and by differentially adding the DC bias voltage, the bias output voltage is cancelled. As a result, the DC power can be also made measurable even if the magneto-resistance effect type magnetic film power sensor is used.

First, when the selector switch 5 is connected to a load R1 side, power consumption of a battery which is a DC power supply can be detected as explained in FIG. 8. On the other hand, by connecting the selector switch 5 to a side of the charger 4, power charged to the battery can be detected by the charger 4.

Therefore, in the case of the connection method in FIG. 9, power movement amounts (discharge amount, charge amount) in a case in which power is supplied to the load R1 by the battery and in a case in which the battery is charged by the external power supply can be monitored.

Regarding cancellation of the bias output voltage, by using the connection circuit in FIG. 3, and a voltage equal to the DC bias voltage generated in the magnetic film power sensor 1 may be generated by the dummy resistor R2 and subtracted.

Moreover, a so-called barber-pole type magnetic film power sensor may be used as the magneto-resistance effect type power sensor. This barber-pole type magnetic film power sensor and a connection circuit using this will be explained separately by referring to FIG. 26 and after at the end of this specification.

Figure 10:
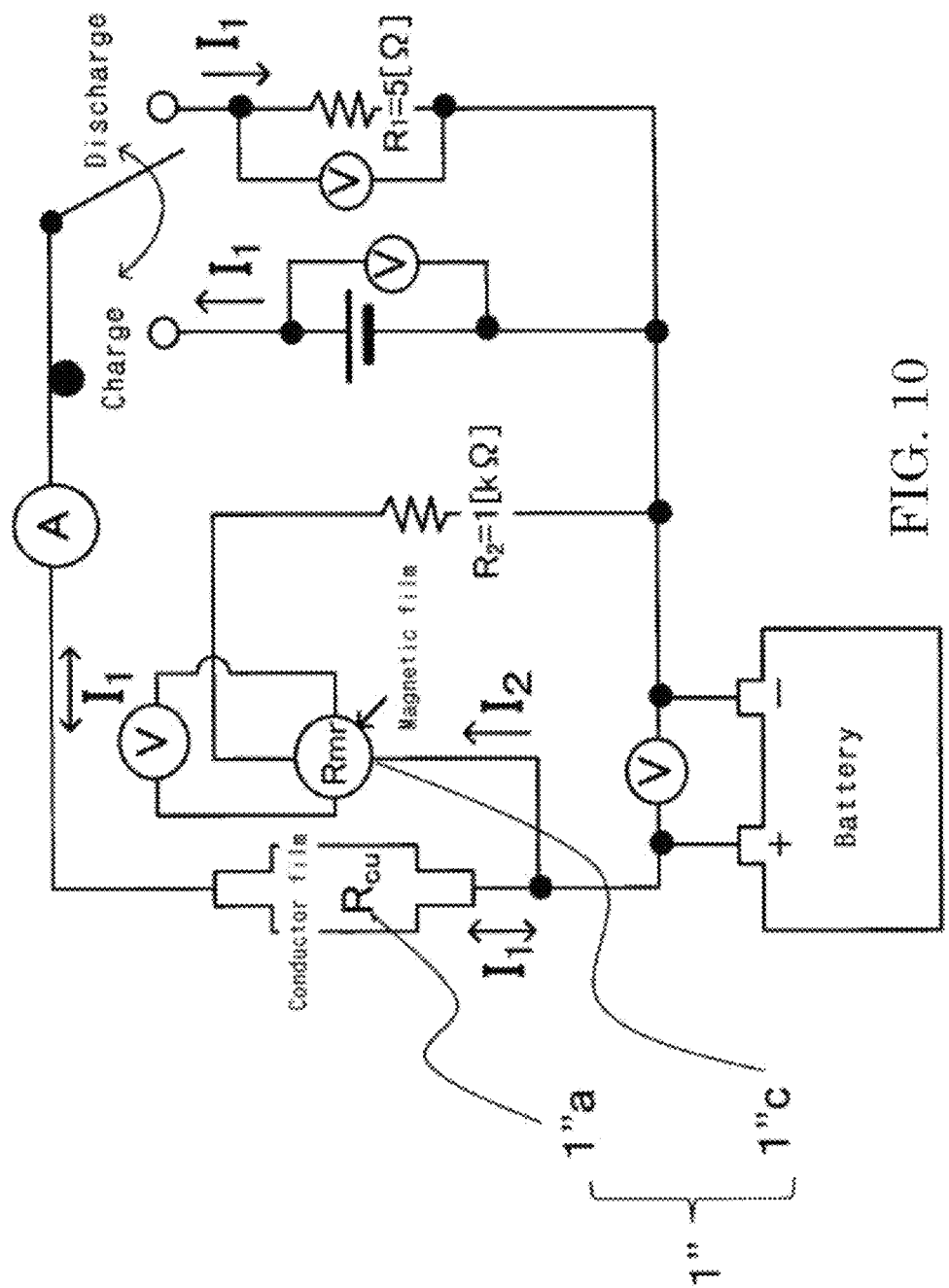
FIG. 10 illustrates a connection circuit of the charge/discharge measuring apparatus of a lead battery using a planar hole effect (PHE type) magnetic film power sensor 1" in the magnetic film power sensor.

Subsequently, FIG. 10 illustrates a connection circuit of the charge/discharge measuring apparatus of a lead battery using a planar hole effect (PHE type) type power sensor 1" in the magnetic film power sensors. The planar hole effect type power sensor 1" is to measure voltage displacement in a width direction (direction perpendicular to the current) of a magnetic film F. The planar hole effect type magnetic film power sensor 1" does not generate a bias voltage inherently. Therefore, there is no need to provide a configuration for cancelling the bias voltage in a connection circuit in FIG. 10 as in the connection circuit in FIG. 9. A discharge current (load current) or charge current $I_1$ in this connection circuit flows in directions opposite to each other in discharge or in charge. Moreover, $I_2$ flows through the magnetic film 1"c and a resistor $R_2$ in order to monitor a voltage of a battery all the time. In an experiment shown below, assuming that the charge current $I_1$ is constant at 2 A, a discharge current was a current $I_1$=2.4 A to 2.2 A flowing through the load $R_1$ (=5Ω).

Figure 11:
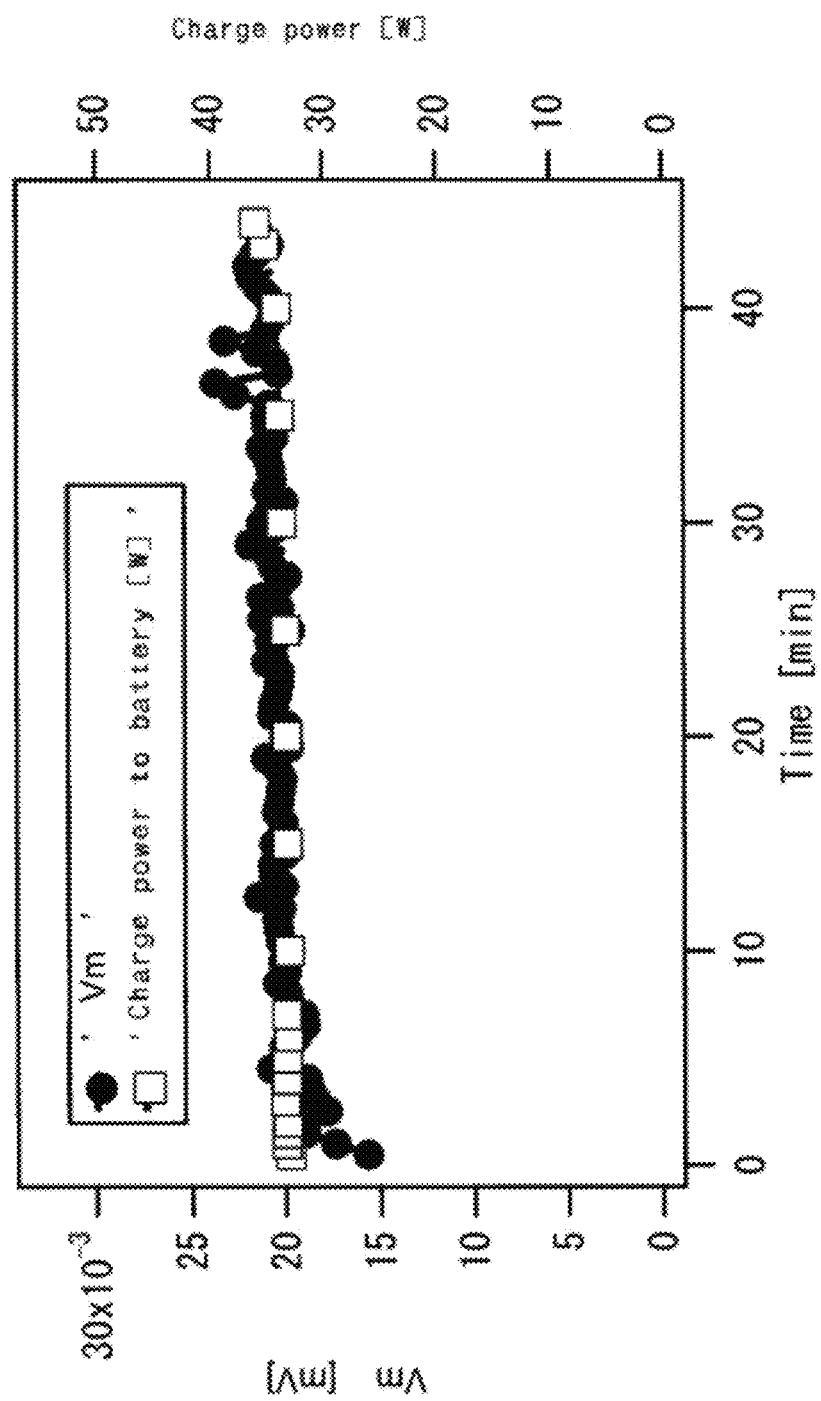
FIG. 11 is a graph illustrating a temporal change of an output (black circle mark (1): Vm) of the magnetic film power sensor 1" in charge in the connection circuit in FIG. 10 and of charge power (black square mark (2)) to the battery obtained from a charge current I1 and the terminal voltage of the battery.

FIG. 11 is a graph illustrating a temporal change of an output (black circle mark (1): Vm) of the magnetic film power sensor 1" in charge in the connection circuit in FIG. 10 and a charge power (white square mark (2): W) to the battery obtained from the charge current I1 and the terminal voltage of the battery. A left vertical axis indicates an output Vm (mV) of the magnetic film 1c", a right vertical axis is charge power (W), and a lateral axis is time (min). Note that the Vm is a magnetic film power sensor output. As is obvious from FIG. 11, a magnetic film power sensor output (1) and charge power (2) match each other extremely well.

Figure 12:
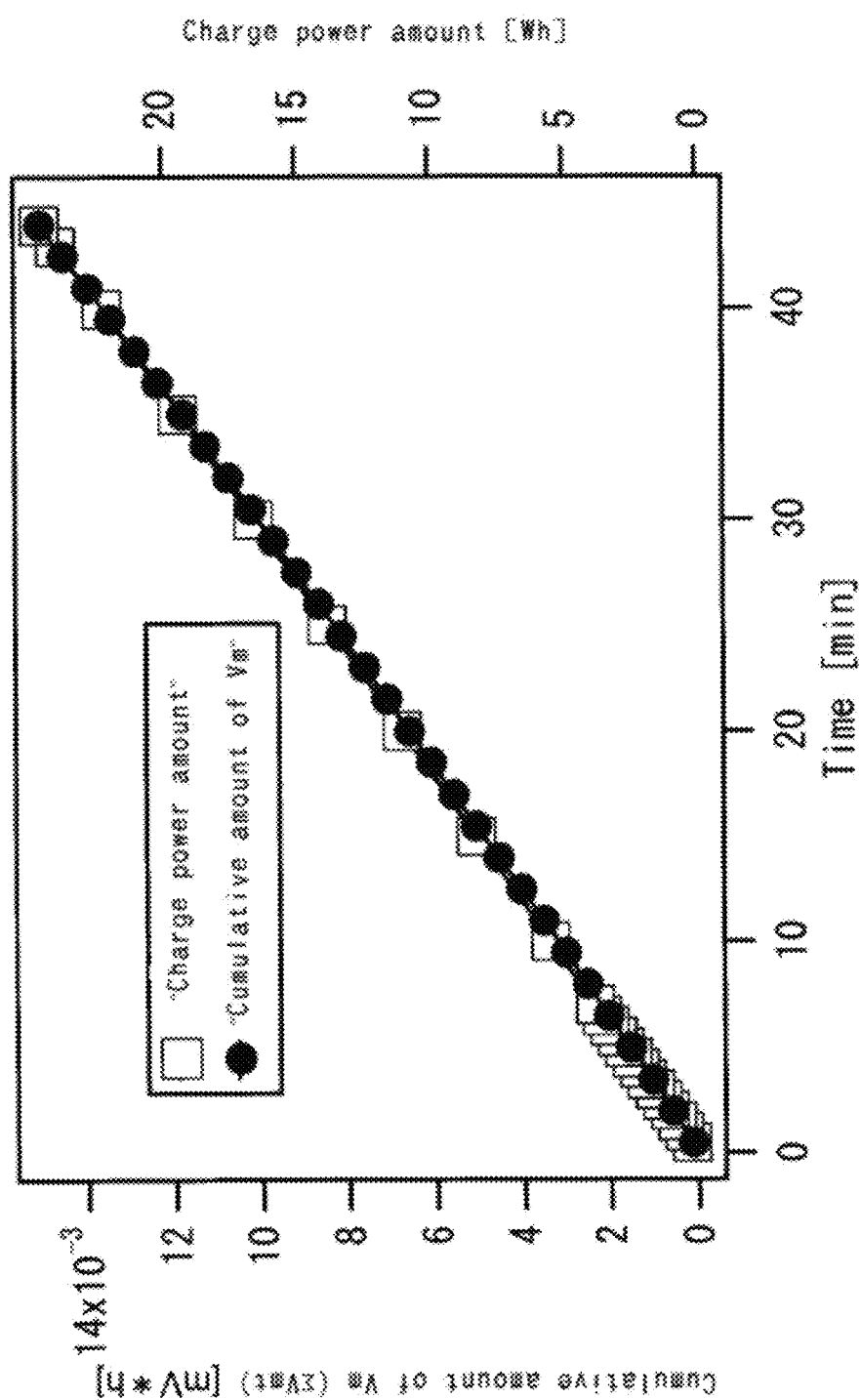
FIG. 12 illustrates a state of a change of a cumulative amount of the output (black circle mark (1)) of the magnetic film power sensor 1" in the connection circuit in FIG. 10 and a cumulative amount of charge power.

FIG. 12 illustrates a state of changes of a cumulative amount (black circle mark (1): ΣVmt) of the output (magnetic film power sensor output Vm) of the magnetic film 41c" in the connection circuit in FIG. 10 and a cumulative amount of charge power. A left vertical axis is ΣVmt (mV·h), a right vertical axis is a charge power amount (W·h), and a lateral axis is time (min). Similarly to FIG. 11, it is known that a cumulative amount (1) of the output of the magnetic film power sensor 1" and a cumulative amount (white square (2)) of the charge power match each other extremely well.

Figure 13:
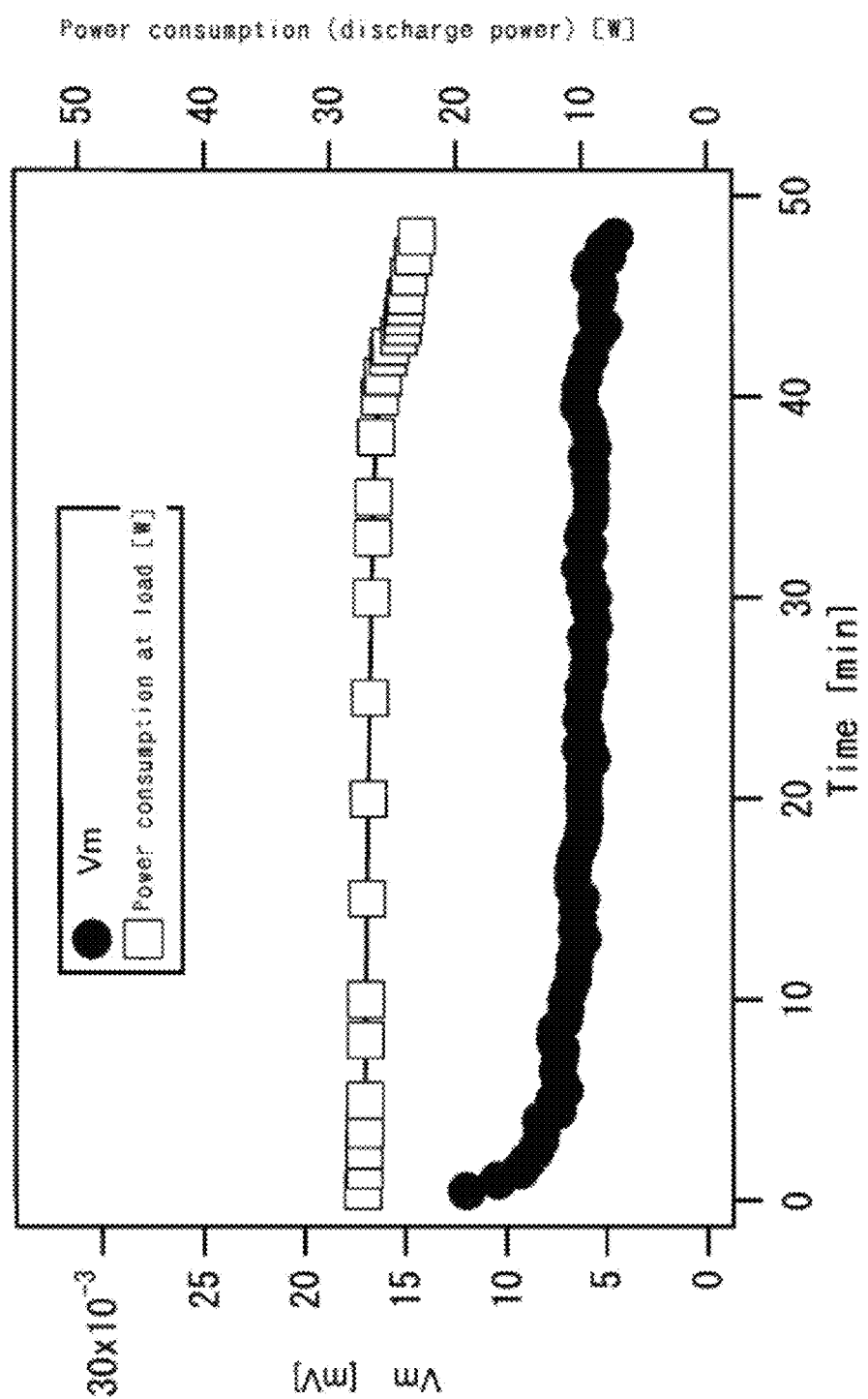
FIG. 13 is a temporal change of the output (black circle mark (1): Vm) of the magnetic film power sensor 1" in discharge in the connection circuit in FIG. 10 and power consumption (discharge power black square mark (2)) at a load obtained from the discharge current I1 and the terminal voltage of the load resistor R1.

FIG. 13 is a temporal change of the output (black circle mark (1): Vm) of the magnetic film power sensor 1" in discharge in the connection circuit in FIG. 10 and power consumption (discharge power white square mark (2)) at a load obtained from the discharge current $I_1$ and the terminal voltage of the load resistor $R_1$. A left vertical axis indicates Vm (mV), a right vertical axis indicates power consumption (W), and a lateral axis indicates time (min). As compared with charge in FIG. 11, regarding the output (1) of the magnetic film 1"c, a state of changes in several minutes from start of discharge is somewhat different (Vm lowers).

On the other hand, it is known that a state of changes in the power consumption (2) at the load resistor $R_1$ matches well. Note that the output of the magnetic film power sensor 1" became approximately ½ of that in charge (FIG. 11). That is why there is somewhat discrepancy between the direction of the easy axis of the magnetic film 1"c and the direction of the current, and a difference in a gain is caused by a change in the direction of the current between charge and discharge.

Figure 14:
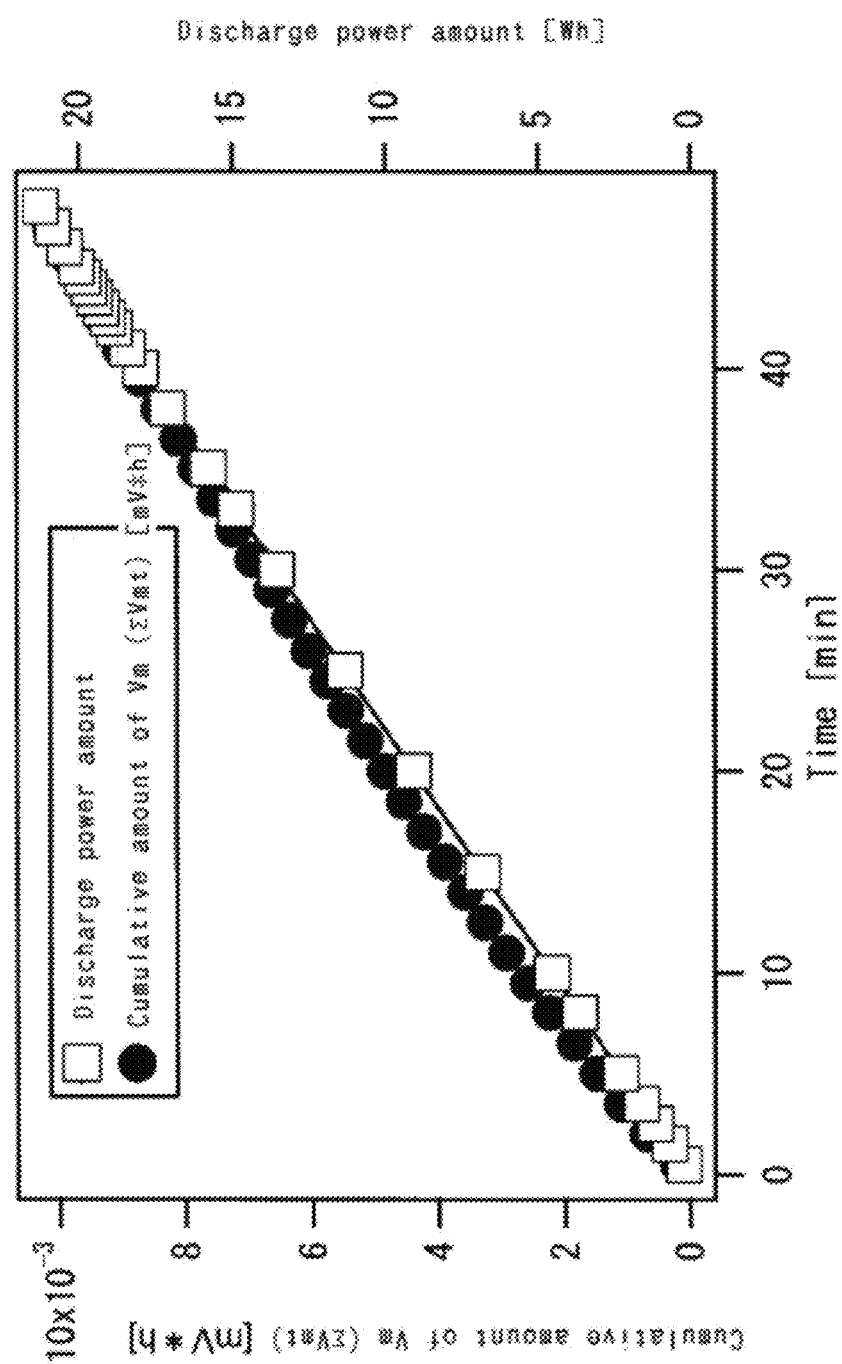
FIG. 14 illustrates a state of a change of the cumulative amount (black circle mark (1): ΣVmt) of the output (Vm) of the magnetic film power sensor 1" in the connection circuit in FIG. 10 and the cumulative amount (black square mark (2)) of the power consumption (discharge power) at the load resistor R1.

FIG. 14 illustrates a state of changes of the cumulative amount (black circle mark (1): ΣVmt) of the output (Vm) of the magnetic film power sensor 1" in the connection circuit in FIG. 10 and the cumulative amount (white square mark (2)) of the power consumption (discharge power) at the load resistor $R_1$. A left vertical axis indicates the cumulative amount ΣVmt (mV·h), a right vertical axis indicates a power consumption amount (W·h), and a lateral axis indicates time (min). Similarly to FIG. 12, it is known that the cumulative amount (1) of the output of the magnetic film power sensor 1" and the cumulative amount (2) of the power consumption match extremely well.

Figure 15:
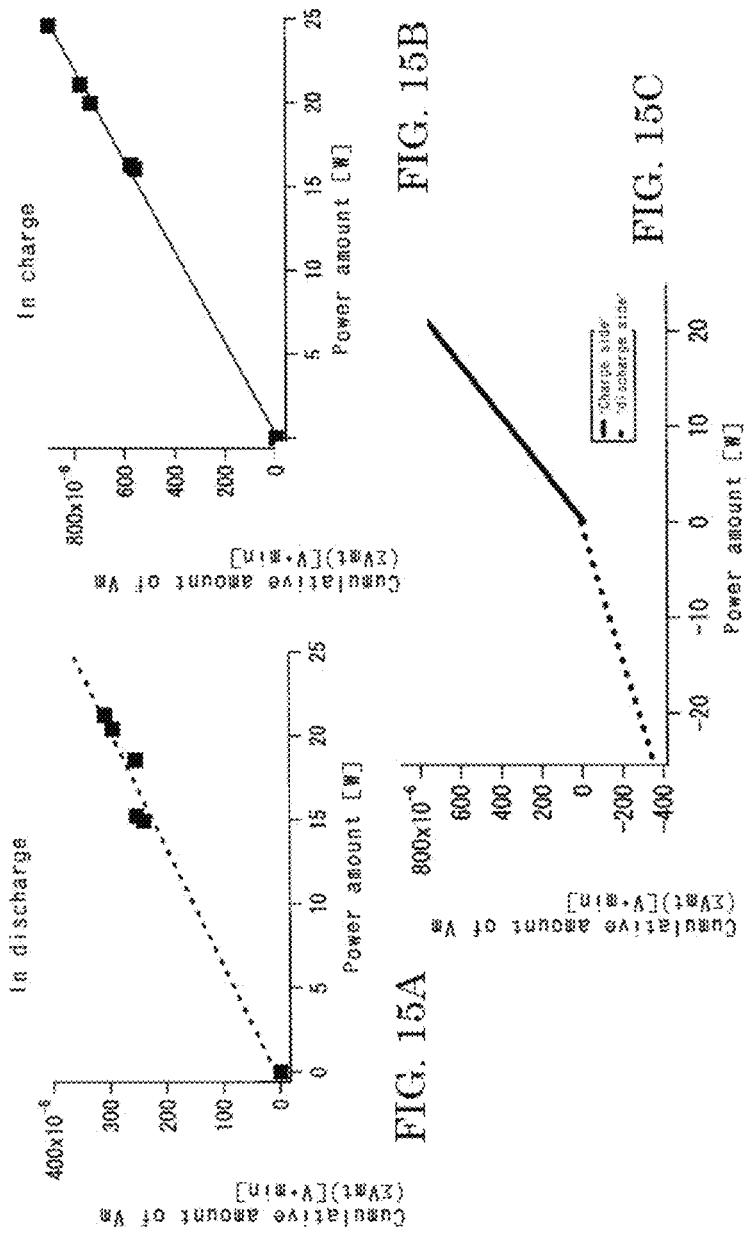
FIG. 15 illustrate output characteristics of the magnetic film power sensor 1" used in the connection circuit in FIG. 10.

Subsequently, FIGS. 15(a), 15(b), and 15(c) illustrate output characteristics of the magnetic film power sensor 1" used in the connection circuit in FIG. 10. FIG. 15(a) is a characteristic in discharge, in which a vertical axis indicates ΣVmt (V·min), and a lateral axis indicates a power consumption amount (W·h). FIG. 15(b) is a characteristic in charge, in which a vertical axis indicates ΣVmt (V·min), and a lateral axis indicates a charge power amount (W·h). Discrepancy from approximation lines in charge/discharge was 6% for discharge and 2% for charge. Note that an index of the vertical axis is $10^{-6}$.

FIG. 15(c) was obtained by re-plotting FIGS. 15(a) and 15(b) on the same vertical axis. Since the charge current and the discharge current have different directions, polarity of the output voltage Vm of the magnetic film power sensor 1" changes between discharge and charge. Here, the charge is assumed to be positive, while discharge is assumed to be negative. The inclination of ΣVmt which is a cumulative value changes between discharge and charge because the gain changes by the direction of the current between charge and discharge.

Figure 16:
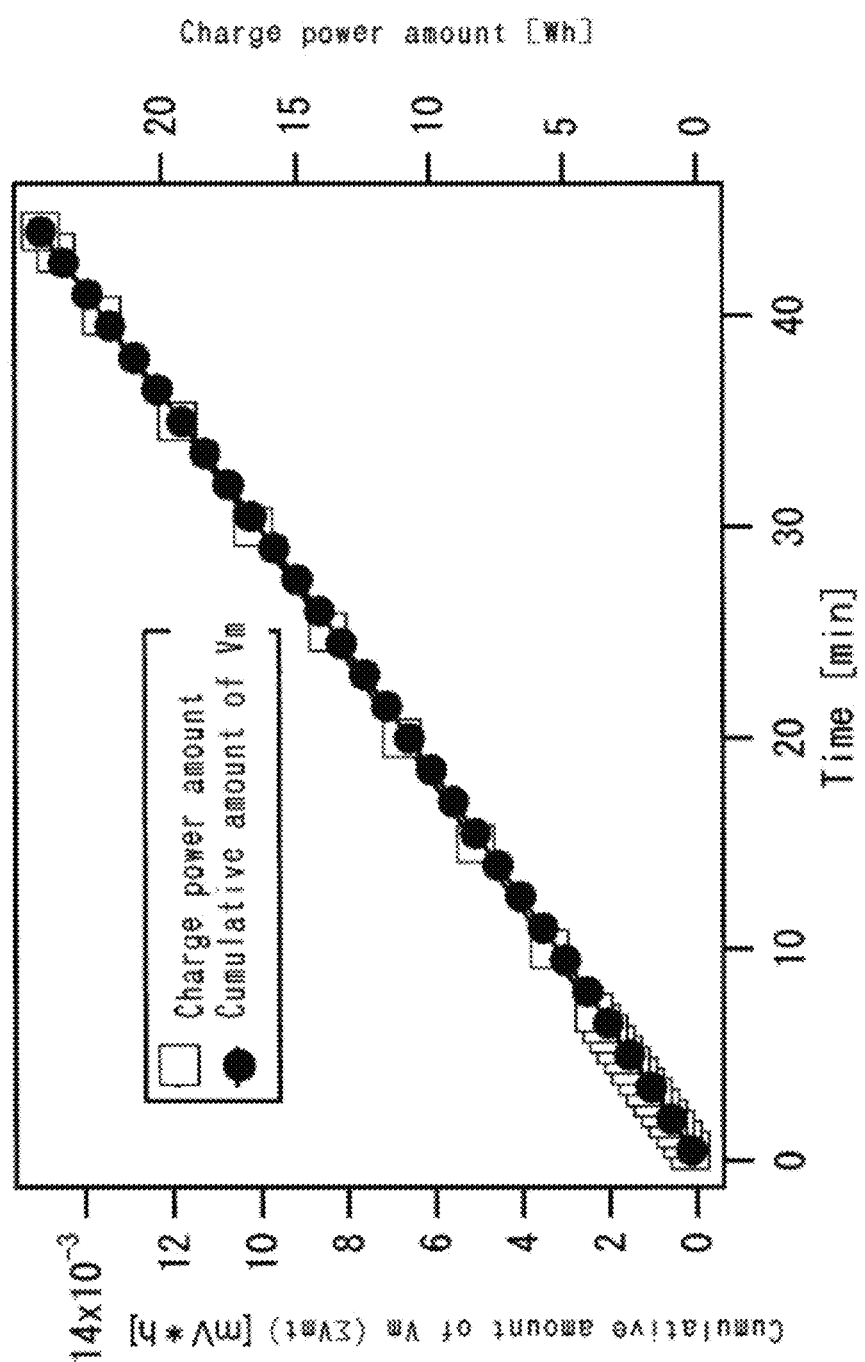
FIG. 16 illustrates a temporal change of the cumulative amount (black circle mark (2): ΣVmt) of the output of the magnetic film power sensor 1" in charge in the connection circuit in FIG. 10 and the cumulative amount of the charge power (black square mark (1)).
Figure 17:
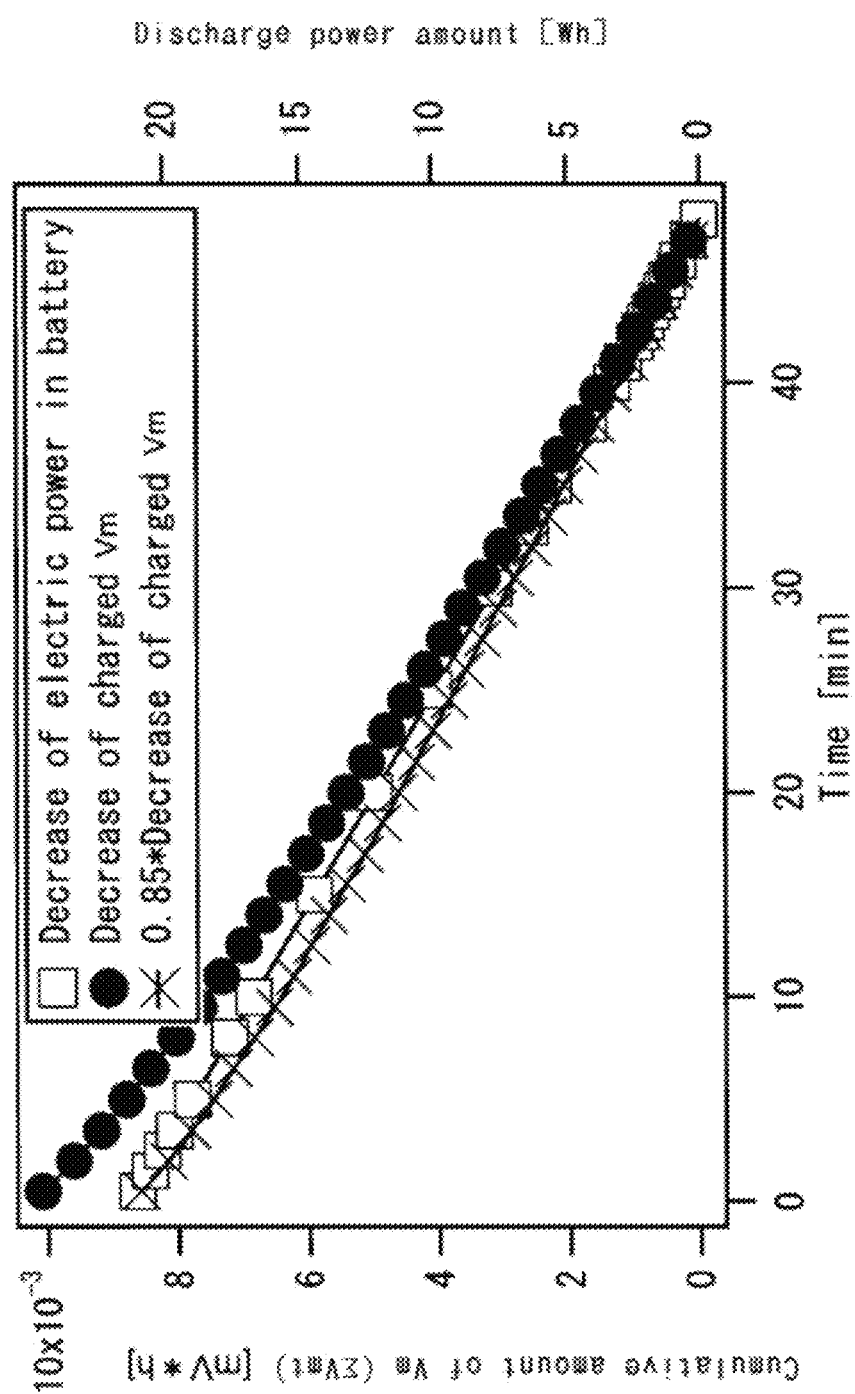
FIG. 17 illustrate the cumulative amount (black circle mark (2): ΣVmt) of the magnetic film power sensor 1" in discharge in the connection circuit in FIG. 10, the cumulative amount of the charge power (black square mark (1)), and 85% (black triangle mark (3)) of the cumulative amount of the output of the magnetic film power sensor 1".

FIG. 16 illustrates temporal changes of the cumulative amount (black circle mark (1): ΣVmt) of the output of the magnetic film power sensor 1" in charge in the connection circuit in FIG. 10 and the cumulative amount of charge power (white square mark (2)). This is similar to FIG. 12. Moreover, FIG. 17 illustrates the cumulative amount (black circle mark (2): ΣVmt) of the magnetic film power sensor 1" in discharge, the cumulative amount of the discharge power (white square mark (1)), and 85% of the cumulative amount (black square mark (3)) of the output of the magnetic film power sensor F. This is similar to FIG. 14.

Charge/discharge of the battery was repeated with a charge end voltage at 14 [V] and a discharge end voltage at 11 [V]. The charge power amount was calculated from the charge current and the terminal voltage of the battery and it was 24.519 [Wh]. The discharge power amount was calculated from the discharge current and the load terminal voltage and it was 21.0 [Wh]. As a result, charge efficiency was approximately 85%. By considering the charge efficiency, it is shown that increase/decrease of power from the battery in charge/discharge can be acquired accurately.

Figure 18:
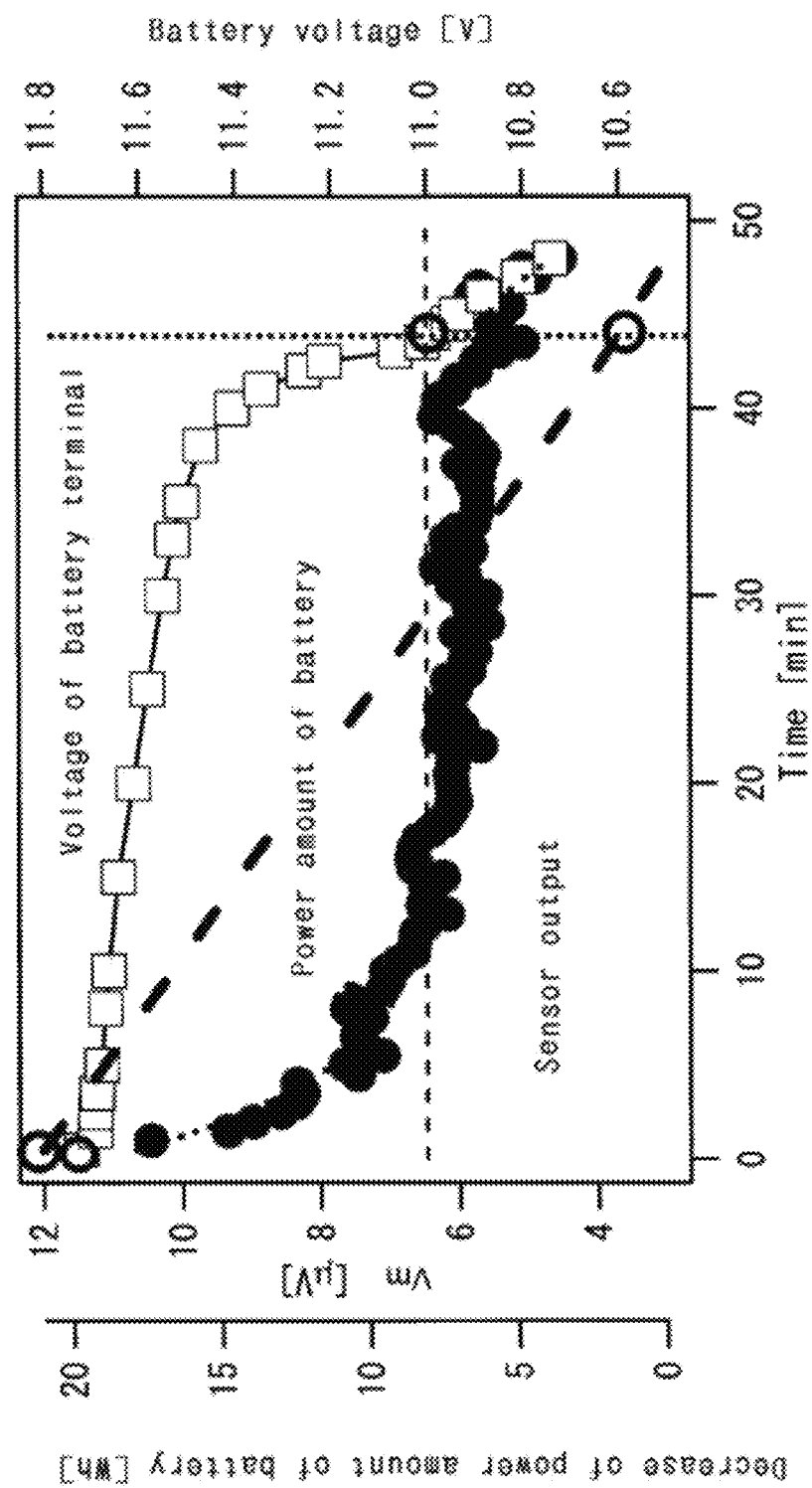
FIG. 18 illustrates a temporal change of the output (black circle mark (1) VM) of the magnetic film power sensor 1" in discharge, a decrease (2) of a power amount of the battery, and the terminal voltage (black square mark (3)) of the battery.

FIG. 18 illustrates temporal changes of the output (black circle mark (1) Vm) of the magnetic film power sensor 1" in discharge, a decrease of the power amount of the battery (2), and the terminal voltage (white square mark (3)) of the battery. A left vertical axis indicates a power amount (W·h) of the battery and the output Vm (mV) of the magnetic film power sensor 1", a right vertical axis indicates the terminal voltage (V) of the battery, and a lateral axis indicates time (min). It is known that the temporal change (2) of the power amount of the battery and the temporal change (3) of the terminal voltage of the battery are obviously different.

Figure 19:
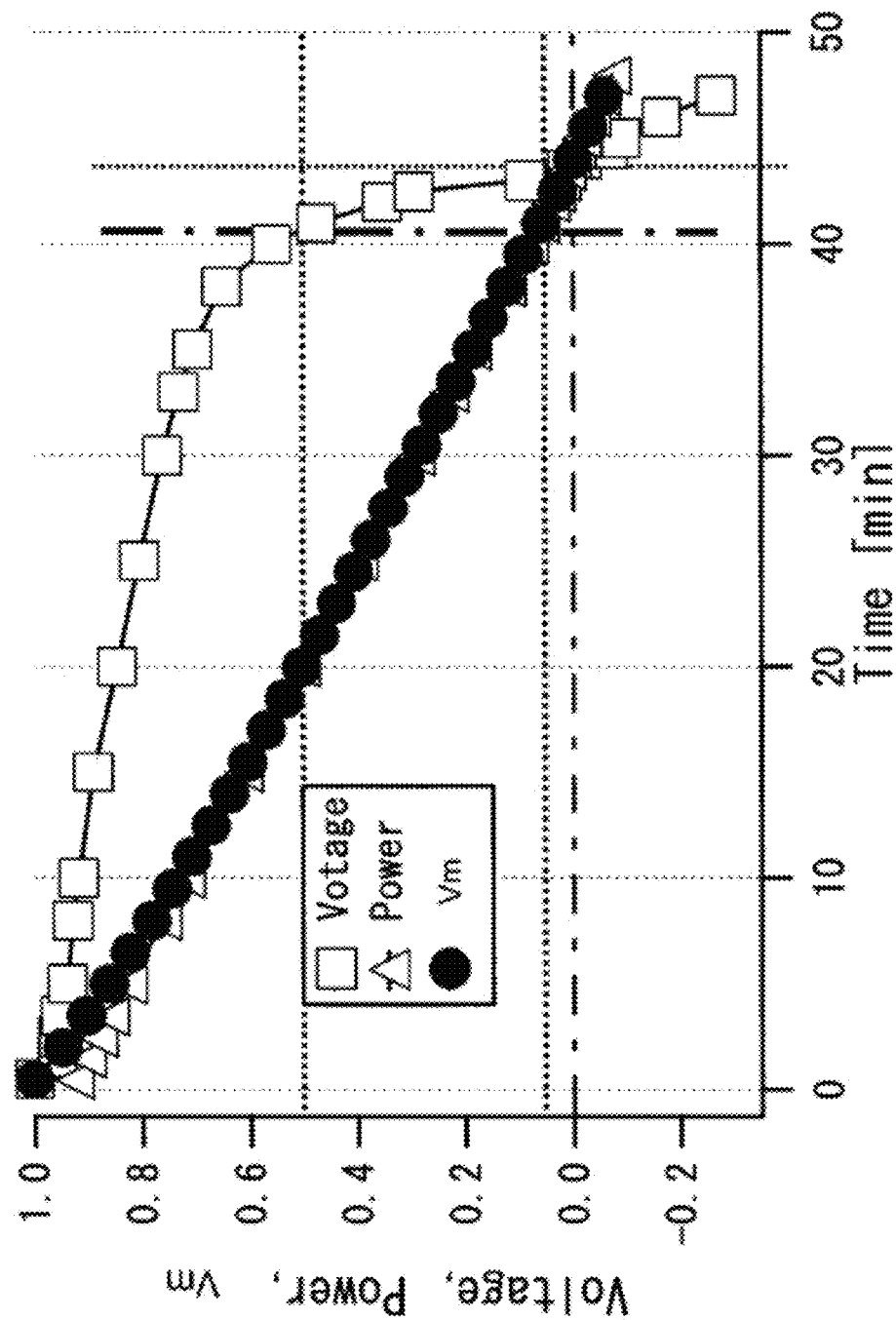
FIG. 19 is obtained by rewriting FIG. 18 with a voltage 11 [V] at end of discharge to 0 and a voltage at start of discharge (full charge) to 1 [V].

FIG. 19 was obtained by re-plotting the discharge end voltage 11 [V] in FIG. 18 at 0 and the discharge start voltage (full charge) at 1 [V] and illustrates temporal changes of the output (black circle mark (3): Vm) of the magnetic film power sensor 1", the decrease (white triangle mark (2)) of the power amount of the battery, and the terminal voltage (white square mark (1)) of the battery. The vertical axis is a standardized Vm, the power amount of the battery, and the terminal voltage of the battery (all in %), and the lateral axis is time (min). When the voltage (white square mark (1)) at discharge start (full charge) of the terminal voltage of the battery decreases to 50%, it shows that 93% of the charged power amount (white triangle mark (2)) has been already consumed, and only 7% of the power amount remains.

Figure 20:
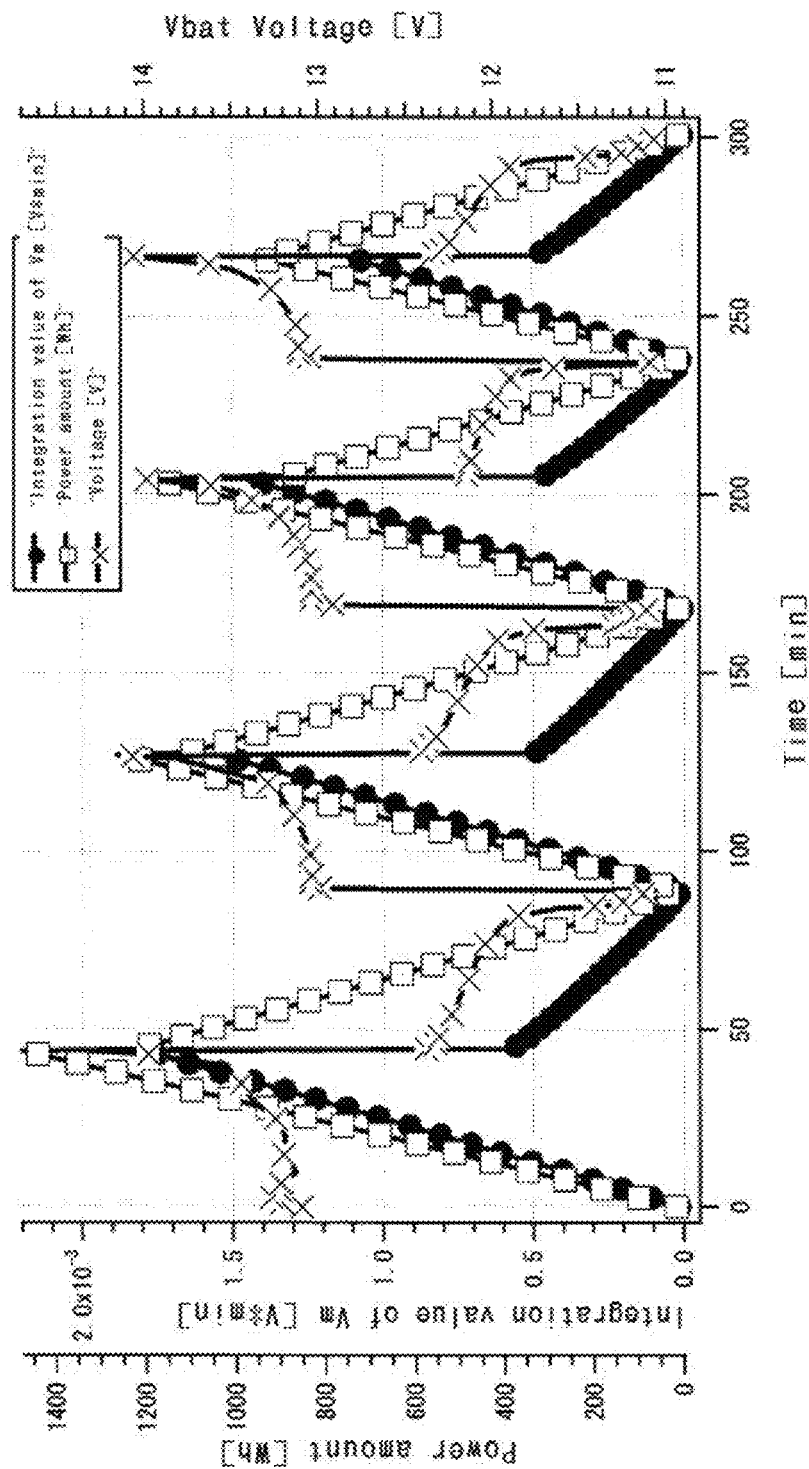
FIG. 20 illustrates a terminal voltage (black triangle mark (3)) of the battery when charge/discharge is repeated, the output (black circle mark (1)) of the magnetic film power sensor, and a temporal change (black square mark (2)) of the power amount.

FIG. 20 illustrates a relationship of the terminal voltage (cross mark (3)) of the battery when charge-discharge is repeated, the cumulative value ΣVmt (black circle mark (1)) of the output of the magnetic film power sensor, and the power amount (white square mark (2)) to elapsed time. Note that this battery is a so-called deteriorated battery with a long use history. A left vertical axis indicates the cumulative value ΣVmt (mV·h) of the power amount (W·h) of the battery and the output of the magnetic film power sensor 1", a right vertical axis indicates a terminal voltage Vbat (V) of the battery, and a lateral axis indicates time (min). This graph illustrates that charge and discharge are repeated four times.

Charge/discharge is repeated with the charge end voltage at 14 [V] and the discharge end voltage at 11 [V]. At each repetition, it is known that time required to reach the charge end voltage 14 [V] becomes shorter, and the charge amount is getting smaller (2). Therefore, the discharge power amount becomes smaller. It is obvious that a state of the decrease of the terminal voltage (3) is different every time and does not reflect the decrease of the charge power amount.

Figure 21:
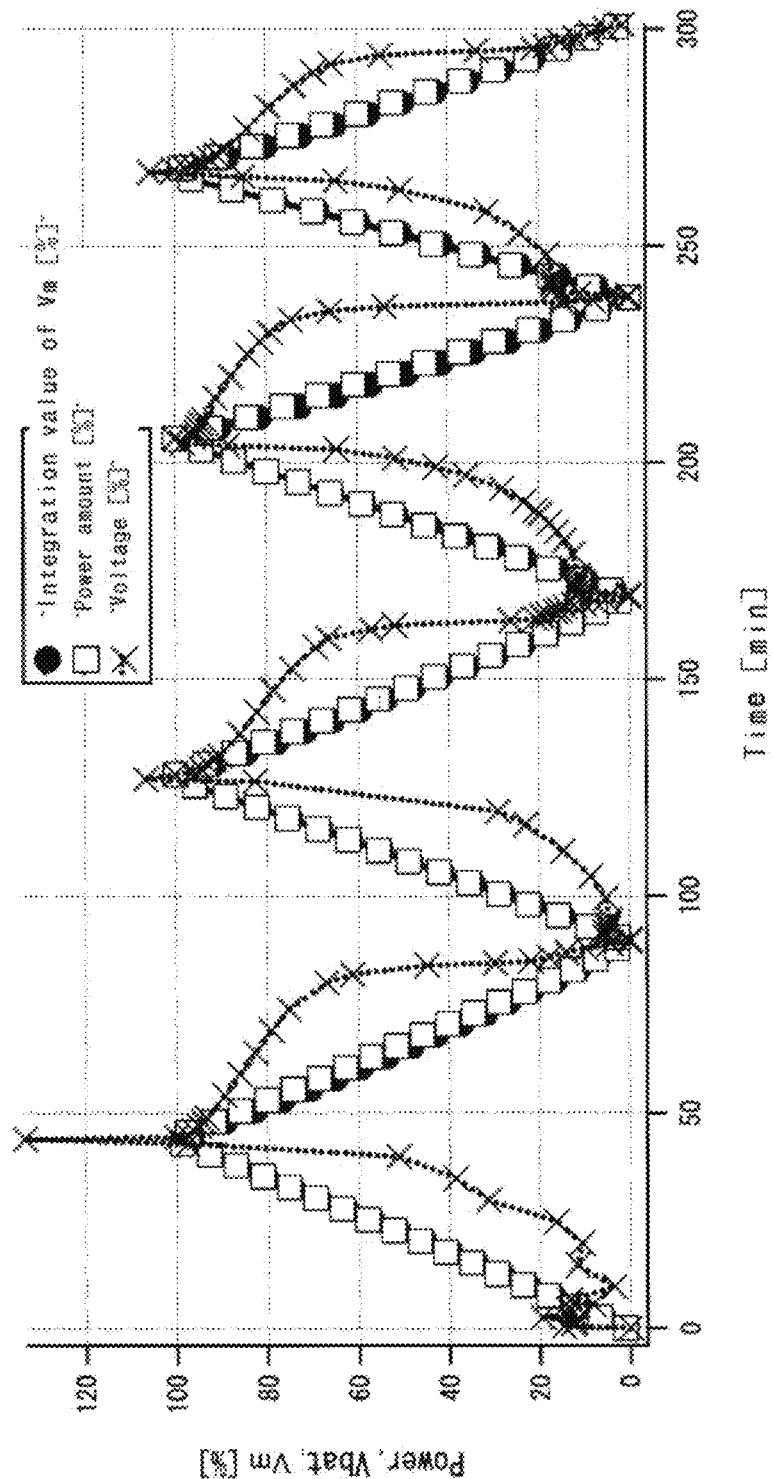
FIG. 21 is obtained by rewriting the terminal voltage (black triangle mark (3)) of the battery when charge/discharge is repeated, the output (black circle mark (1)) of the magnetic film power sensor, and a temporal change (black square mark (2)) of the power amount with the voltage 11 [V] at end of discharge to 0 and the voltage at start of discharge (full charge) to 1.

FIG. 21 illustrates re-plotting of the terminal voltage (cross mark (3)) of the battery when charge/discharge is repeated, an integration value (black circle mark (1)) of the output of the magnetic film power sensor, and the temporal change of the power amount (white square mark (2)) with the discharge end voltage 11 [V] at 0 and the discharge start voltage (full charge) at 1. A vertical axis indicates the standardized Vm, the battery power amount, and the terminal voltage of the battery (all in %), and a lateral axis indicates time (min). During charge, a voltage change from the charge start voltage to the charge end voltage (14 V) is standardized from 0 to 100%, and during discharge, the discharge start voltage to the discharge end voltage (11 V) is displayed from 100 to 0%. This is obtained by re-plotting FIG. 20.

Even if charge/discharge is repeated, it is known that the integration value ΣVmt (1) of Vm changes like a change of the power amount (2) in charge/discharge from the battery. However, it is known that the terminal voltage (3) changes without relevancy to the power amount (2).

A point to which should be paid attention here is that time until the terminal voltage of the battery becomes 14 (V) after charge is started and time until the terminal voltage of the battery becomes 11 (V) after discharge is started are substantially equal in each of charge/discharge characteristics. As illustrated in FIGS. 11 and 13, with charge/discharge with a constant current, a substantially constant value is indicated with respect to time regardless of the remaining power amount or the terminal voltage of the battery.

The above indicates that time until discharge can be estimated from power consumption at a predetermined current at start of discharge. That is, it means that the remaining power amount of the battery can be visualized. That is, charge time when charge is done at a constant current from the charge start voltage to the charge end voltage can be regarded as discharge time when discharge is done at the current.

Figure 22A:
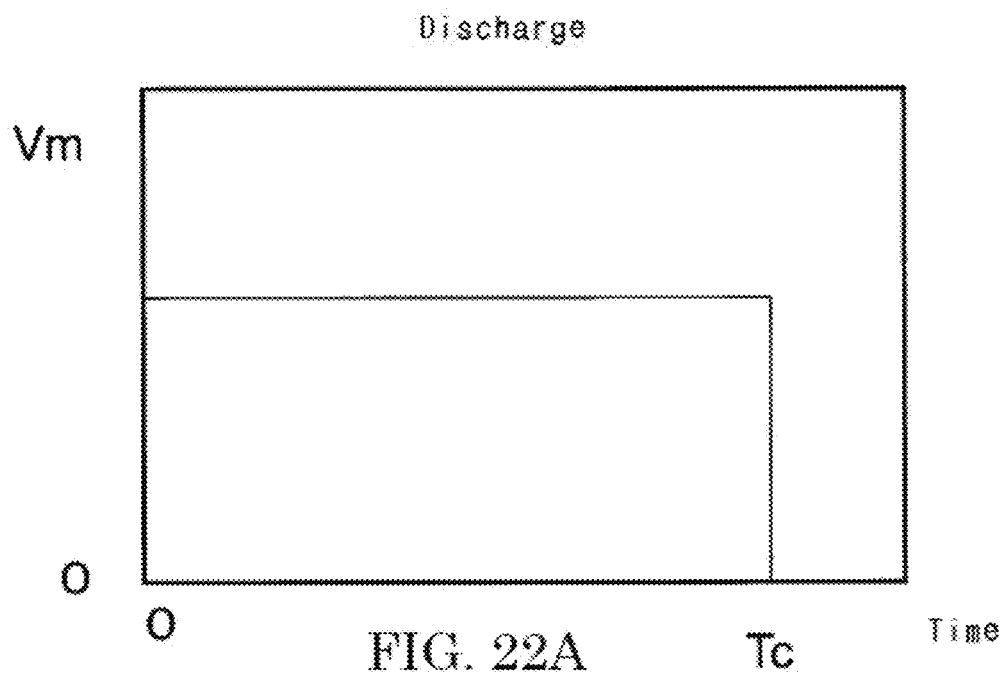
FIG. 22 are conceptual diagrams illustrating a usable power amount.
Figure 22B:
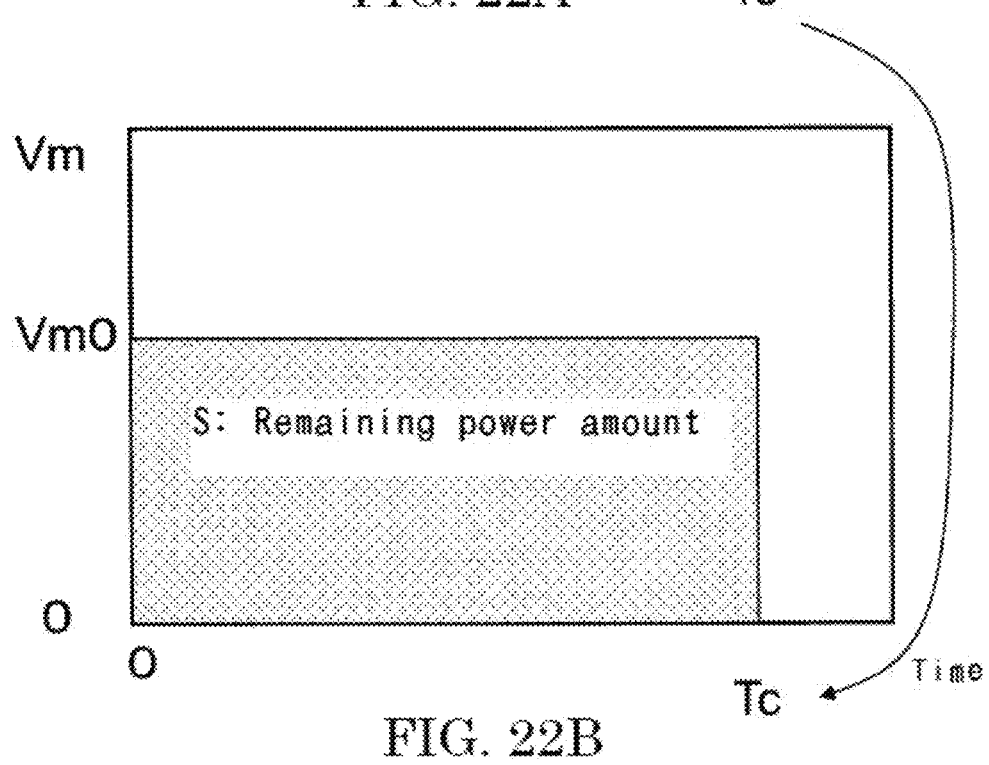

FIG. 22 are referred to. FIG. 22(a) illustrates a schematic view of FIG. 11 (in charge). A vertical axis is an output of the magnetic film power sensor, and a lateral axis is time. At this time, the charge end time is T10. FIG. 22(b) is a schematic view of FIG. 13 (in discharge). A vertical axis is an output of the magnetic film power sensor, and a lateral axis is time.

At this time, consumed power is considered to be constant regardless of time. The discharge time is considered to be the same as a charge time Tc. Then, a portion with an area S which is a product of initial power consumption Vm0 in discharge and the charge time Tc can be considered to be a usable power amount of the battery. This usable power amount S decreases as deterioration progresses from FIGS. 20 and 21.

However, even if a deterioration degree of the battery is not known (that is, even if a use history of the battery is not known), the usable power amount can be estimated. A battery system having such a function is extremely useful.

As a specific configuration which can manage power of charge/discharge, the charge/discharge measuring apparatus illustrated in FIG. 8 and FIG. 9 has been already illustrated. However, by providing the charge/discharge measuring apparatus and a control unit for controlling the selector switch 5 in FIG. 9, a battery system that can display a remaining power amount can be realized.

Figure 23:
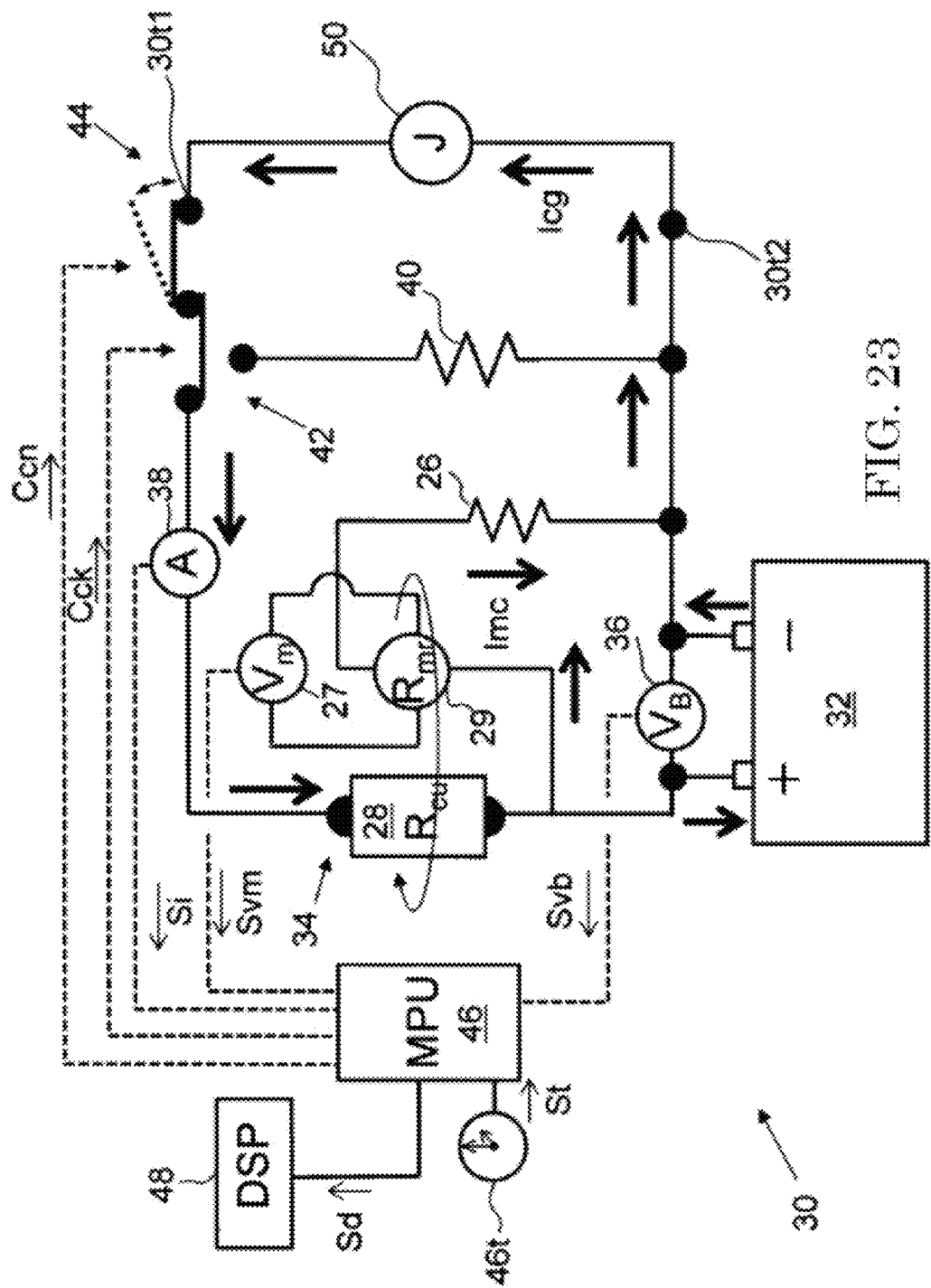
FIG. 23 is a diagram illustrating a configuration of a battery system according to the present invention.

FIG. 23 illustrates a configuration of a battery system using this principle. A battery system 30 includes a secondary battery 32, a magnetic film power sensor 34, a battery voltmeter 36, an inspection resistor 40, an inspection switch 42, a connection switch 44, and a control unit 46. Moreover, an ammeter 38 and a display unit 48 may be included.

The secondary battery 32 is not particularly limited as long as it is capable of charge/discharge. A plurality of secondary batteries may be connected in series or in parallel. The magnetic film power sensor 34 includes a magnetic film 29, a conductor film 28, a sensor voltmeter 27, and a sensor resistor 26. The magnetic film 29 may be a magneto-resistance effect type magnetic film or may be a planar hole effect type magnetic film. As already explained, as long as it is of a magneto-resistance effect type, a configuration capable of cancelling a bias voltage is preferable by using an element shape or a center-tap configuration. Note that FIG. 23 illustrates an instance in which the planar hole effect type magnetic film is used.

The magnetic film 29 is used by overlapping the conductor film 28. That is because a positional relationship with a current flowing through the conductor film 28 is to be fixed. At this time, the direction of the current flowing through the conductor film 28 and a direction of a magnetization easy axis of the magnetic film 29 are preferably matched. If they are discrepant, as illustrated in FIG. 20, gains of the magnetic film power sensor 34 are different between in charge and discharge. Moreover, one ends of the magnetic film 29 and the conductor film 28 are connected. Note that a relationship between the magnetic film 29 and the conductor film 28 can be considered such that the magnetic film 29 is arranged adjacent to a connection line between the secondary battery 32 and external electrodes 30t1 and 30t2.

Note that the magnetic film 29 does not have to be a single film. As illustrated in FIGS. 4 and 27, it may be constituted by a plurality of magnetic films.

To the magnetic film 29, a sensor voltmeter 27 is connected. Since it is a planar hole effect type in FIG. 23, a voltage in the direction perpendicular to the current flowing through the magnetic film 29 is measured. If the magneto-resistance effect type magnetic film 29 is used, the voltage on both ends in the direction flowing through the magnetic film 29 is measured. The magnetic film 29 is connected to one end of the sensor resistor 26. The sensor resistor 26 is a resistor having a sufficiently large resistance value. That is for a substantially constant current to flow, regardless of a value of the current flowing from the battery.

Note that the sensor voltmeter 27 has different connections depending on the shape and configuration of the magnetic film 29. Therefore, measurement of a voltage of the sensor voltmeter 27 means measurement of resistance of the magnetic film 29 changing by the magnetic field generated by a current of a circuit to be measured as an output voltage of the magnetic film power sensor.

The battery voltmeter 36 measures a terminal voltage of the secondary battery 32. Moreover, the ammeter 38 measures a current flowing through the battery system 30. In any case, an internal configuration and the like are not limited as long as a voltage value and a current value can be measured or converted.

The inspection resistor 40 is a resistor for inspecting how much power amount is accumulated in the secondary battery 32 after charge. Moreover, the inspection switch 42 is a switch for connecting the inspection resistor 40 to the secondary battery 32 when the accumulated power amount is inspected. Moreover, the connection switch 44 is a switch for connecting/shutting off the connection with the outside. The inspection switch 42 and the connection switch 44 are controlled by the control unit 46 which will be described later.

The control unit 46 is a computer constituted by an MPU (Micro Processor Unit) and a memory. A timer 46t and the display unit 48 are connected to the control unit 46. Moreover, the control unit 46 is connected to the sensor voltmeter 27, the battery voltmeter 36, the ammeter 38, the inspection switch 42, and the connection switch 44.

The control unit 46 receives a signal St from the timer 46t. It is for measuring elapsed time. Therefore, the signal St is time information. Alternatively, a measurement start signal Cts (not shown) may be transmitted from the control unit 46 to the timer 46t, and a measurement end signal Ctt (not shown) may be transmitted so that elapsed time is known from the signal St outputted by the timer as a result. The signal St of this case is time information generated by the timer 46t.

In any case, with the timer 46t, the control unit 46 can obtain time between predetermined points of time. In other words, the timer 46t can be considered to measure time relating to charge time and discharge time.

Moreover, the control unit 46 can calculate a remaining power amount as will be described later and thus, that is sent to the display unit 48 as a signal Sd. The display unit 48 may be a display constituted by 8 segments or may be a display using a liquid crystal or an organic EL. Alternatively, a predetermined light may be simply lighted.

The control unit 46 is connected to the sensor voltmeter 27 and receives a voltage in the magnetic film 29 as a signal Svm from the sensor voltmeter 27. The control unit 46 is connected also to the battery voltmeter 36 and the current meter 38 and receives a voltage between battery terminals as a signal Svb and a current value as a signal Si, respectively.

The control unit 46 is connected also to the connection switch 44 and the inspection switch 42 and can instruct opening/closing of each or a change of the connection point by an instruction Ccn and an instruction Cck.

Subsequently, an entire connection relationship will be explained. External terminals 30t1 and 30t2 are terminals for connecting the battery system 30 to an external device. One of poles of the secondary battery 32 (a positive pole in FIG. 23) is connected to the external terminal 30t1, while the other pole (a negative pole in FIG. 23) is connected to the external terminal 30t2. The conductor film 28, the ammeter 38, the inspection switch 42, and the connection switch 44 are connected in series between the positive pole and the external terminal 30t1.

The conductor film 28 and the ammeter 38 are arranged on the positive pole side from the inspection switch 42, and the connection switch 44 is arranged on the external terminal 30t1 side from the inspection switch 42. The inspection switch 42 switches connection from the positive pole side to the connection switch 44 or one end of the inspection resistor 40. The other end of the inspection resistor 40 is connected between the external terminal 30t2 and the negative pole.

The battery voltmeter 36 is connected between both poles of the secondary battery 32. The magnetic film 29 and the sensor resistor 26 are connected in series between the both poles of the secondary battery 32. Note that, as described above, the magnetic film 29 and the conductor film 28 are constituted while overlapping each other. The sensor voltmeter 27 is connected in order to measure the voltage of the magnetic film 29. The sensor voltmeter 27 has different connection points to the magnetic film 29 between the magneto-resistance effect type and the planar hole effect type as already explained. Note that regarding the above-described connection relationship, a connection order may be changed as long as the purpose of connection is not changed.

Moreover, in the above-described configuration, the magnetic film power sensor 34 functions as both a discharge power measuring means and a charge power measuring means.

An operation of the battery system 30 including the above-described configuration will be explained. By referring to FIG. 23, a charger 50 is connected to the connection terminals 30t1 and 30t2 with the outside in charge. In FIG. 23, a constant current power supply is connected. The inspection switch 42 is connected to the external terminal 30t1 side. When the control unit 46 starts charge, the connection switch 44 is connected to the outside charger 50 upon the instruction Ccn, and a current is made to flow through the battery system 30 from the outside.

Note that the charge may be started by an instruction from the outside or in the case of configuration in which the charger 50 can be connected any time by a switch as in FIG. 8, it may be so configured that the battery voltmeter 36 is monitored, and charge may be started when a predetermined voltage is reached. The battery voltage at which charge is started is called a charge start voltage (11 V, for example).

When charge is performed in the case of FIG. 23, a charge current Icg flows in an arrow direction. The current Icg flows through the conductor film 28. A magnetic field generated at that time becomes an external magnetic field to the magnetic film 29 and generates a voltage in the magnetic film 29 by the planar hole effect. The current Icg having flowed through the conductor film 28 flows through the secondary battery 32 and returns from the external terminal 30t2 to the charger 50 again.

Moreover, a part of the current flowing through the conductor film 28 also flows to the magnetic film 29. However, since the sensor resistor 26 has a large value, a current Imc passing through the magnetic film 29 can be considered to be constant. When charge is started, the control unit 46 first obtains time from the timer 46t and makes it a charge start time. When the battery voltmeter 36 becomes a predetermined voltage (14 V, for example), the charge is finished. This is called a charge end voltage. The end of charge may be realized by sending the instruction Ccn from the control unit 46 to the connection switch 44 and by disconnecting the connection switch 44. When charge is finished, time is obtained from the timer 46t and is made a charge end time. The control unit 46 calculates the charge time Tc from the charge start time and the charge end time.

While charge progresses, the control unit 46 measures the value Vm of the sensor voltmeter 27 at every micro time $\Delta T$ and calculates and cumulates a power amount $\Delta Wh$ in the micro time $\Delta T$ (adds together). The voltage Vm of the sensor power meter 27 is a value indicating charge power. That is, a product of the voltage Vm and the micro time ΔT indicates the power amount ΔWh. Therefore, the power amount ΔWh may be a value ΣVmt obtained by cumulating the product of the sensor voltage Vm and the time. Naturally, the sensor voltage Vm may be converted to power and the product with the time may be cumulated.

The control unit 46 continues to calculate the cumulative value ΣVmt until the battery voltmeter 36 shows the charge end voltage. At this time, display indicating that it is currently charge or the current cumulative value ΣVmt may be displayed on the display unit 48.

When the battery voltmeter 36 shows the charge end voltage, the control unit 46 sends the instruction Ccn to the connection switch 44 and disconnects the connection with the charger 50. Moreover, time from charge start to charge end is calculated as the charge time Tc. At this time, display indicating charge end and the charge time Tc may be displayed on the display unit 48.

Figure 24:
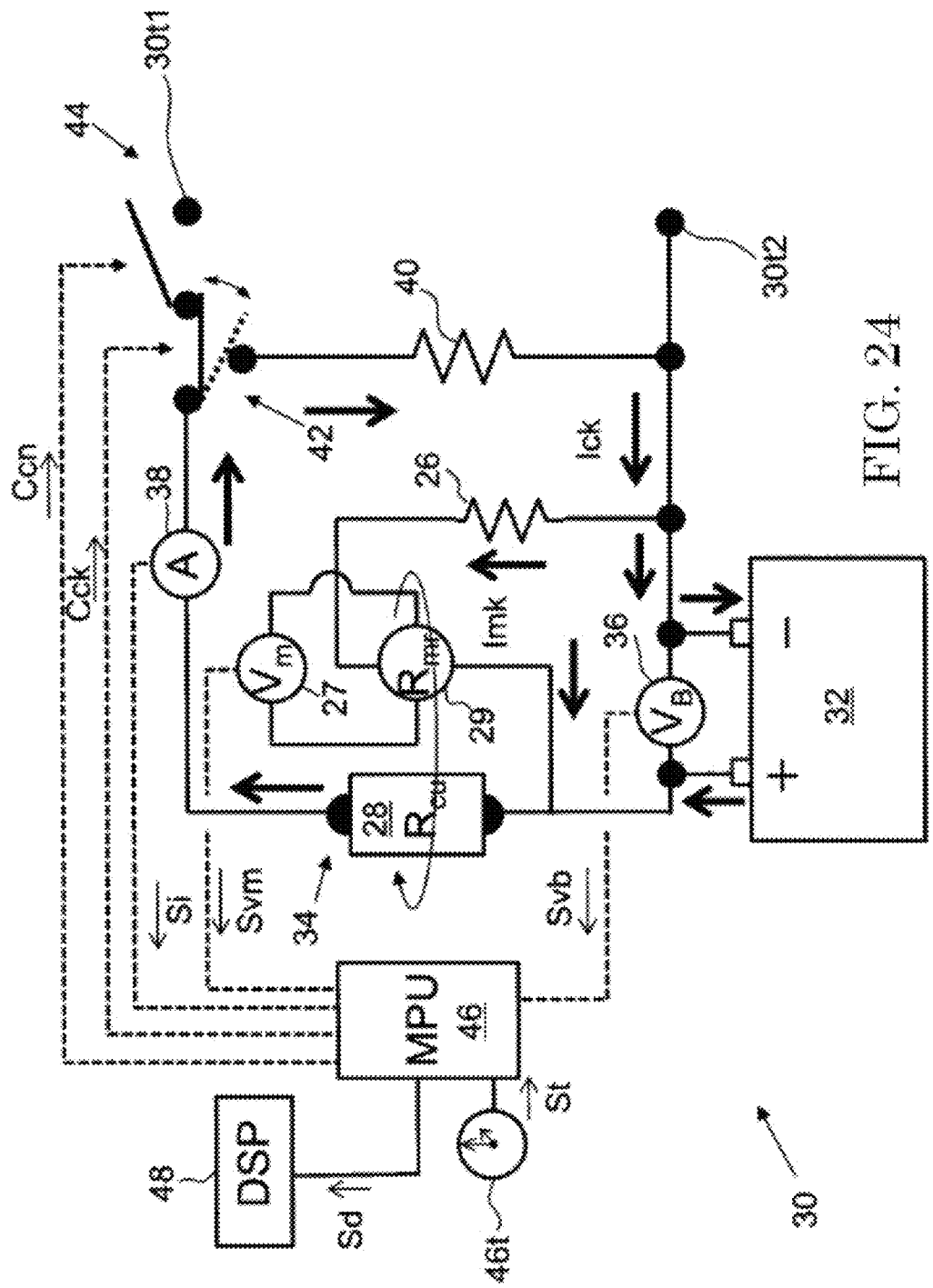
FIG. 24 is a diagram illustrating an operation for confirming a charge power amount by the battery system according to the present invention.

Subsequently, FIG. 24 is referred to. When charge is finished, the control unit 46 sends the instruction Cck to the inspection switch 42 and makes a current Ick flow to the inspection resistor 40. At this time, the current Ick flows through a circuit with the inspection resistor 40 as a load from the positive pole to the negative pole of the secondary battery 32. Here, the value of the sensor voltmeter 27 by the flowing current Ick is read out as initial power consumption Vm0 (see FIG. 22(*b*)). Then, a value obtained by cumulating the charge time Tc and the initial power consumption Vm0 is made a charge power amount Wcg. This corresponds to the area S in FIG. 22(*b*).

Note that, after the initial power consumption Vm0 is read out, the inspection switch 42 may be immediately switched to the external terminal 30*t*1 side. That is because continuous flowing of the current through the inspection resistor 40 leads to a loss of power.

This charge power amount Wcg has its value changed in accordance with a degree of deterioration of the secondary battery as illustrated in FIG. 21. That is, even if the use history of the secondary battery is not known, the power amount accumulated in the charged secondary battery 32 can be known. The control unit 46 displays this charge power amount Wcg on the display unit 48 as a remaining power amount. At this time, the display should be configured to be able to make at least "display relating to an absolute value of the charge power amount Wcg".

The secondary battery 32 has its degree of deterioration changed in accordance with the use history. That means that a capacitance when the secondary battery is charged to full varies even with the secondary battery of the same standard. That is, when a gasoline automobile is used as an example, it means that the capacitance itself of a gasoline tank is decreased. In such a situation, display of the charge amount in percentage does not make much sense since the power amount to full charge is not known.

On the other hand, by making a display relating to the absolute value of the charge power Wcg, a user can also know a change of the charge power Wcg itself. The display relating to the absolute value of the charge power Wcg may be a traveling distance or traveling time when an automobile traveling by using electricity, for example, travels at a constant speed. Alternatively, it may be a rate to a recommended power amount which should be maintained in a normal use situation. In the case of a robot, it may be activity time when being converted to a predetermined work.

Note that the charge power Wcg may be a value converted to actual power or may be ΣVmt (product of voltage and time) obtained by cumulating a product of the sensor voltage Vm and the time during the charge time. Moreover, the control unit 46 only needs to calculate the charge power amount Wcg and does not have to actually make display on the display unit 48. For example, it may be also sufficient to output the charge power amount Wcg as a signal.

As described above, when the secondary battery 32 is charged through the pair of external terminals (30*t*1, 30*t*2), the control unit 46 measures the charge time Tc from the charge start voltage to the charge end voltage and after charge is finished, allows the current Ick to flow through the inspection resistor 40 by the inspection switch 42, and calculates the charge power amount, that is, the remaining power amount on the basis of the initial power consumption Vm0 consumed by the inspection resistor 40 and the charge time. The value of the inspection resistor 40 is preferably determined in advance so that the current Ick becomes substantially equal to the current Icg during charge.

Figure 25:
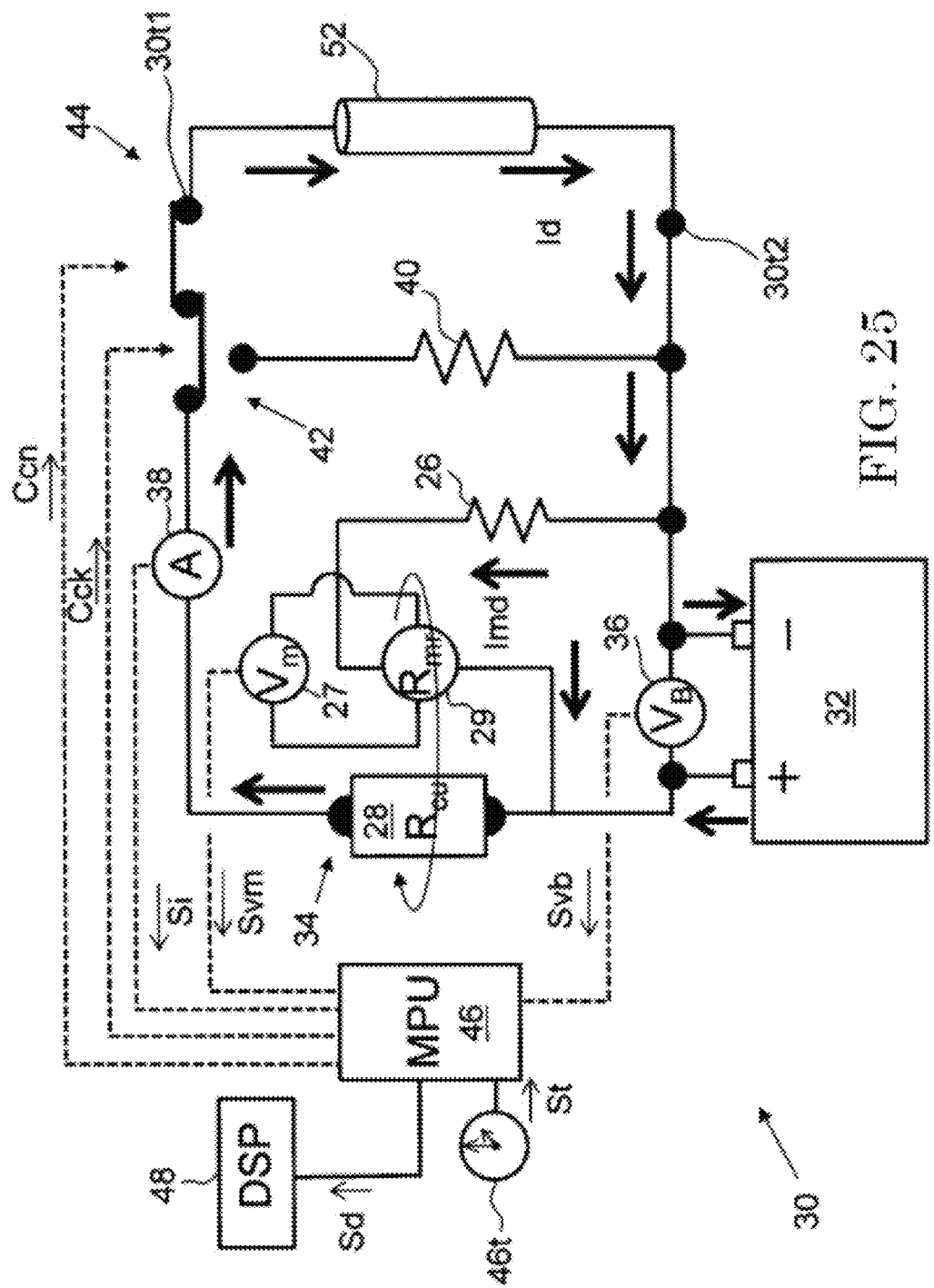
FIG. 25 is a diagram illustrating an operation for discharging in the battery system according to the present invention.

Subsequently, by referring to FIG. 25, the control unit 46 connects the connection switch 44 to the external terminal 30*t*1 side. When the load 52 is connected to the battery system 30, a current Id flows from the positive pole of the secondary battery 32 to the external terminal 30*t*1, the load 52, the external terminal 30*t*2, and the negative pole. While the current Id by this load 52 is flowing, the control unit 46 measures the value Vm of the sensor voltmeter 27 at every micro time ΔT and acquires the discharge power amount as ΔT·Vm. Then, the discharge power amount ΔT·Vm is subtracted from the charge power amount Wcg so as to obtain a new charge power amount Wcg.

The control unit 46 has the decreased charge power amount Wcg displayed on the display unit 48. This display may be also made as display relating to the absolute value of the charge power amount Wcg. This becomes the remaining power amount. The user can grasp the remaining charge power amount Wcg on the basis of time or a workload in conformity to the use. It is needless to say that, with such display, a percentage display to the charge power amount Wcg immediately after the charge is finished may be made.

In the above-described power management, a portion of the magnetic film power sensor 34 can measure powers of charge and discharge not by a configuration using the magnetic film 29 and can be realized only if the discharge power can be measured. However, if it is provided integrally on the battery system 30, the power sensor 34 using the magnetic film 29 can measure power only by measuring the voltage of the sensor voltmeter 27, and thus, size can be reduced, which is suitable.

As described above, the charge power amount Wcg is acquired from the charge time Tc and the initial power consumption Vm0 since the gains of the magnetic film power sensor 34 are different between in charge and discharge. Therefore, if the magnetic film power sensor 34 can be used also in discharge in the same current direction as in charge, or if setting of the magnetic film 29 and the conductor film 28 of the magnetic film power sensor 34 can be made precisely and the gain of the magnetic film power sensor 34 can be considered to be equal in charge and discharge, ΣVmt which is the power cumulative amount in charge may be made the charge power amount Wcg even without measuring the charge time Tc.

If the gain of the magnetic film power sensor 34 can be made the same both in charge and discharge, the inspection resistor 40 and the inspection switch 42 are not needed. In order to use the magnetic film power sensor 34 in the same current direction both in charge and discharge, a switch for changing a current path between charge and discharge is separately needed.

The control unit 46 cumulates the charge power at every micro time from the charge start voltage and acquires ΣVmt. When the charge end voltage is reached, the connection switch 44 is disconnected, and ΣVmt is made the charge power amount Wcg. If the battery system 30 is connected to the load, the power consumption at the load is subtracted from the charge power amount Wcg similarly to the above and the result is made the new charge power amount Wcg. This charge power amount Wcg is a remaining power amount.

The user can know the power amount of the secondary battery 32 that can be substantially used by the "display relating to the absolute value of the charge power amount Wcg" made by the control unit 46. When a load is connected, as in the explanation in FIG. 25, it is only necessary that the power consumption amount is subtracted from the charge power amount Wcg.

If the gains of the magnetic film power sensor 34 in charge and discharge can be considered to be equal as above, there is no need to measure the charge time Tc and thus, it is not necessary to perform charge under a condition of a constant current. For example, if quick charge is to be performed, the charge time might be reduced by having an overcurrent flow periodically or the like.

Even in such a case, the power amount in charge is measured by the magnetic film power sensor 34 and the timer 46t, and ΣVmt is acquired and made the charge power amount Wcg so that the remaining power amount can be estimated. Note that, in the above-described explanation, the battery system 30 includes the secondary battery 32, the magnetic film power sensor 34, and the control unit 46, but portions other than the secondary battery may be made a charge/discharge measuring apparatus.

As described above, it is understood that managing charge/discharge of the secondary battery with the magnetic film power sensor (thin film power meter) is more useful than managing with the terminal voltage of the battery. Moreover, it is also understood that the magnetic film power sensor is the most excellent for managing the secondary battery whose chargeable power amount, that is, usable power amount decreases as charge/discharge is repeated (use is continued).

As a result, it can be concluded that the charge/discharge measuring apparatus of the present invention using the magnetic film power sensor can be optimally applied to a smart grid, a smart battery and the like. It is extremely useful for avoiding power problems.

An example of the connection circuit of the above-described barber-hole type magnetic film power sensor and the charge/discharge measuring apparatus using this will be referred to, here.

Figure 26:
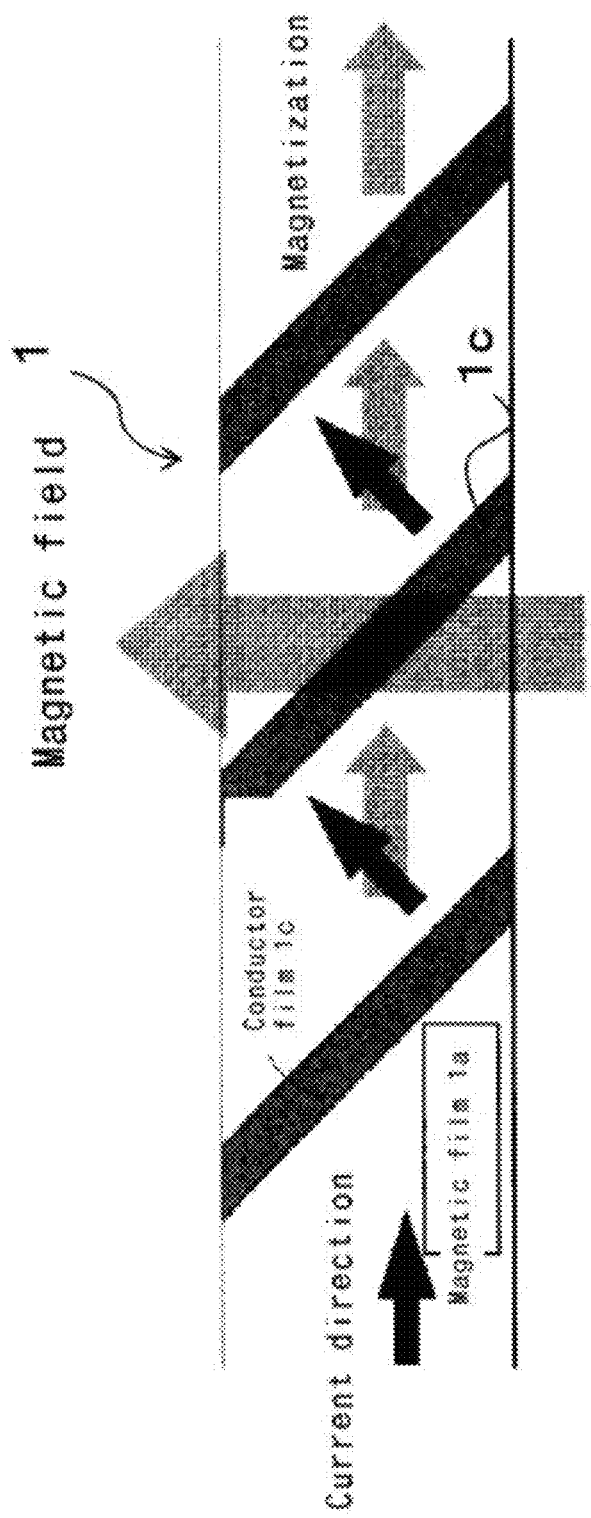
FIG. 26 illustrates a magnetic film in a barber-pole type magneto-resistance effect type magnetic film power sensor.

FIG. 26 illustrates a magnetic film in the barber pole type magneto-resistance effect type magnetic film power sensor. FIG. 27 illustrates the diagonal conductor film and the electrode (hereinafter referred to as a barber pole electrode) provided on an upper part of the magnetic film. An integral magnetic film of the magnetic film and a diagonal conductor (barber pole electrode) formed on the upper part thereof will be referred to as "barber-pole magnetic film" below.

FIG. 26 illustrates an image diagram illustrating a current direction and a magnetization direction when the barber-pole magnetic film (magnetic field sensor) 1 is seen from above. FIG. 27 illustrate a diagonal conductor and an electrode pad provided on the upper part of the magnetic film 1, in which FIG. 27(a) illustrates an entire view and FIG. 27(b) illustrates an enlarged view of a circled portion in FIG. 27(a). The conductor film 1c and the magnetic film 1a illustrated in FIGS. 26 to 27 correspond to the conductor film 1c and the magnetic film 1a of a magnetic sensor unit 1 in FIG. 1, respectively.

A permalloy (NiFe) film having a length of 30 mm, a width of 1 mm, and a film thickness of approximately 0.1 μm is used as the magnetic film. In the barber-pole magnetic film, as illustrated in FIGS. 26 to 27, a diagonal conductor film 1c (corresponding to the conductor film 1c on the uppermost side in FIG. 4) is provided in a width direction of the magnetic film, and Cu is used. This conductor film 1c has a width of 0.5 mm, a length of 3 mm, a film thickness of 0.1 μm, and an interval between conductor film—conductor film of 1 mm (see FIG. 27).

When the magnetic sensor 1 illustrated in FIGS. 26 to 27 is used as a magnetic film power sensor, it is necessary to have a current flow through the magnetic film 1a. At this time, by providing the conductor film 1c, a current has a nature of flowing to a direction with smaller electric resistance (see FIG. 26). First, the conductor film (Cu film) 1a has electric resistance approximately 10 times smaller than the electric resistance of the magnetic film (permalloy film) 1a.

Therefore, the electric resistance of the current becomes smaller when a distance between the conductor films is shorter and when the current flows in the conductor film 1c than when the current flows straight in a longitudinal direction of the magnetic film 1a. Since a magnetization direction (easy magnetization direction) is induced to the longitudinal direction in advance due to shape anisotropy and induced anisotropy in the magnetic film, an angle is formed between the current flowing direction and the magnetization direction.

Figures 28A, 28B:
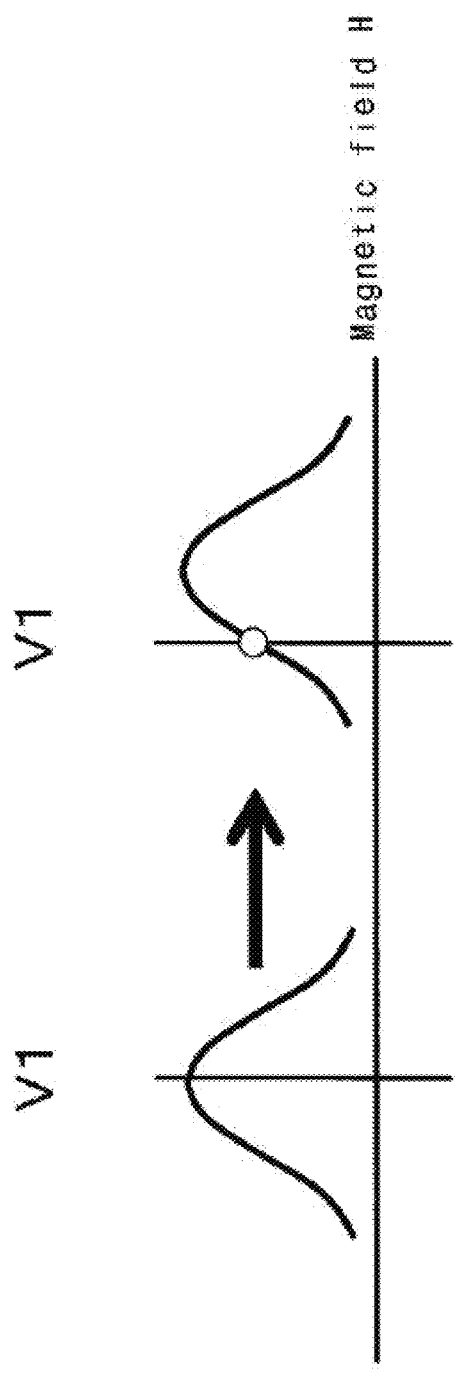
FIG. 28 illustrate a relationship between a voltage V1 and a magnetic field H in a longitudinal direction.

Thus, as illustrated in FIG. 28(b), the magnetic resistance characteristic of the barber-pole magnetic film 1a shows as if a magnetic field—resistance characteristic by a normal magneto-resistance effect is biased by a bias magnetic field. Note that FIG. 28 illustrate a relationship between a voltage V1 in the longitudinal direction and a magnetic field H, in which FIG. 28(a) corresponds to FIG. 2 and illustrates a normal magneto-resistance effect, and since the output voltage V1 to the magnetic field H forms an even function, a bias magnetic field needs to be given in order to obtain a linear characteristic, while FIG. 28(b) illustrates a magneto-resistance effect of the barber-pole magnetic film, and it is understood that a bias magnetic field is not necessary.

Figure 29:
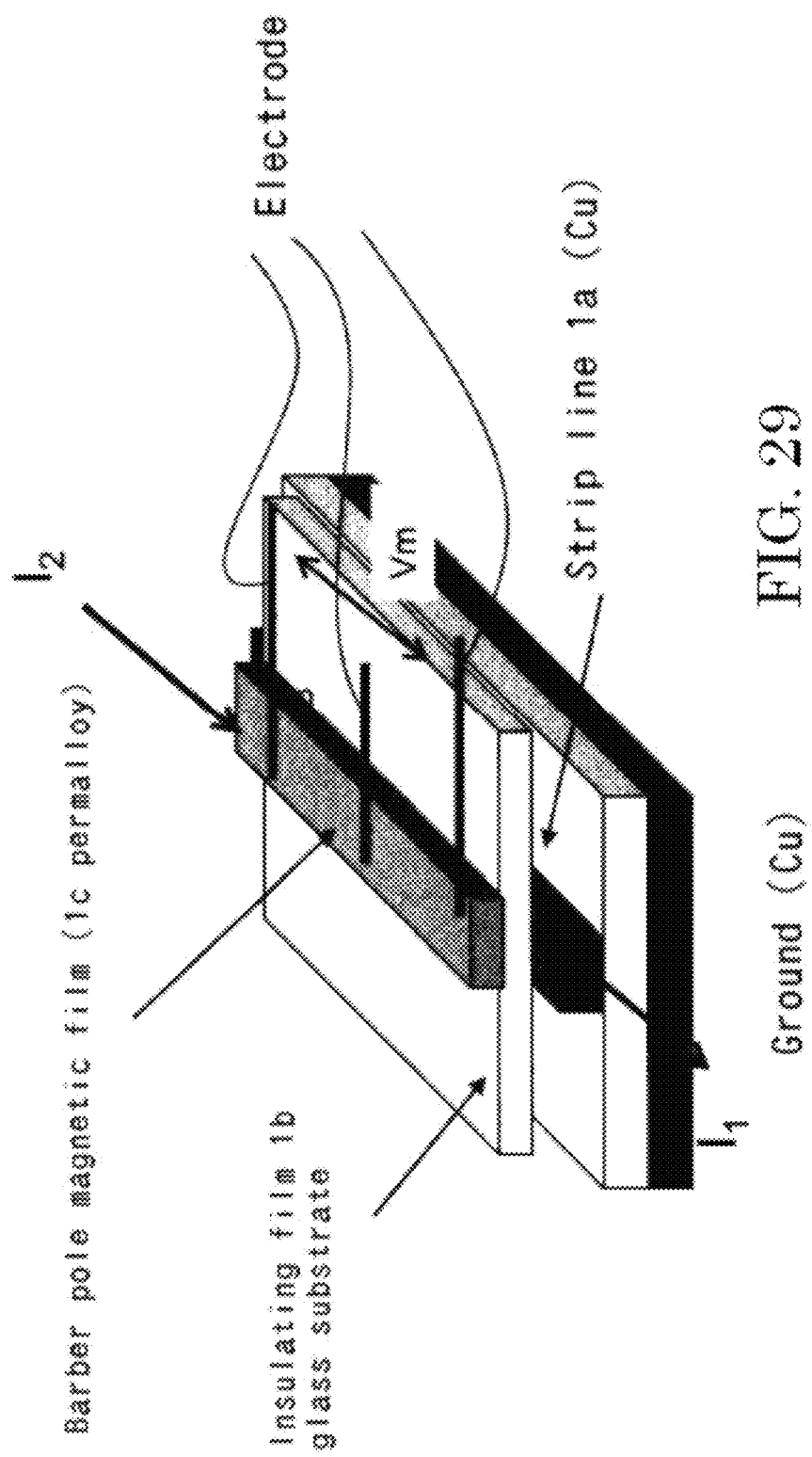
FIG. 29 illustrates the barber-pole type magneto-resistance effect type magnetic film power sensor of a differential type.

FIG. 29 illustrates a differential type barber-pole type magneto-resistance effect type magnetic film power sensor and illustrates a schematic view in which this magnetic film power sensor is used for measurement of a microstrip line.

Figure 31:
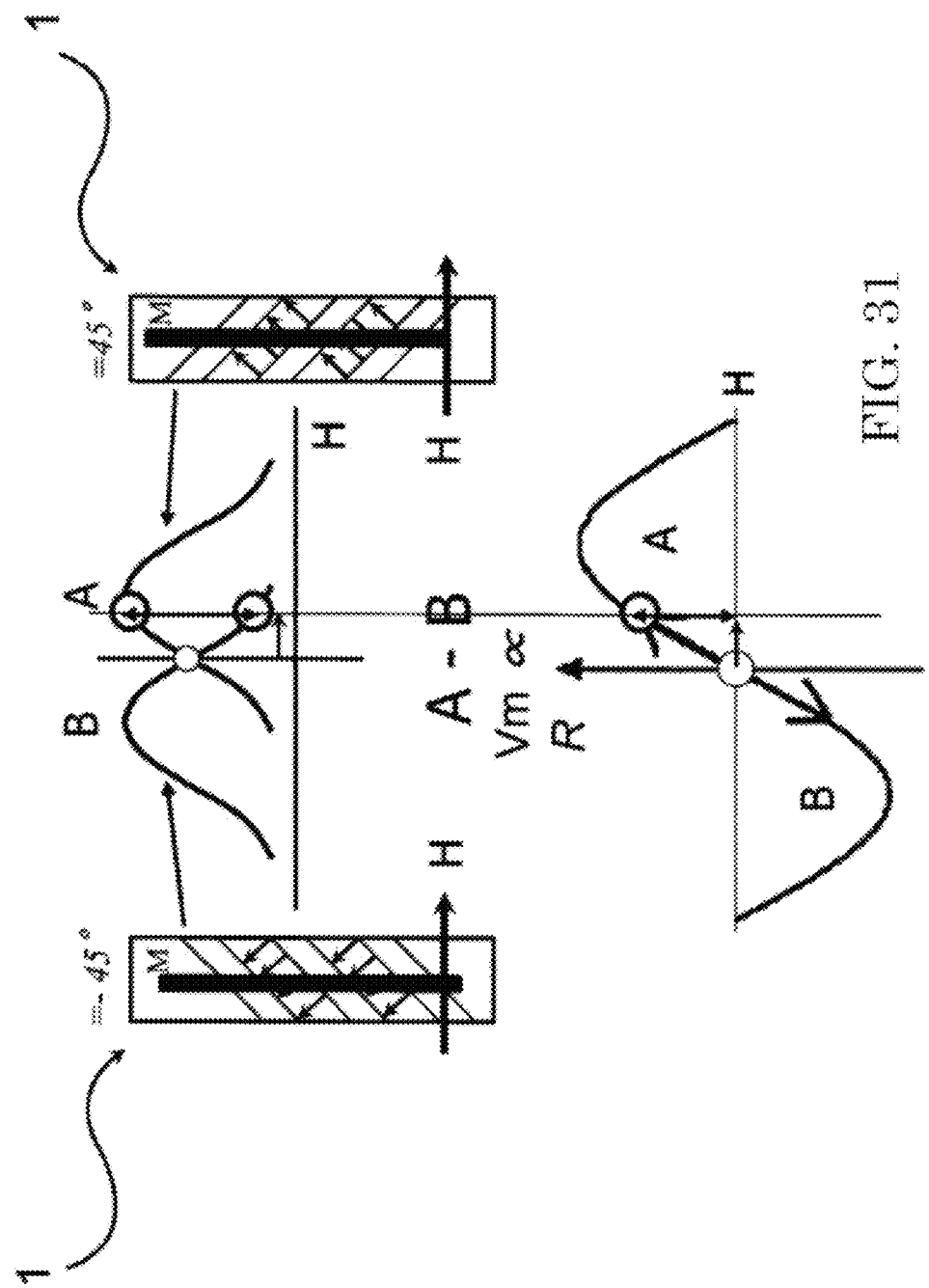
FIG. 31 illustrates a characteristic as if a bias magnetic field in which the magneto-resistance effect of the barber-pole magnetic film has different signs between left and right of the magnetic film is applied by barber-pole patterns with different inclinations.

FIG. 30 illustrates a state of a change of the electric resistance of the magnetic film due to the normal magneto-resistance effect. The magneto-resistance effect of the barber-pole magnetic film shows a characteristic as if bias magnetic film with different signs in right and left of the magnetic field are applied by the barber-pole patterns with different inclinations (FIG. 31). As illustrated in FIG. 31, the left barber-pole magnetic film 1 shows a characteristic B biased to negative with respect to the applied magnetic field, while the right barber-pole magnetic field 1 shows a characteristic A biased to positive.

By connecting these different barber-pole magnetic films 1 and 1 in series and by applying a magnetic field in the same direction, that is, from left to the right direction, for example, resistance in each of the barber-pole magnetic films changes such that it decreases on one hand while it increases on the other hand. If they can be differentially outputted, only a change can be taken out with a magnetic field zero point as an operation point as illustrated on a lower diagram in FIG. 31.

If the normal magneto-resistance effect magnetic film 1 is to be used, it is necessary that a large bias magnetic field as illustrated in FIG. 30 is applied so that the operation point is set at a point with favorable linearity. However, by using the differential type barber-pole magnetic film as illustrated in FIG. 31, the operation point can be moved to a zero magnetic field, and a change in the electric resistance by the magnetic field can be also enlarged to twice. This is advantageous in a point that the magnetic film power sensor can be operated in a non-bias magnetic field.

Figure 32:
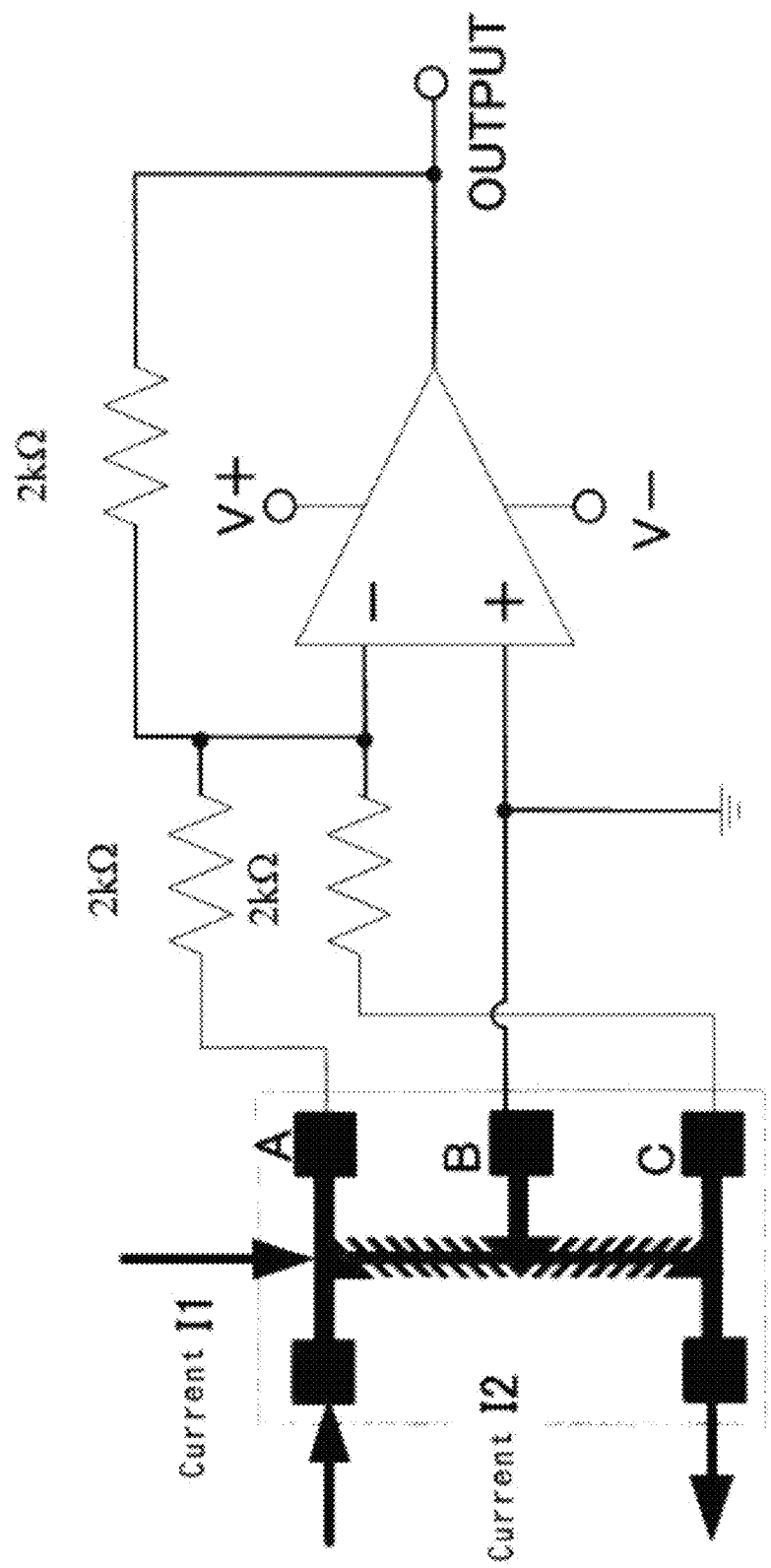
FIG. 32 illustrates a state of connection of an amplification circuit of the barber-pole magneto-resistance effect type magnetic film power sensor of a differential type.

FIG. 32 illustrates a state of connection of an amplification circuit of the differential type barber-pole magneto-resistance effect type magnetic film power sensor 1. By grounding a B terminal in FIG. 32 and by adding electric signals from an A terminal and a C terminal by an operational amplifier, an electric signal which outputs only a change in the magnetic field without a bias voltage can be obtained.

Figure 33:
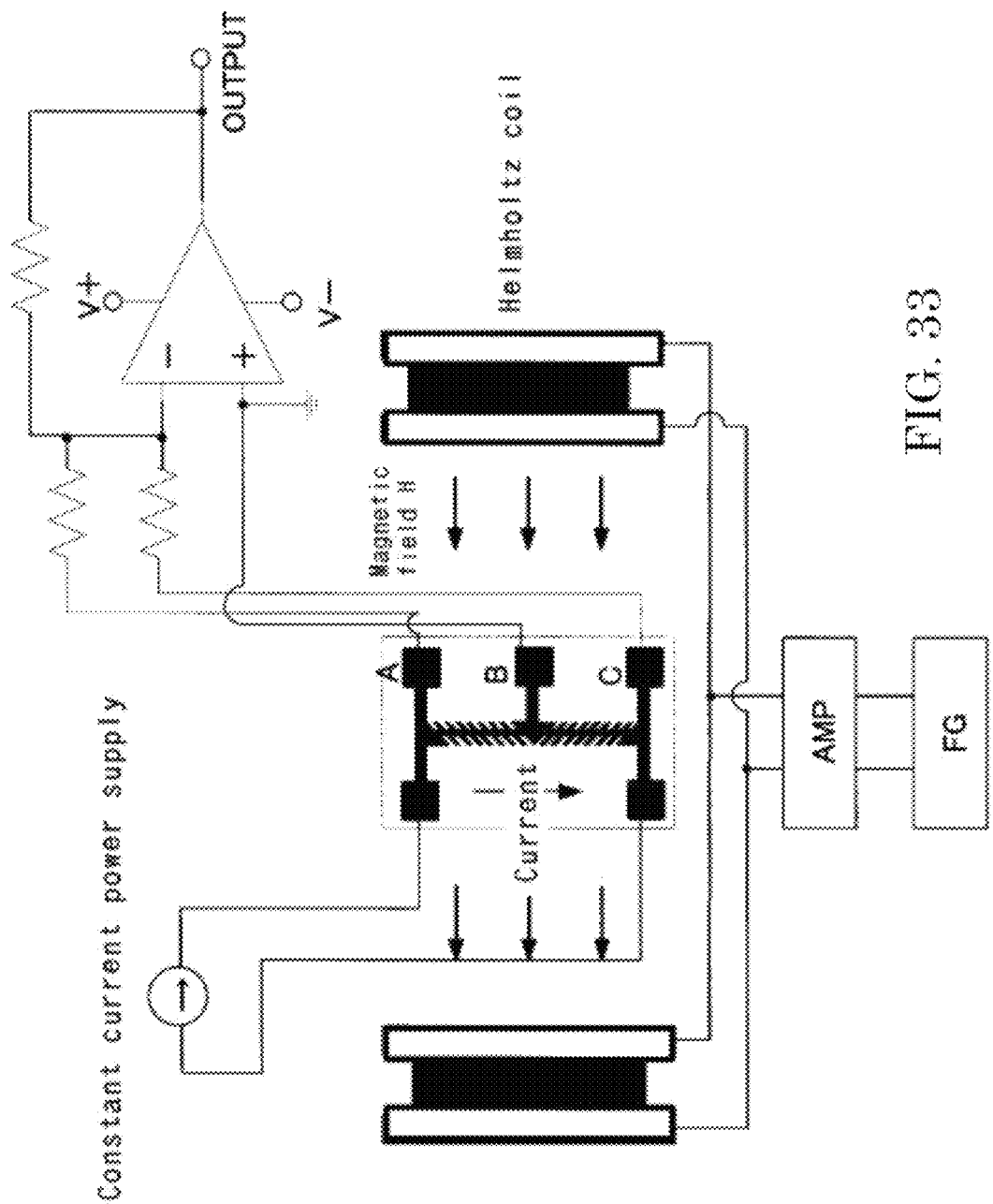
FIG. 33 illustrates a specific measurement system of FIG. 32.

FIG. 33 illustrates a measurement system. All the resistance values of the amplifier are set to 2 kΩ, and an amplification gain is 1.

Figure 34A:
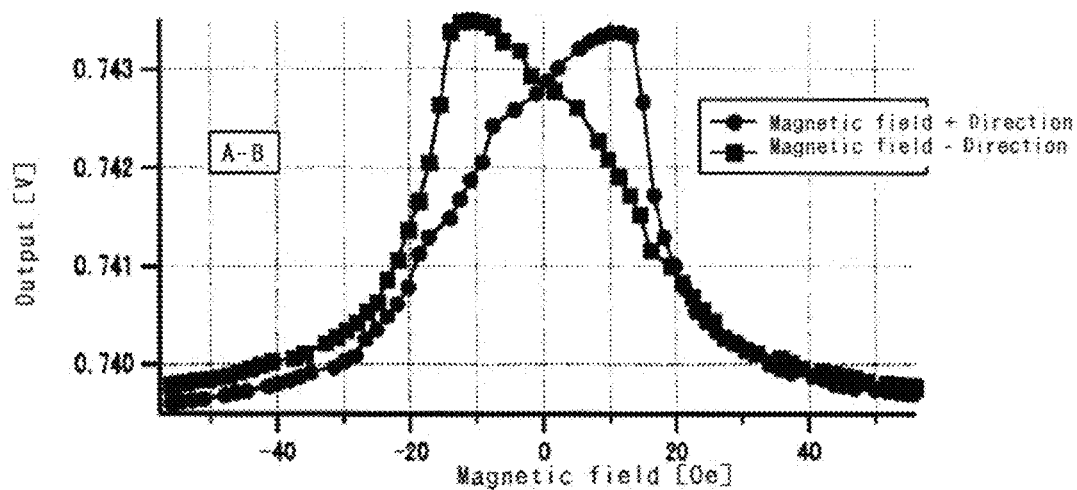
FIG. 34(a) illustrates an output characteristic between A-B terminals in FIG. 33.
Figure 34B:
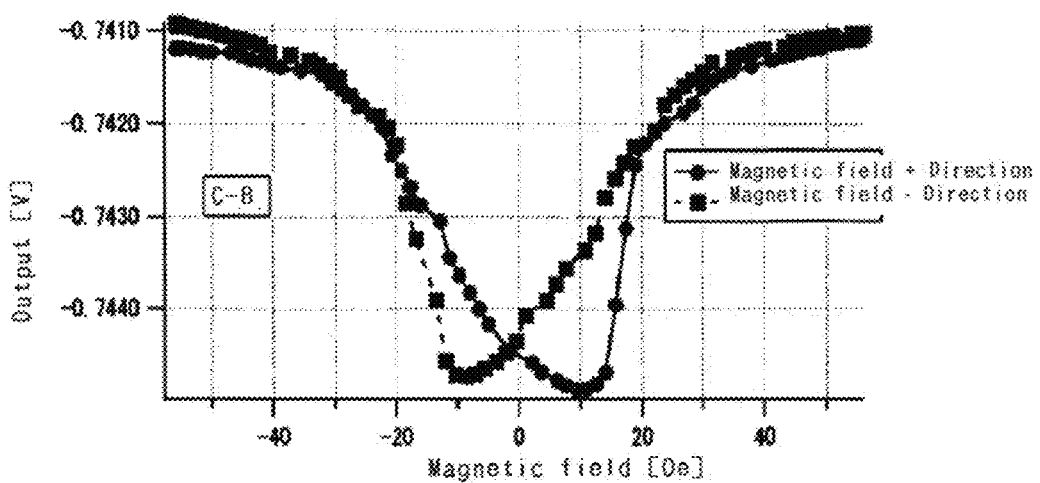
FIG. 34(b) illustrates an output characteristic between C-B terminals in FIG. 33.
Figure 35:
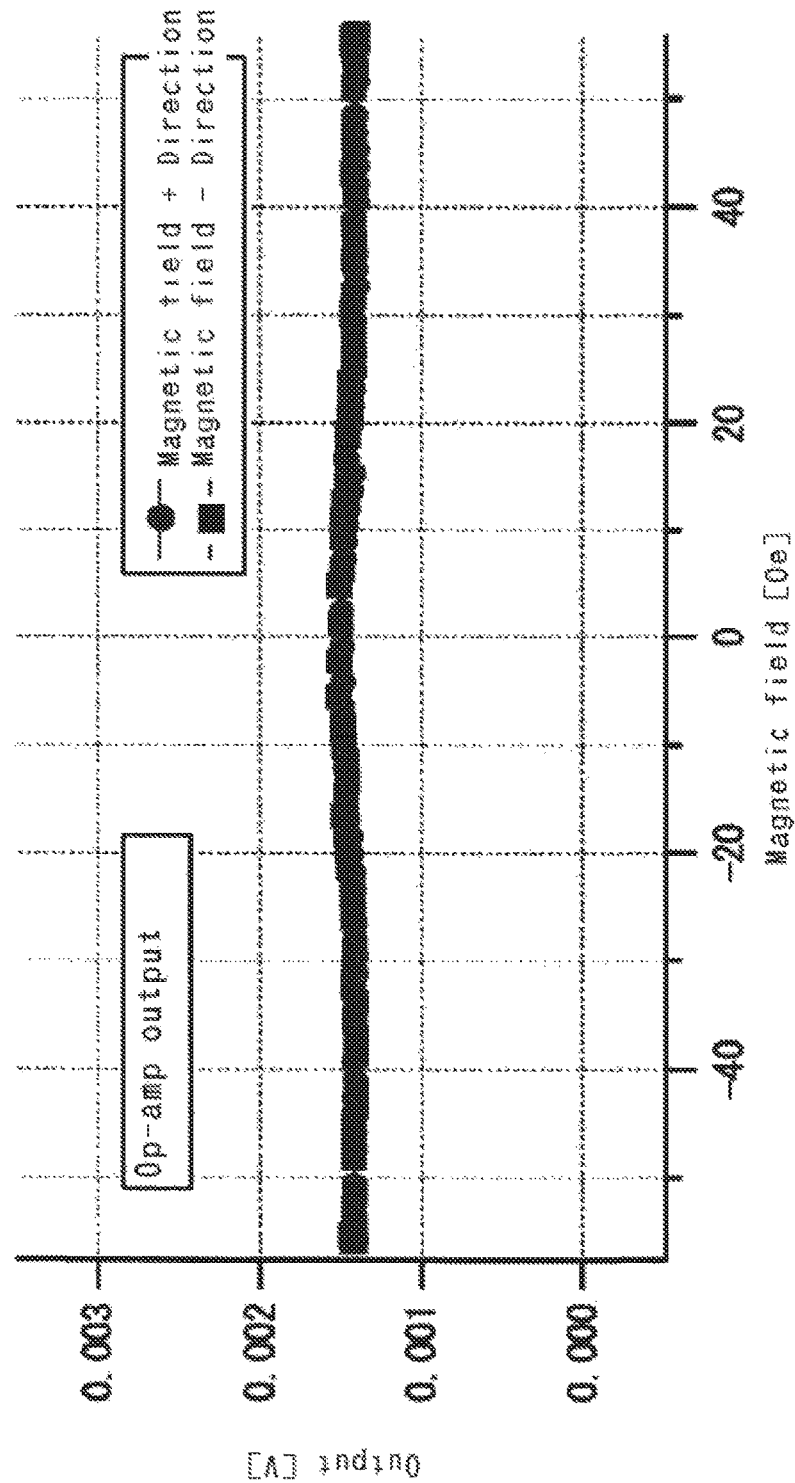
FIG. 35 illustrates an output voltage of an op-amp in FIG. 33.

Subsequently, an output characteristic of the magnetic film power sensor 1 with the barber-pole magnetic film to a uniform external magnetic field was measured. FIG. 34(a) illustrates an output characteristic between A-B terminals in FIG. 33, FIG. 34(b) illustrates an output characteristic between C-B terminals in FIG. 33, and FIG. 35(c) illustrates an output voltage of an op-amp in FIG. 33. In these diagrams, a vertical axis indicates an output (V) and a lateral axis indicates a magnetic field applied from the outside (magnetic field by a Helmholtz coil in FIG. 33). Note that, regarding the output characteristics between A-B terminals illustrated in FIG. 34(a), an output offset between A and B is 742 [mV], an output change between A and B is 4 [mV], an output change rate of A and B is 0.42 [%], and a resistance change rate is 0.0031/0.742*100=0.42 [%].

Regarding the output characteristic between C-B terminals illustrated in FIG. 34(b), the output offset between C and B is 743 [mV], the output change between C and B is 2.6 [mV], the output change rate between C and B is 0.35 [%], the resistance change rate is 0.0026/0.7430*100=0.35 [%]. Regarding the output characteristic of the op-amp in FIG. 33 illustrated in FIG. 35(c), the output offset between A and C is 1.46 [mV], the output change between A and C is 0.11 [mV], the output change rate between A and C is 7.5 [%], and the resistance change rate is 0.00011/0.00146*100=7.5 [%].

In FIGS. 34(a) and 34(b), the resistance changes largely with respect to the magnetic field. In FIG. 35(c), it is known that the bias voltage is largely decreased as compared with FIGS. 34(a) and 34(b). A change in the output voltage by the magnetic field is small. Therefore, it is considered that a direction of magnetization or a magnetic domain structure in the magnetic film 1c becomes a multiple magnetic domain state, not a single magnetic domain with uniaxial anisotropy.

TABLE 1

| | | | |
|---|---|---|---|
| Decrease rate in offset voltage | 742.5 [mV] | 1.46 [mV] | 99.804 [%] |
| Output change rate | 3.3 [mV] | 0.11 [mV] | 3.3 [%] |
| Output improvement rate (resistance change rate) | 0.385 [%] | 7.5 [%] | 1950 [%] |

Table 1 illustrates an output improvement result by the barber-pole magnetic film. It is assumed that the output change rate (output voltage) is largely decreased because magnetization in the film is not sufficiently aligned in the element longitudinal direction. However, the resistance change rate is rapidly improved by a rapid decrease in the offset voltage, and it is known that a performance as a device is markedly improved by differential connection of the barber-pole magnetic film 1. The decrease in the offset voltage results in a merit that an amplification rate of the amplification circuit connected to the element can be made large, which is considered an extremely advantageous result.

Figure 36:
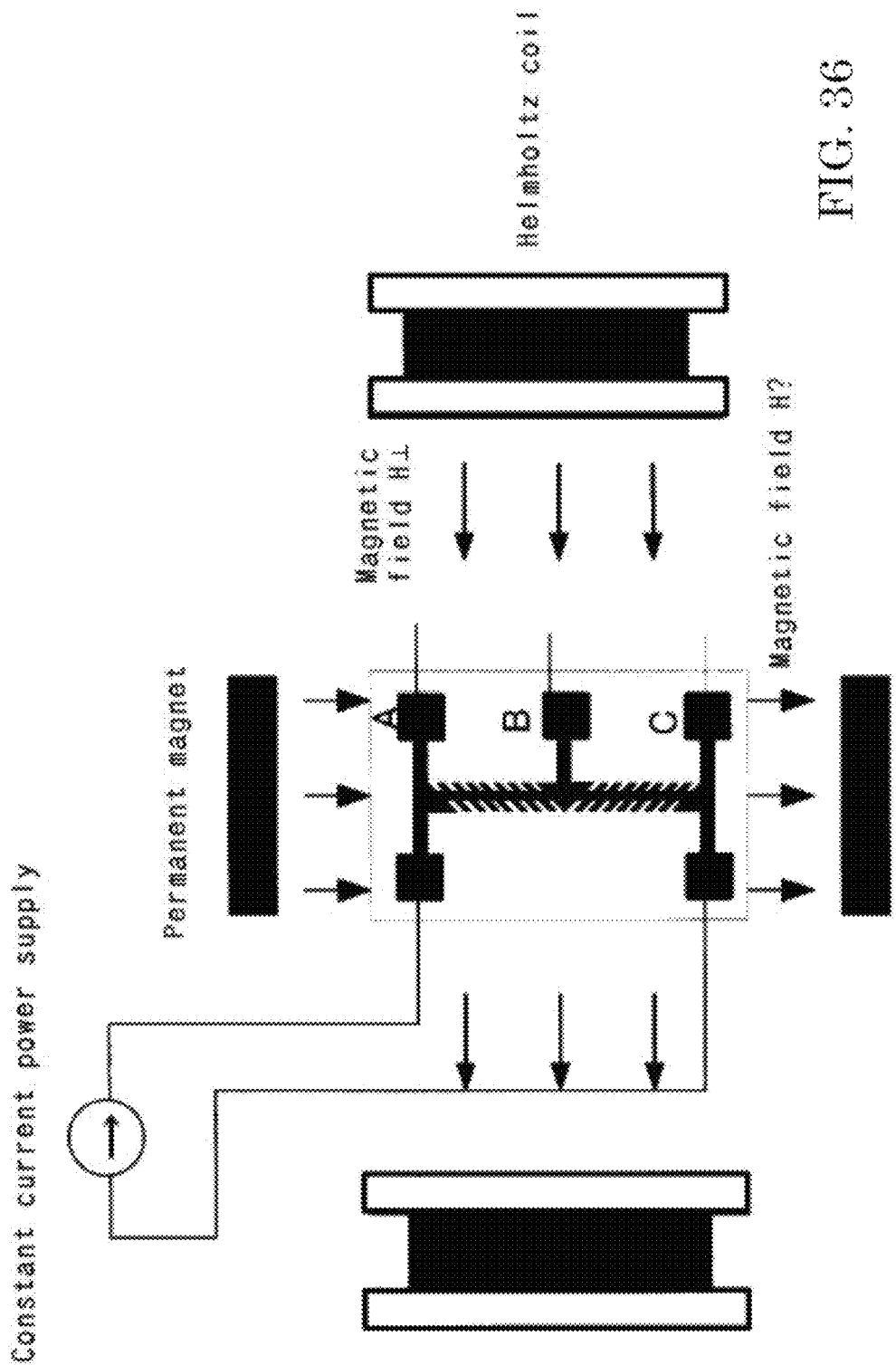
FIG. 36 illustrates a schematic diagram of the measurement system when the bias magnetic field is applied in parallel with a long axis.

FIG. 36 illustrates a schematic diagram of the measurement system when the bias magnetic field is applied in parallel with a long axis. By forcedly aligning the magnetization direction in one way as described above, a change in the characteristic as an element (device) is examined.

Figure 37A:
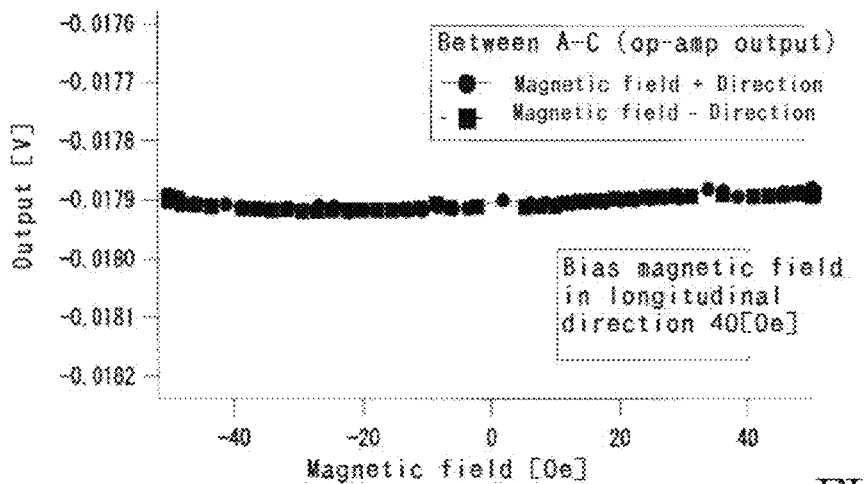
FIG. 37 illustrate output characteristics of the measurement system in FIG. 36.

An output characteristic of the measurement system in FIG. 36 is illustrated in FIG. 37. FIG. 37(a) illustrates an output characteristic when a bias magnetic field is applied in the magnetic film longitudinal direction in an element (differential connection) fabricated without providing a barber pole. A vertical axis indicates an output voltage (V) and a lateral axis is a magnetic field (Oe) from the outside. As is obvious from this figure, the resistance change without a barber pole and with a bias magnetic field is extremely small. The resistance change rate was 0.00022%, which is extremely small.

Figure 37B:
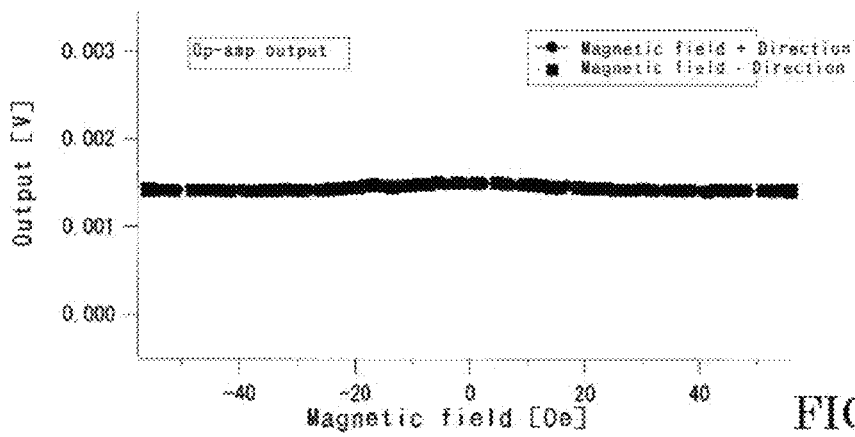

FIG. 37(b) illustrates an output characteristic in the case of an element with the barber pole and without a bias magnetic field, that is, the output characteristic when a DC bias magnetic field is not applied in the longitudinal direction of the barber-pole magnetic film 1. A vertical axis indicates an output voltage (V) and a lateral axis indicates a magnetic field (Oe) from an outside.

Figure 37C:
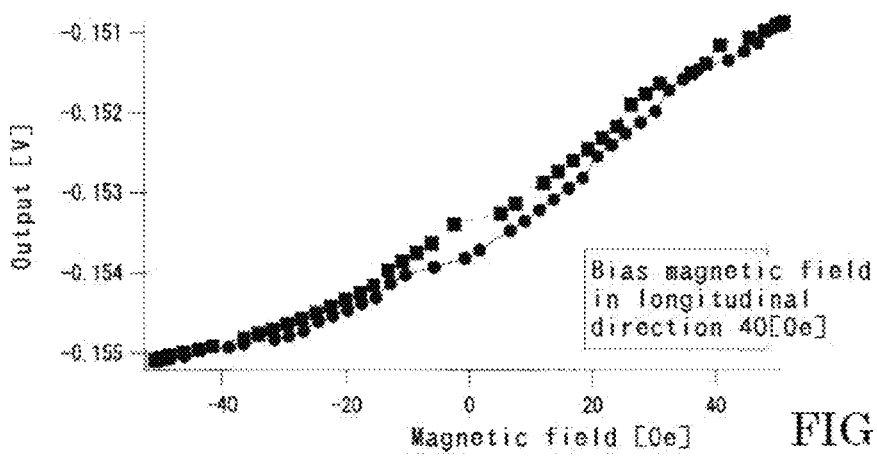

FIG. 37(c) illustrates an output characteristic of an element with a barber pole and with a bias magnetic field in the magnetic film longitudinal direction, that is, the output characteristic when a DC bias magnetic field is applied in the longitudinal direction of the barber pole magnetic film 1, a vertical axis indicates an output voltage (V) and a lateral axis indicates a magnetic field (Oe) from an outside. It is known that the output characteristic is largely changed by whether or not the bias magnetic field is applied in the element longitudinal direction. It can be assumed to be caused by insufficient strength of anisotropy of the magnetic field.

It is assumed that magnetization is strongly aligned in the magnetic field direction by a bias magnetic field in the element longitudinal direction so as to assist strength of the anisotropy, and a clear angle is formed by magnetization and a current. The resistance change rate is 0.6% without a bias magnetic field and 3.3% or more with the bias magnetic field, and the bias magnetic field can be considered to be extremely effective.

Figure 38:
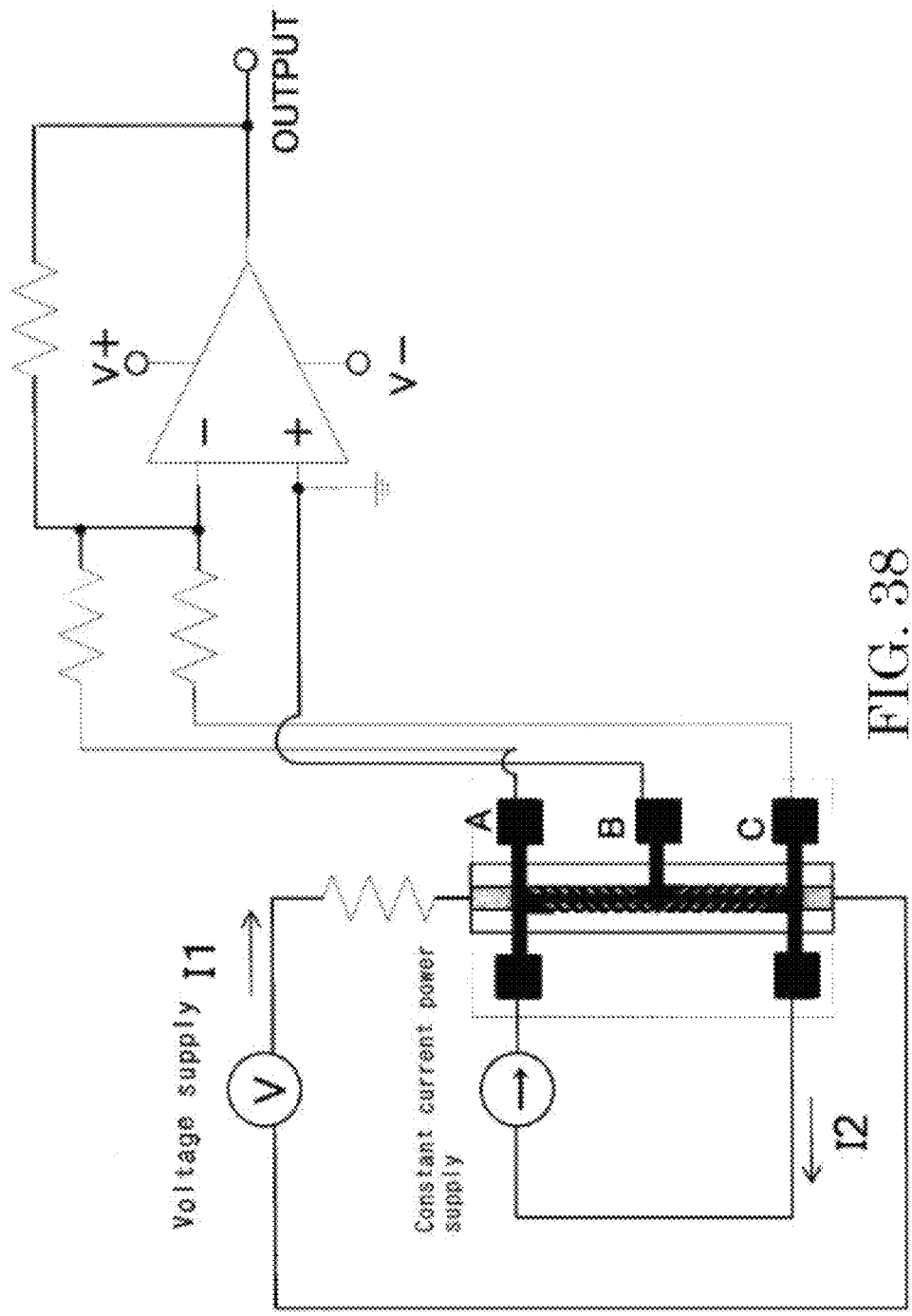
FIG. 38 illustrates the measurement system of a characteristic as a power meter when a load current (I1) is made to flow through a conductor film.

FIG. 38 illustrates a measurement system of the characteristic as a power meter when a load current (I1) is made to flow through the conductor film. In original power measurement, the load current flowing through the load (I1) is made to flow through the conductor film, and a current (I2) in proportion to the size of the load voltage is made to flow through the magnetic film, and measurement is made. However, in FIG. 38, it was configured that I1 and I2 can be set individually and the characteristics were evaluated.

Figure 39:
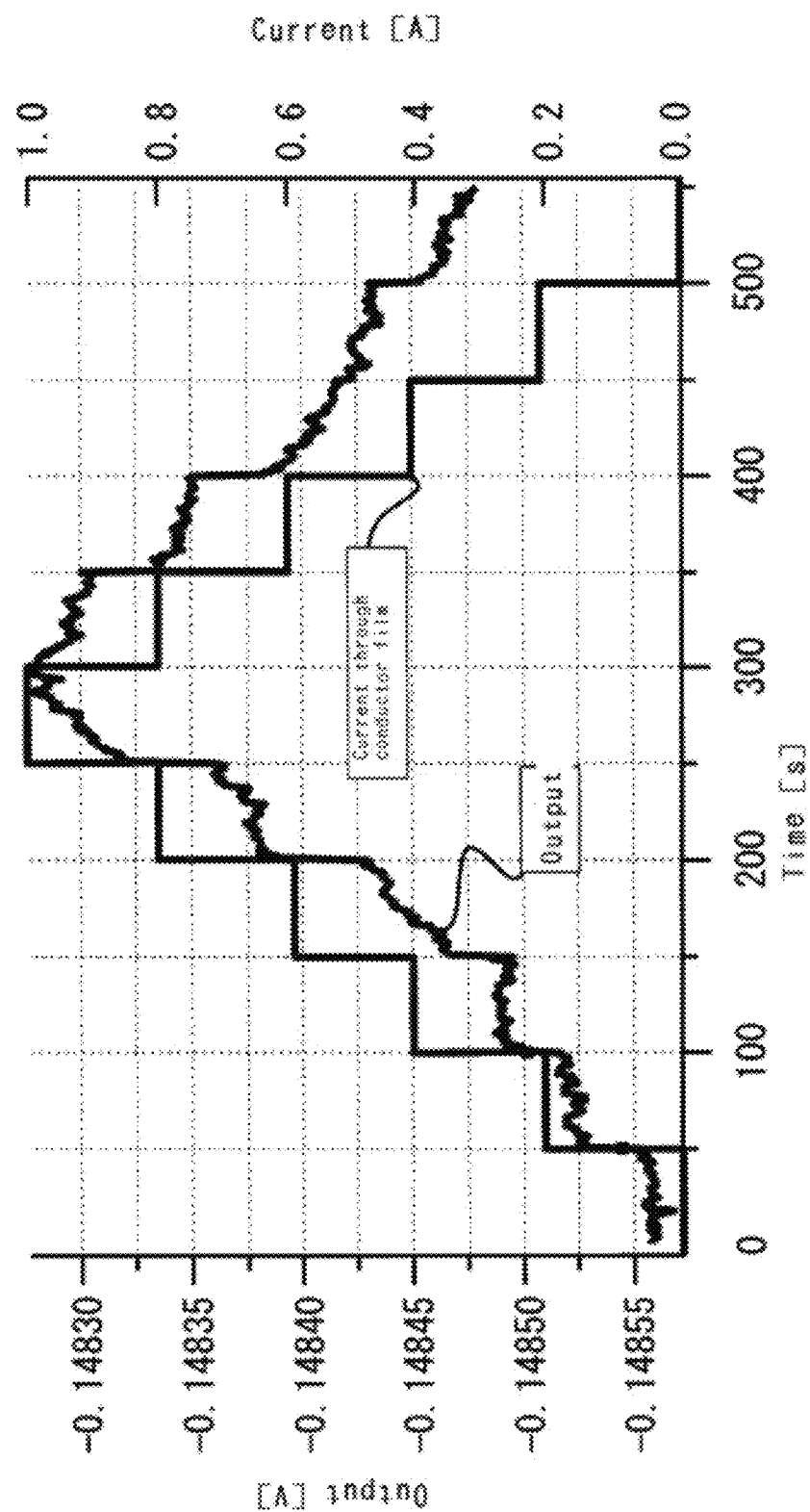
FIG. 39 illustrates an output characteristic when the load current (I1) is made to flow through the conductor film without applying the bias magnetic field.

FIG. 39 illustrates an output characteristic when the load current (I1) was made to flow through the conductor film without applying a bias magnetic field. A left vertical axis is an output (V), a right vertical axis is a current (A) made to flow through the conductor film, and a lateral axis is time (sec). In this measurement, the DC current (I2) made to flow through the magnetic film was set to 2 mA. The load current (I1) was set by using a DC power supply connected to a load resistor. The load current was increased from 0 [A] to 1 [A] by 0.2 [A] each and then, decreased by 0.2 [A] each, and measurement was made for 50 [s], respectively.

It is known that an output increases with an increase in the load current (I1). However, a change in the power sensor output with respect to the change in the load current cannot be considered to clearly reflect a change in the current. One of the causes is considered that the direction of the magnetization of the magnetic film does not move in proportion to the applied magnetic field.

Figure 40:
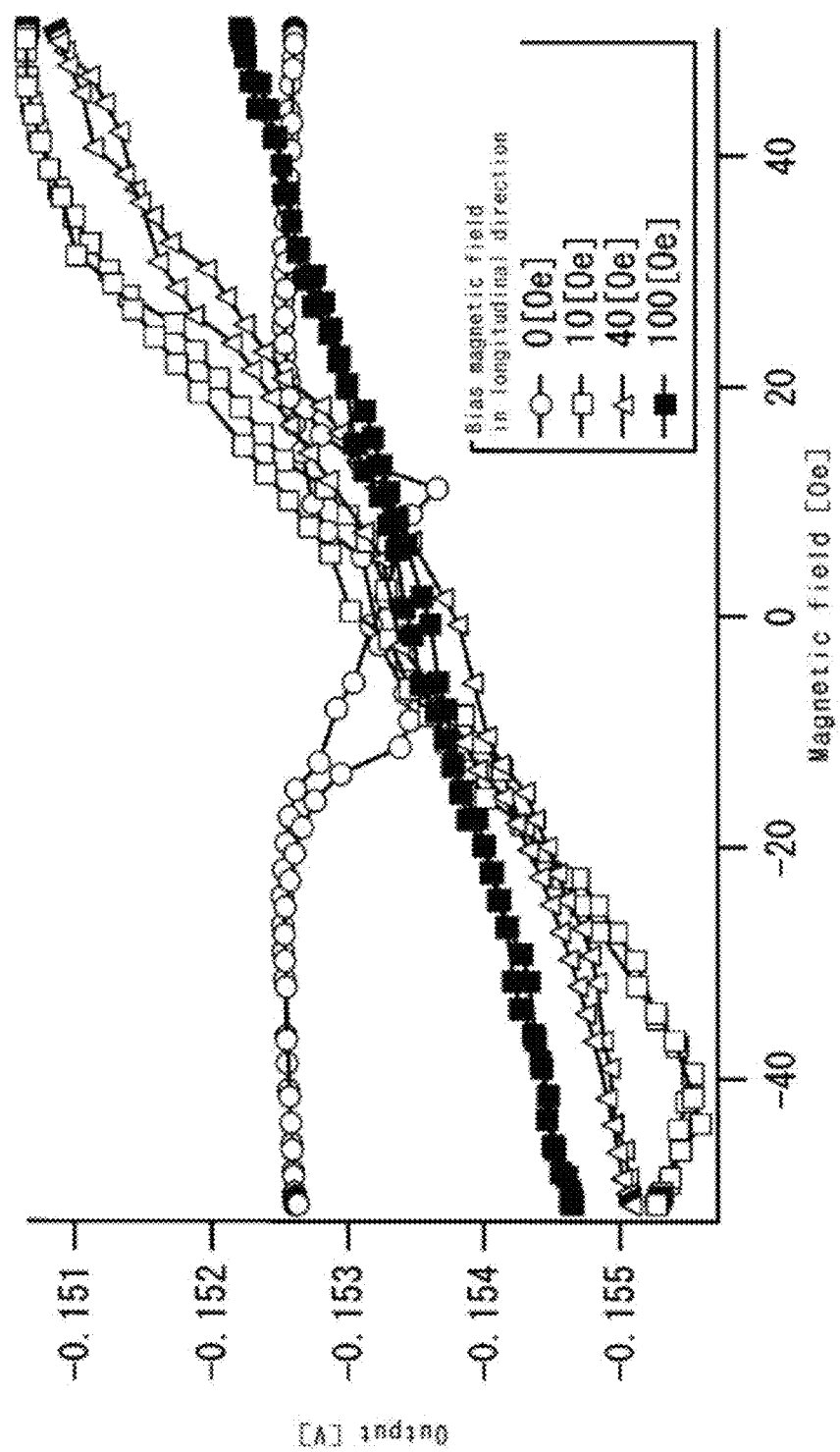
FIG. 40 illustrates an output change caused by magnetic field application in an element longitudinal direction (longitudinal direction of the magnetic film).

FIG. 40 illustrates an output change by magnetic field application in the element longitudinal direction (longitudinal direction of the magnetic film). A vertical axis indicates a power sensor output (V), and a lateral axis indicates a magnetic field (Oe) from the outside. In the graph, a circle indicates in a case where the bias magnetic field in the long axis direction is zero, a square indicates in a case of 10 Oe, a triangle indicates an instance of 40 Oe, and a black square indicates an instance of 100 Oe. In the non-magnetic field state (circle), an output as a power meter is not fixed uniquely in this state from the relationship between strength of anisotropy of the magnetic film and the direction of magnetization and cannot be expected as a power meter.

However, linearity and favorable sensitivity can be obtained in a wide range in 10 Oe and 40 Oe. In the case of application of 100 Oe, a drop in sensitivity is clearly shown, but as compared with 10 Oe and 40 Oe, it is known that a linear region is wider. The bias magnetic field has an aligned magnetic domain structure of the film up to some degree of size, and high sensitivity and favorable linearly can be obtained, but it is obvious that the large bias magnetic field lowers sensitivity.

The bias magnetic field application to a degree somewhat exceeding a maintaining force of the magnetic film has an effect of largely improving the sensitivity as a power meter. Moreover, the application magnetic field at the anisotropic magnetic field or more decreases sensitivity but can be said to have an effect of expanding an operation range as a power meter. By changing the size of the application magnetic field, a measurable current (power) can be said to be set. However, sensitivity lowers.

Figure 41:
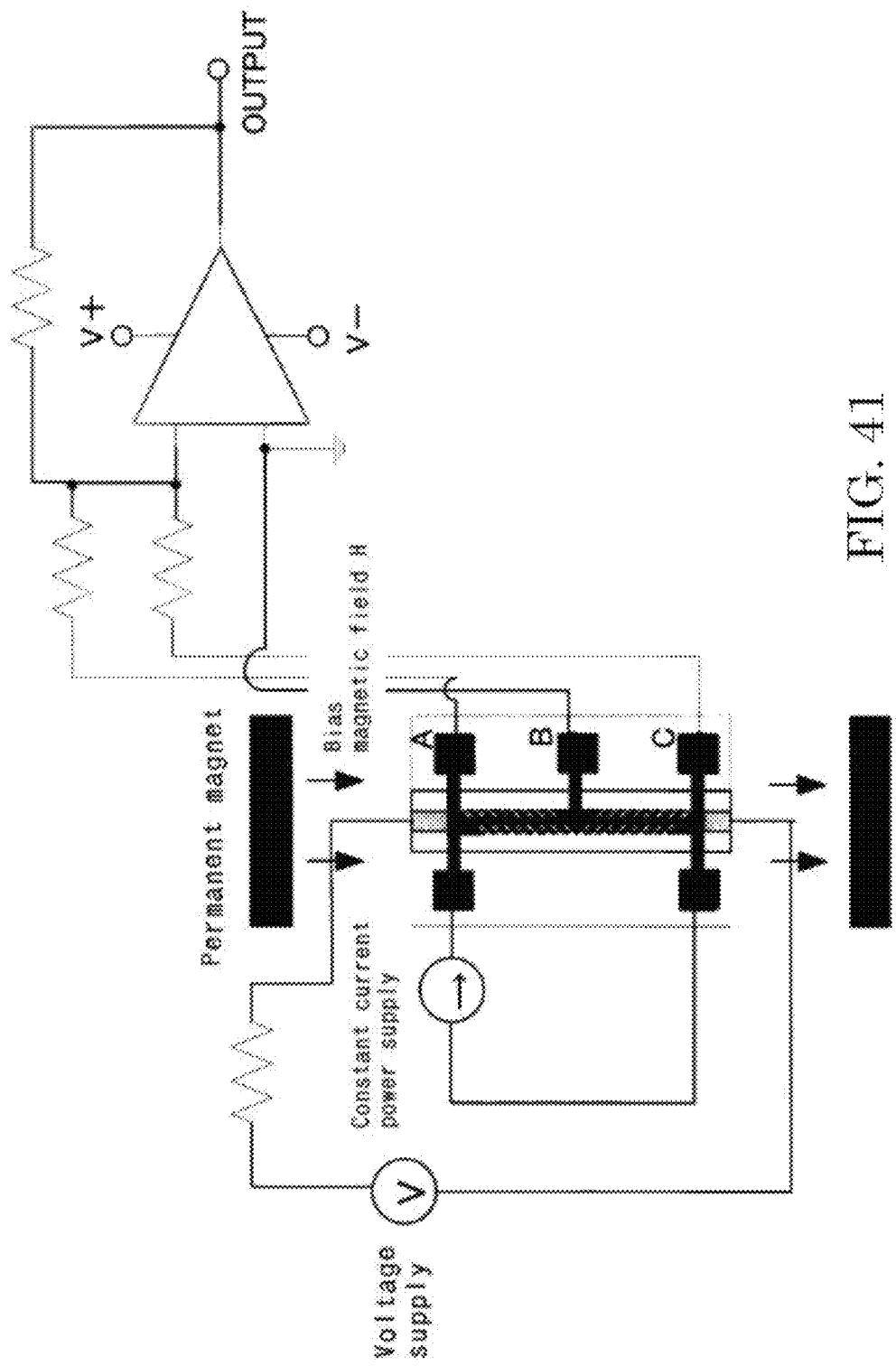
FIG. 41 illustrates the measurement system when the bias magnetic field is applied.

FIG. 41 illustrates a measurement system when a bias magnetic field is applied. Here, the bias magnetic field was applied by using a permanent magnet. The size of the magnetic field was set by adjusting a distance of the magnet.

Figure 42:
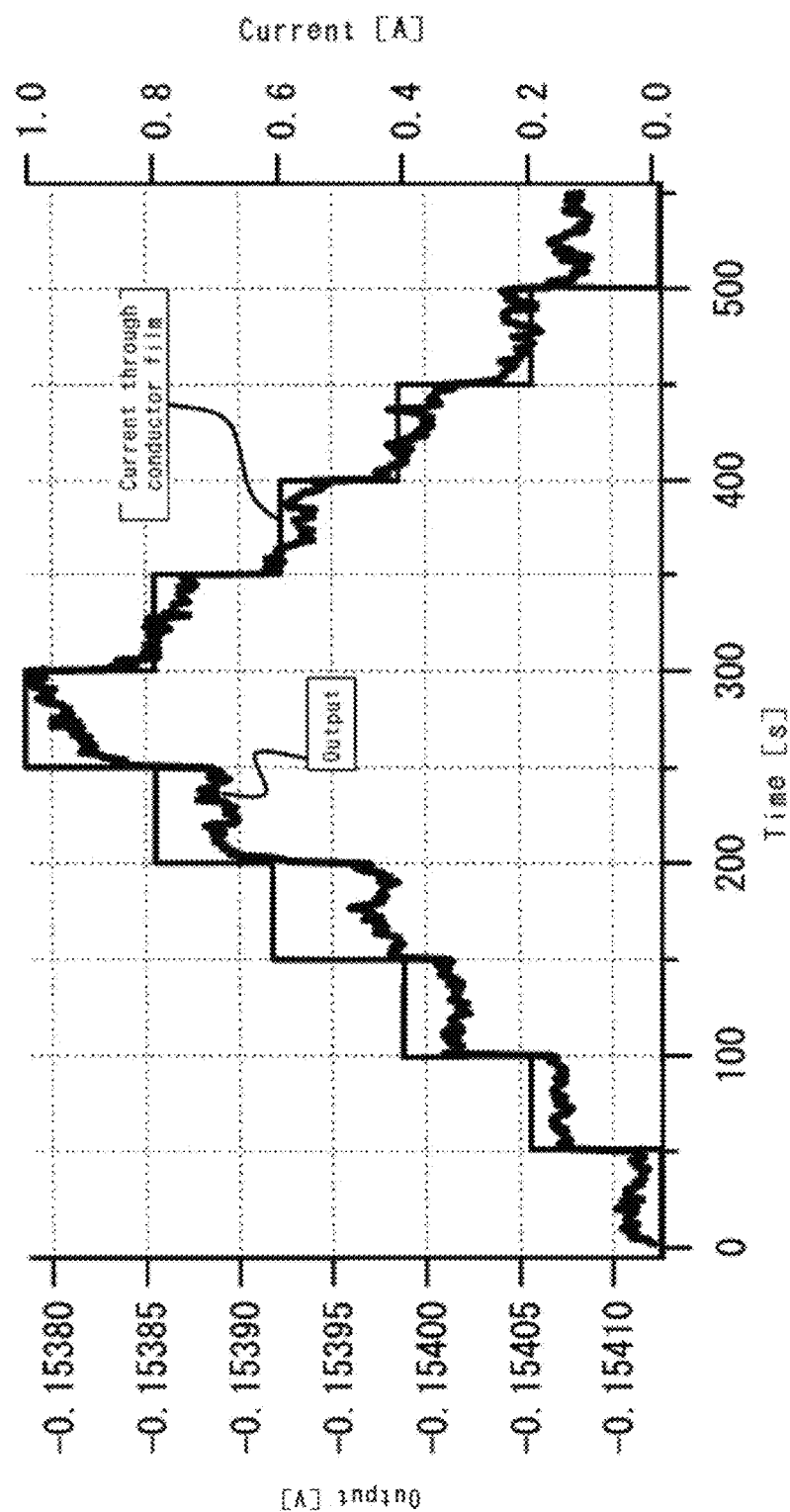
FIG. 42 illustrates an output characteristic of this magneto-resistance effect type magnetic film power sensor when the bias magnetic field is applied.

FIG. 42 illustrates an output characteristic of this magneto-resistance effect type magnetic film power sensor when the bias magnetic field is applied. A left vertical axis indicates a sensor output (V), a right vertical axis indicates a current value (A) flowing through the conductor film, and a lateral axis indicates time (sec). The size of the bias magnetic field is 40 Oe. The other measurement conditions are the same as those in FIG. 39. It is obvious from this FIG. 42 that a follow-up performance of the output voltage to the current change is improved by application of the bias magnetic field. A somewhat error is generated, but it is expected to be largely improved by improvement of a film property and application of an AC bias. Moreover, it is considered the AC power measurement can operate without a problem.

As a result, it can be concluded that the barber-pole type magnetic film power sensor and the differential type barber-pole magnetic film power sensor are optimally applied to a smart grid, a smart battery and the like and advantageous for avoiding power shortage or the like.

Embodiments and their concepts of the various magnetic film power sensors of the present invention have been explained, but the present invention is not limited to that, and it can be understood by those skilled in the art that other variations and improvements can be obtained within a range not departing from the spirit or teaching described in claims, specification and the like.

Figure 43:
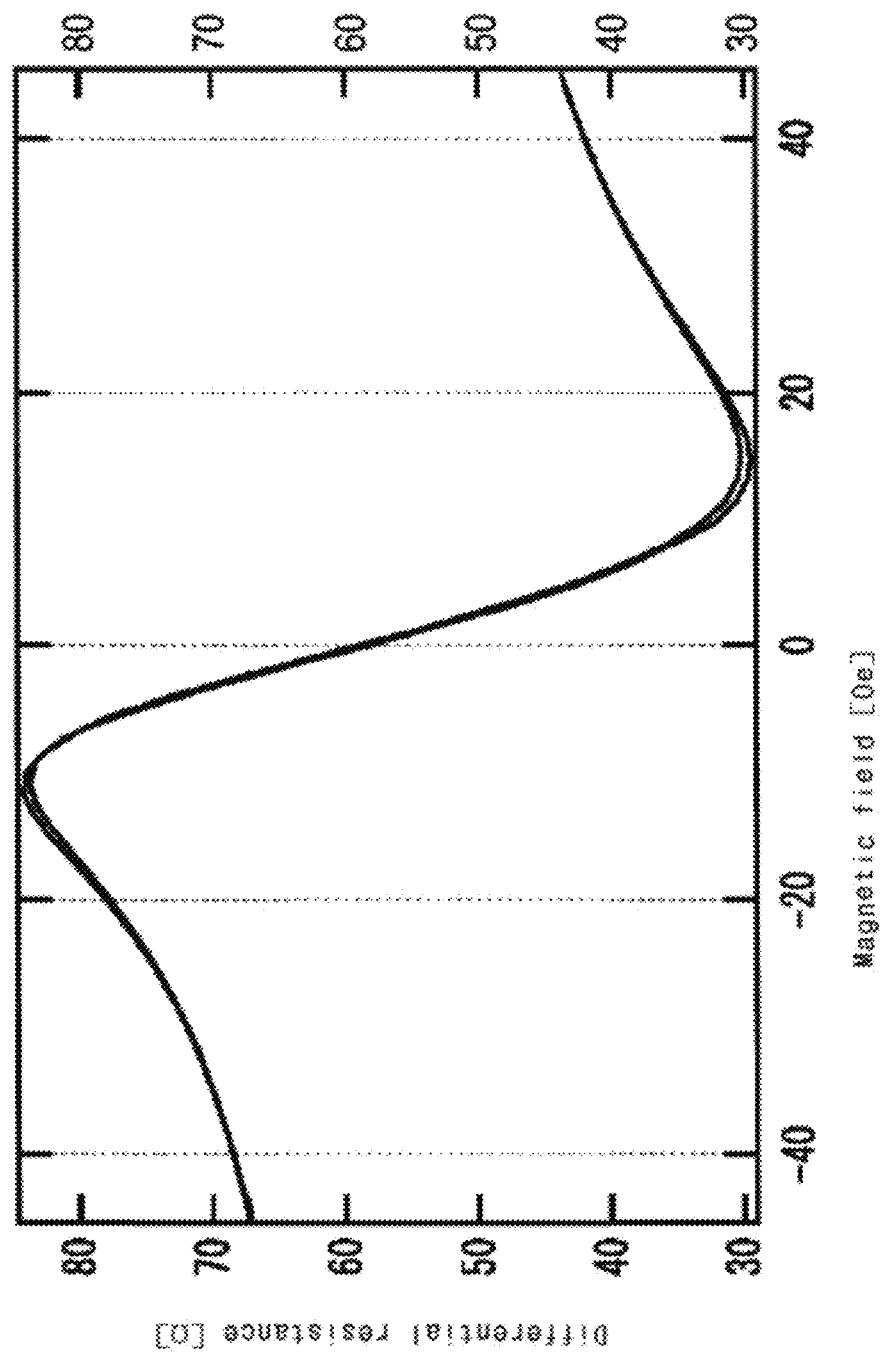
FIG. 43 is a diagram illustrating a magneto-resistance response curve of a sensor used in the DC power measurement.

Subsequently, a sensor was used in measurement of battery power, DC power was measured, and linearity and accuracy of the sensor output was examined. FIG. 43 illustrates a magneto-resistance response curve of the sensor used in the DC power measurement. A vertical axis indicates a value (Ω) of differential resistance, and a lateral axis indicates an applied magnetic field (Oe). An AC magnetic field at 0.02 Hz is measured by applying an external magnetic field from the outside.

An operation range as the power sensor is a portion with a proportional relationship between a magnetic field and a resistance value in the vicinity of the magnetic field H=0. Note that the sensors include the sensor A (FIG. 43) and the sensor B (FIG. 44) because two batteries are used for charge/discharge power measurement of the battery which will be described later, and the two power sensors of the respective batteries are used for measurement. The two sensors are referred to as the sensor A and the sensor B, respectively.

Figure 44:
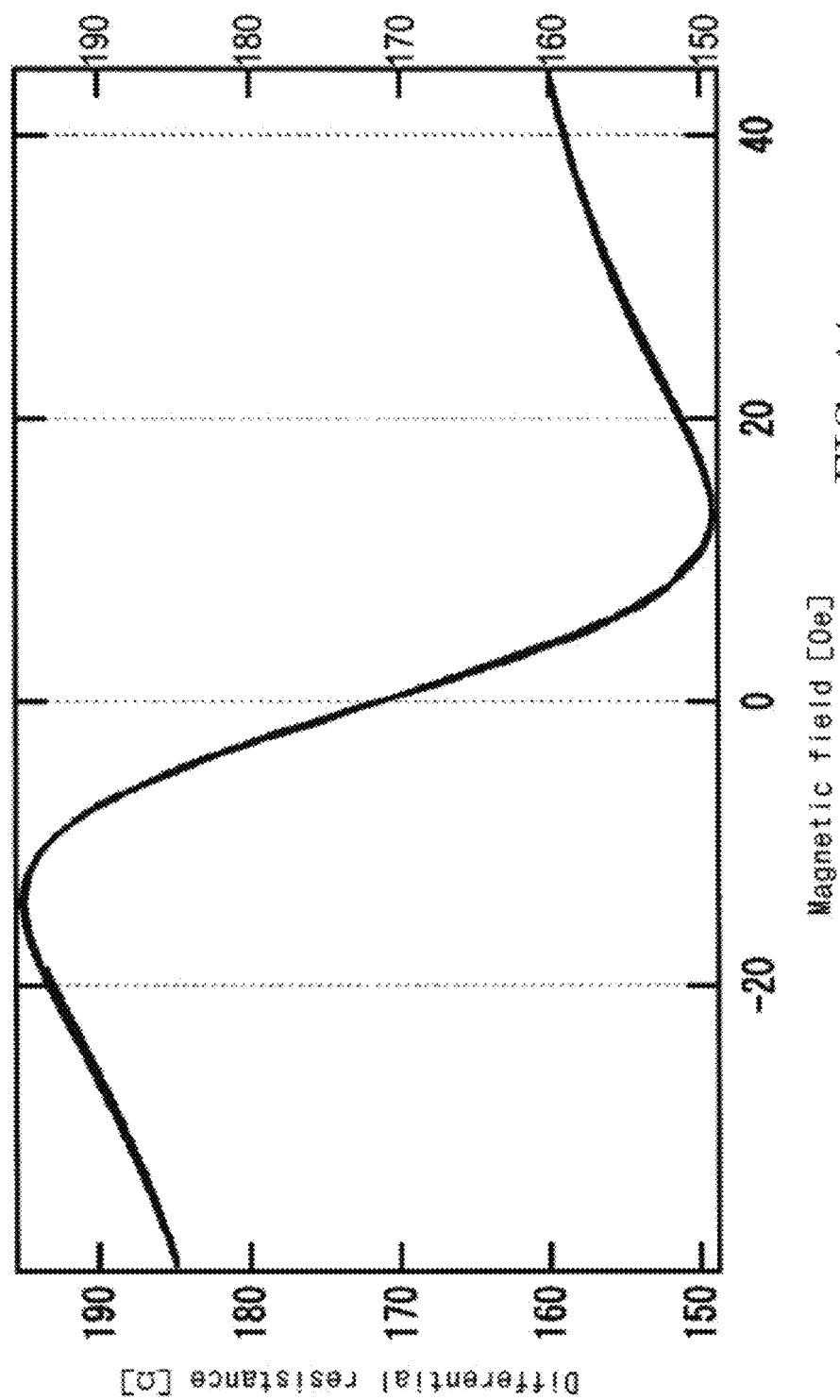
FIG. 44 is a diagram illustrating a magneto-resistance effect characteristic of a sensor B.
Figure 45A:
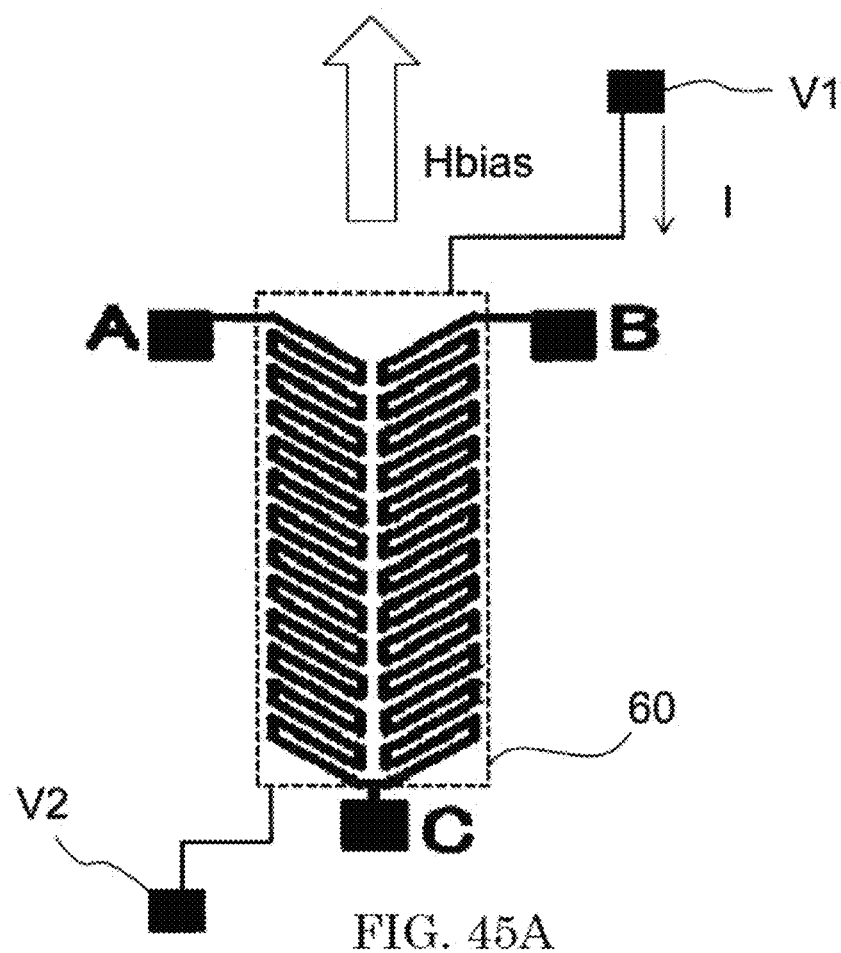
FIG. 45 are diagrams illustrating a pattern of the element.
Figure 45B:
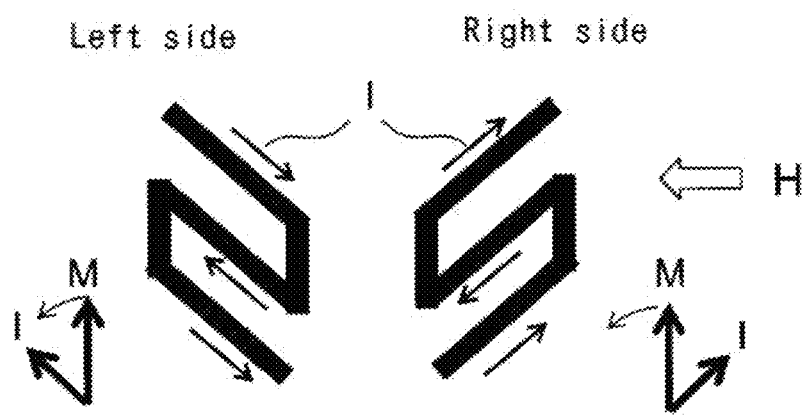

Subsequently, the magneto-resistance effect characteristic of the sensor B is illustrated in FIG. 44. In the sensor A and the sensor B, patterns are formed by applying vacuum deposition of permalloy to a glass substrate and by etching, respectively. The used patterns of the elements are shown in FIG. 45(*a*). It has a structure in which the magnetic films inclined diagonally are arranged symmetrically.

The magneto-resistance response curves illustrated in FIGS. 43 and 44 illustrate differences in resistance values (differential resistances) between A and B and between B and C in FIG. 45. The bias magnetic field 10 Oe is applied to both the sensor A and the sensor B when the magneto-resistance response curve is measured. Note that a direction of the bias magnetic field is a direction of Hbias in FIG. 45. An enlarged view of the pattern in FIG. 45(*a*) is shown in FIG. 45(*b*). The magnetization direction of the magnetic film is given by the bias magnetic field Hbias from A and B to the direction of C.

Note that the sensor in FIG. 45 will be explained. The element in FIG. 45(*a*) is a magnetic film formed having an arrow feather shape. From the terminal A to the terminal C, a portion inclined to the lower right on the figure is connected in series, and a portion inclined to the upper right on the figure is connected in series from the terminal C to the terminal B.

In this sensor, assuming that a resistance value between the terminals A-B is a resistance value AB and a resistance value between the terminals C-B as a resistance value CB, differential resistance is obtained by (resistance value AB)−(resistance value CB). That is, this sensor can alleviate a DC bias. Moreover, in this sensor, the DC bias magnetic field (see FIG. 45(*a*)) is applied in the Hbias direction in use.

By referring to FIG. 45(*b*), on the left side of the arrow feather shape, the inclined magnetic film piece is connected in series. Here, when the bias magnetic field is applied in the direction of the arrow, magnetization in the magnetic film aligns in the bias direction. On the other hand, if a current is made to flow from the terminal A to the terminal C, the current inclined to the left side with magnetizations direction only by an angle θ flows in the inclined portion.

On the other hand, on the right side of the arrow feather shape, the magnetic film piece is inclined in the direction opposite to that on the left side and thus, the current with respect to the magnetization flows with inclination to the right side only by the angle θ. That is because the current flows from the terminal C to the terminal B.

In this state, the conductor film 60 is placed on the sensor as indicated by a dotted line, and the current is made to flow from a terminal V1 to a terminal V2. Then, the magnetic field H is generated from the right to the left on the figure. By referring to FIG. 45(b), magnetization of the magnetic film is inclined by this magnetic field. At this time, on the left side of the arrow feather shape, the magnetization works so as to get close to the current, while on the right side of the arrow feather shape, the magnetization inclines in a direction moving away from the current.

By fabricating the right side and the left side of the arrow feather shape the same as each other, the magneto-resistance characteristics between A-C and between C-B can be made substantially equal. Moreover, since the inclination directions of the magnetic film piece are different between right and left, the polarities become opposite between A-C and C-B. Therefore, by taking a difference between the resistance between A-C and the resistance between C-B, even if there is a DC bias, this can be cancelled.

Here, the bias magnetic field will be explained. The magnetic film is made of a large number of magnetic domains, and the magnetization direction is slightly shifted in each magnetic domain. The magnetic film power sensor applies the magnetic field from the outside in order to align the magnetization directions and starts use in a state with the single magnetic domain. The external magnetic field is called a bias magnetic field.

Figure 46:
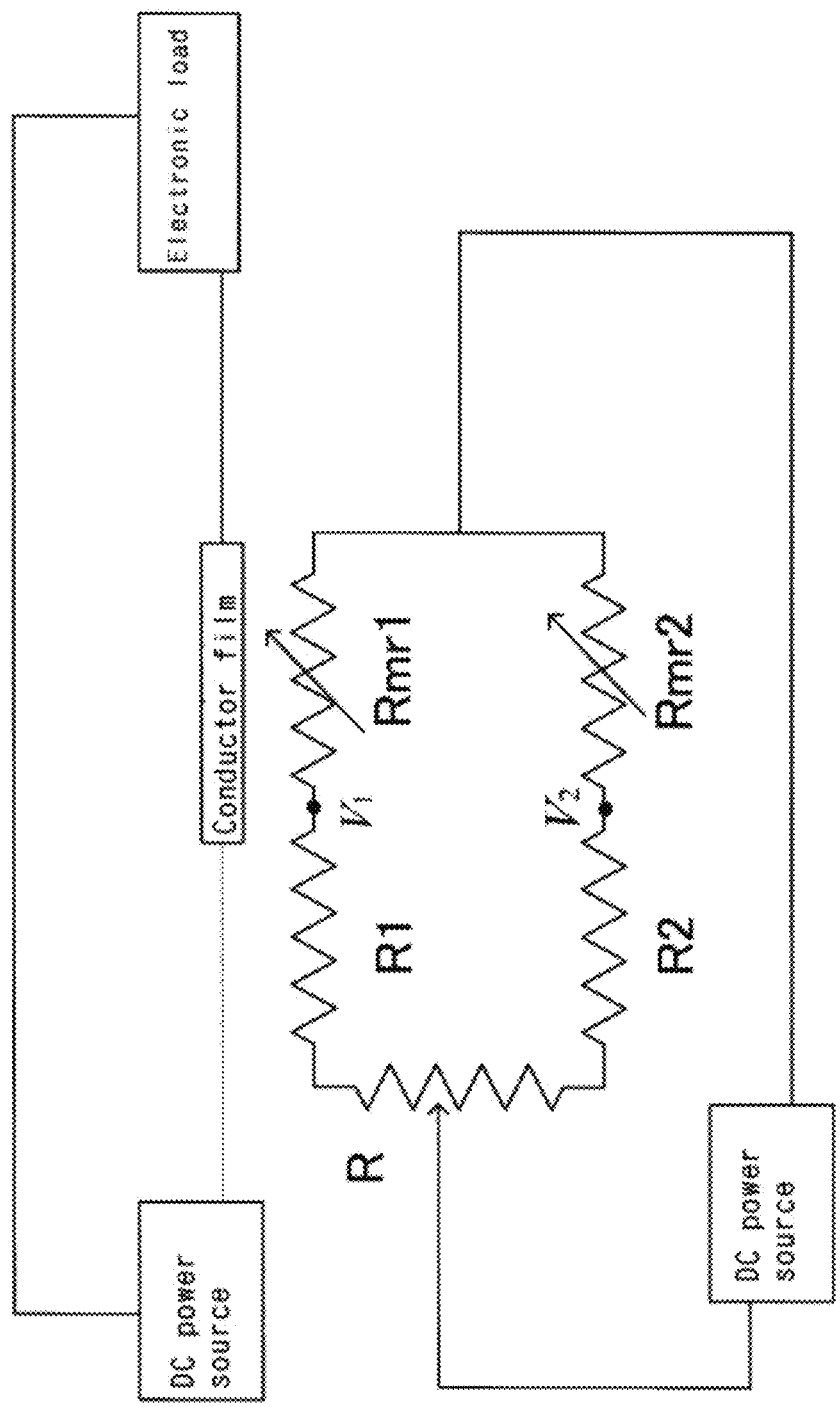
FIG. 46 is a diagram illustrating a circuit of an experiment system of the DC power measurement.

DC power measurement was made by using the magneto-resistance response sensor illustrated in FIGS. 43 and 44. An experiment system is illustrated in FIG. 46. A sensor voltage is made constant at 20 V by a DC power source, and a load current is changed between 1 A to 4 A by 1 A each in a stepped manner. Reference characters Rmr1 and Rmr2 are sensor units, reference characters R1 and R2 are fixed resistors, and reference character R is a variable resistor, and a bridge is balanced by adjusting it, and a differential output between V1 and V2 in FIG. 46 is measured as a sensor output.

Figure 47A:
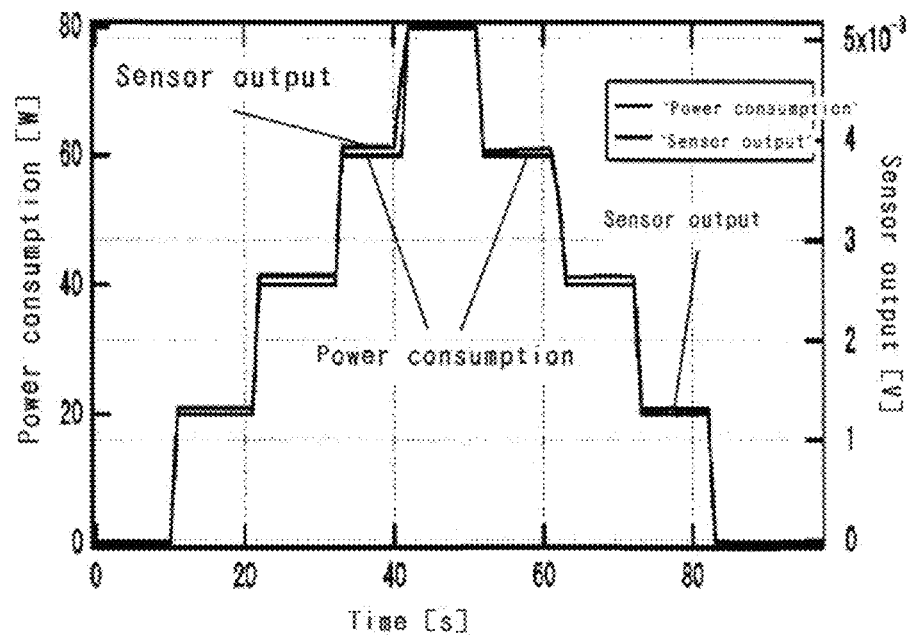
FIG. 47 are graphs illustrating a relationship between power consumption and sensor output.
Figure 47B:
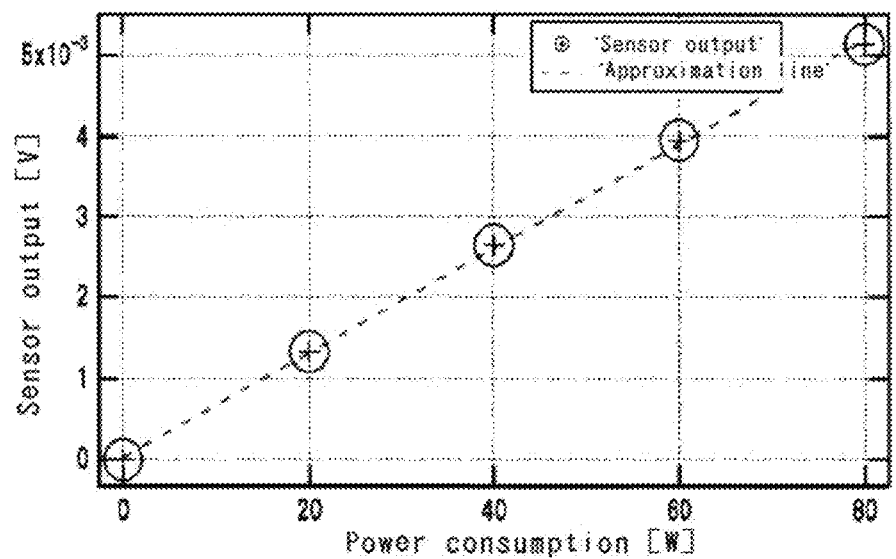

Sensor output average values in Table 2 and Table 3 indicate average values of sensor outputs at each of power consumption, and sensor output converted values are obtained by linearly approximating the power consumption and the sensor output average values and by converting each sensor output from the straight lines to power consumption. An error between the converted value and a theoretical value is shown on the right side in the Tables. The error is 1.3% at the maximum, and power can be measured with accuracy. In a graph in FIG. 47(b), a lateral axis indicates power consumption (W) and a vertical axis indicates a sensor output (V), and it is known that outputs are made with favorable linearity.

TABLE 2

| Voltage [V] | Current [A] | Power consumption [W] | Average value of sensor output [V] | Converted value of sensor output [W] | Error [%] |
| --- | --- | --- | --- | --- | --- |
| 20 | 0 | 0 | −1.22E−05 | −5.34E−01 |  |
|  | 1 | 20 | 0.001324729 | 20.14158366 | 0.70791832 |

TABLE 2-continued

| Voltage [V] | Current [A] | Power consumption [W] | Average value of sensor output [V] | Converted value of sensor output [W] | Error [%] |
| --- | --- | --- | --- | --- | --- |
|  | 2 | 40 | 0.002643881 | 40.54191008 | 1.35477519 |
|  | 3 | 60 | 0.003948784 | 60.72187775 | 1.20312959 |
|  | 4 | 80 | 0.005139033 | 79.12875096 | −1.0890613 |

TABLE 3

| Voltage [V] | Current [A] | Power consumption [W] | Average value of sensor output [V] | Converted value of sensor output [W] | Error [%] |
| --- | --- | --- | --- | --- | --- |
| 20 | 0 | 0 | 6.35E−05 |  |  |
|  | 1 | 20 | 0.001106845 | 20.49561578 | 2.4780789 |
|  | 2 | 40 | 0.00210495 | 41.02345872 | 2.5586468 |
|  | 3 | 60 | 0.003051748 | 60.49608228 | 0.8268038 |
|  | 4 | 80 | 0.0039489 | 78.94763448 | −1.315457 |

Figure 48A:
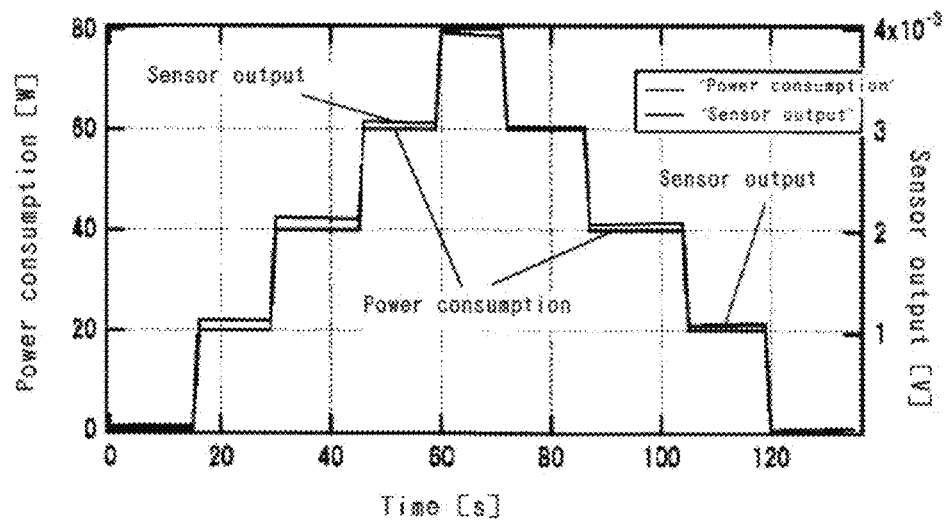
FIG. 48 are diagrams illustrating a result of the DC power measurement of the sensor B.
Figure 48B:
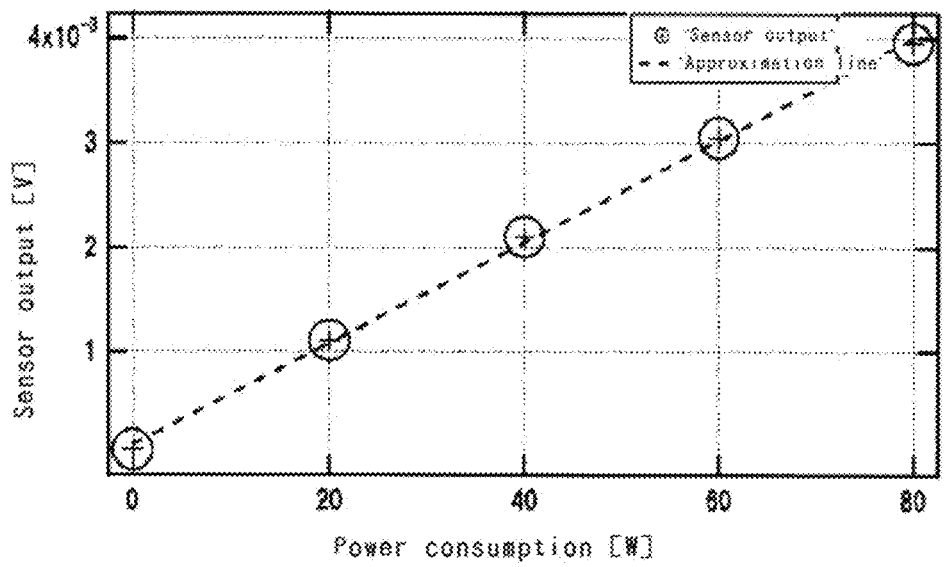

Subsequently, a result of DC power measurement of the sensor B is illustrated in FIG. 48. The sensor B also made outputs with favorable linearity. Factors for the error can be considered to be an influence of an offset voltage caused by the fact that the bridge circuit is not completely balanced at measurement and that the magneto-resistance response curve is not completely linear in an operation range of the sensor.

Subsequently, two onboard batteries are connected in series, charge/discharge is performed, and the power is measured by using the magnetic film power sensor.

Recently, with the environmental problem as a background, a quiet and comfortable electric vehicle (hereinafter referred to as EV) which does not exhaust $CO_2$ of a greenhouse effect gas during traveling and has less vibration by using not an engine but a motor has begun to spread. In this EV, a large number of lithium ion batteries connected in series are juxtaposed in several parallel rows and mounted.

Figure 49A:
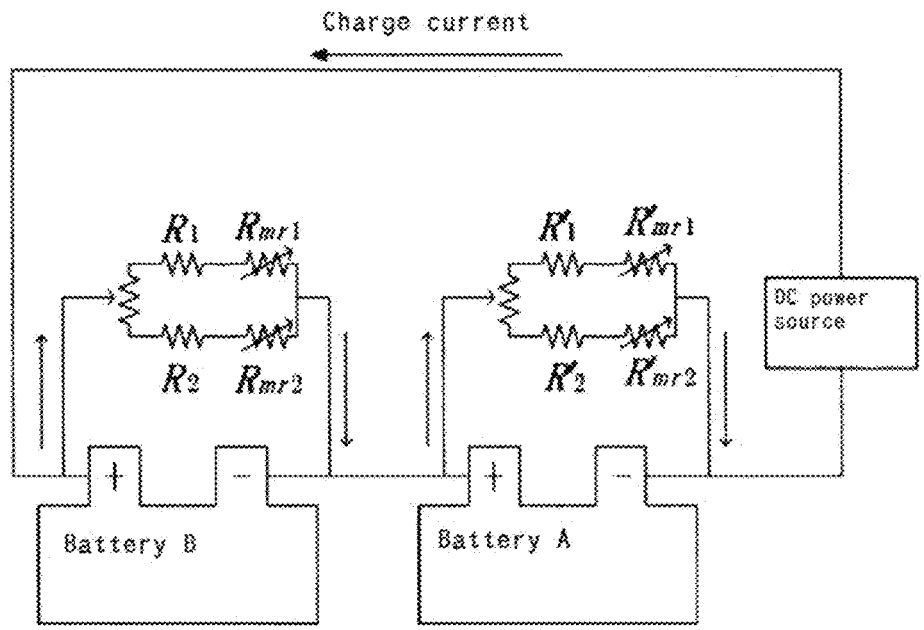
FIG. 49 are diagrams illustrating a circuit in charge/discharge.
Figure 49B:
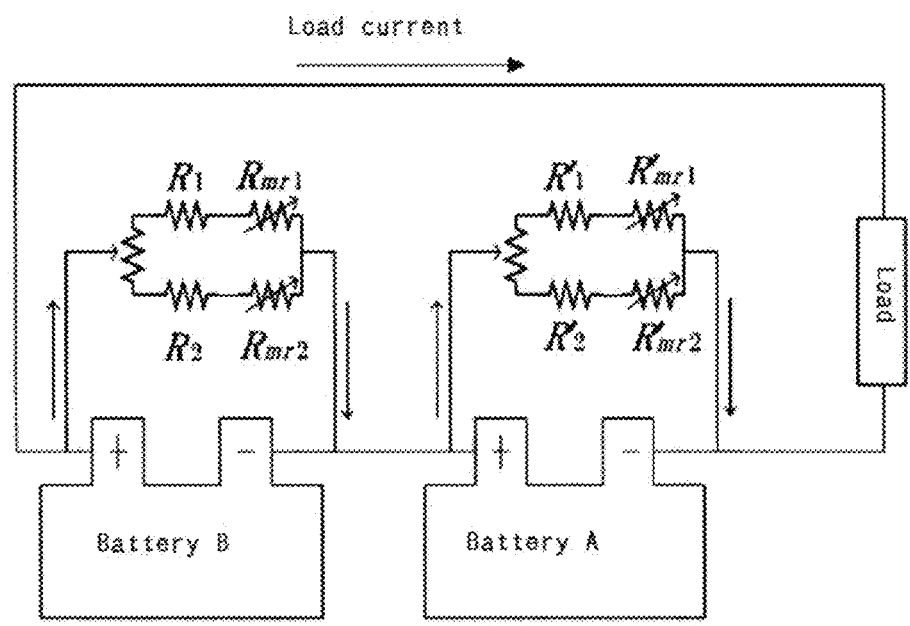

If the lithium ion battery is overcharged, ignition or burst occurs in the worst case. Over-charging or over-discharging might accelerate deterioration of batteries other than the lithium ion battery, too. By utilizing the advantage of small size and light weight of the magnetic film power sensor, a sensor is incorporated in each of the batteries and the remaining power amounts are monitored so that such problems can be solved. FIG. 49 illustrate circuits in charge/discharge.

The batteries A and B use the similar products, but the battery A uses a new product, while the battery B uses a product with considerably decreased battery capacitance due to deterioration over time. By using these batteries, power imbalance is caused between batteries both in charge and discharge. With the purpose of checking whether power can be accurately measured including the imbalance among the batteries, the two batteries, that is, the new battery and the deteriorated battery are used.

Figure 50:
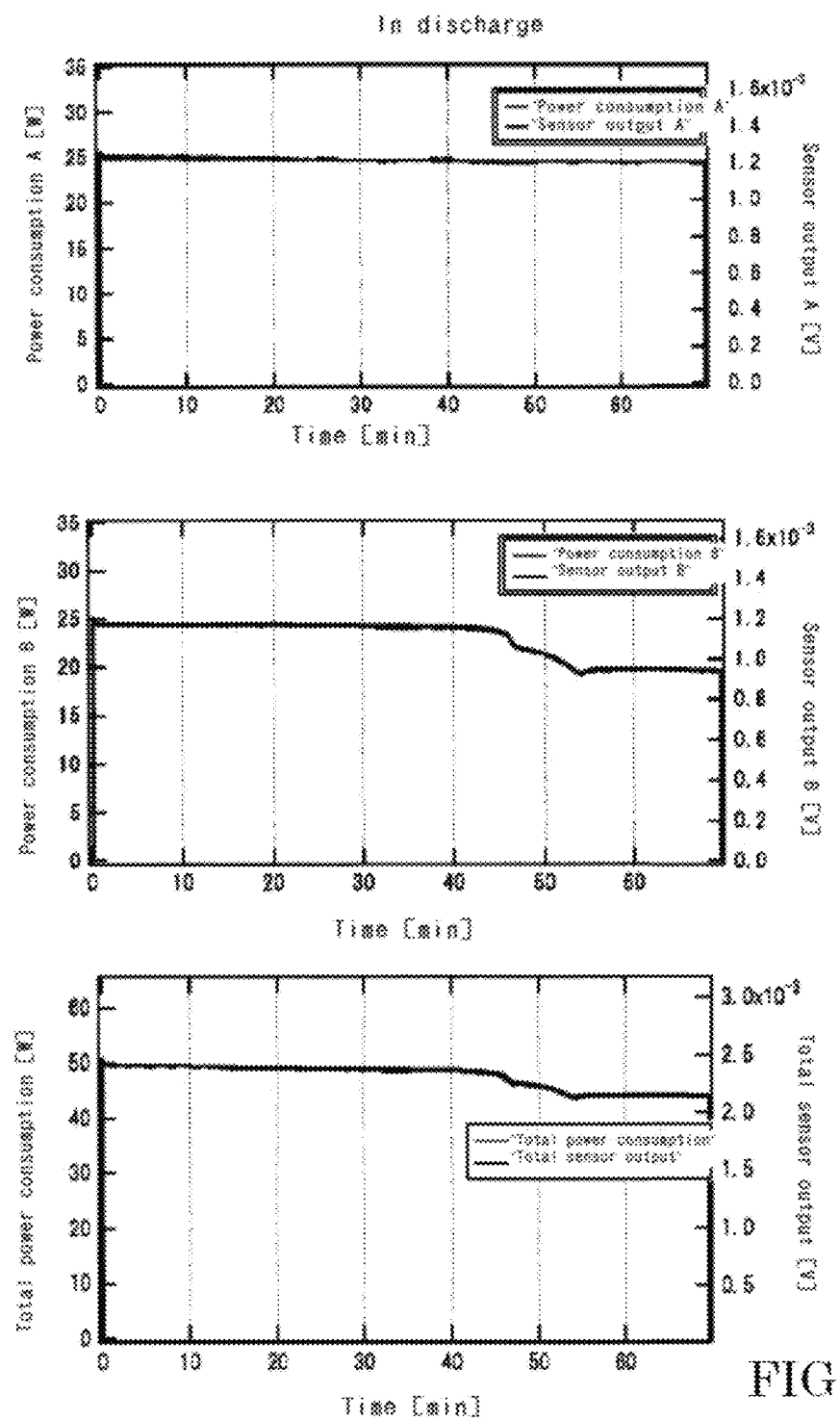
FIG. 50 are diagrams illustrating a result in discharge.
Figure 51A:
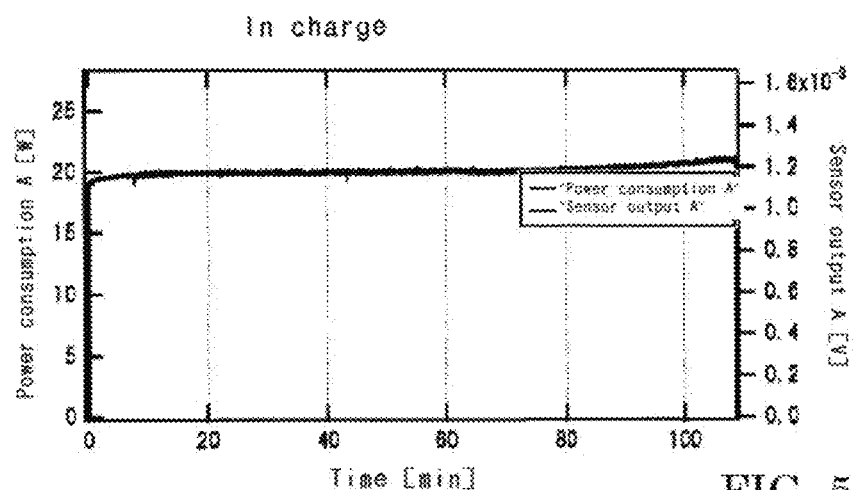
FIG. 51 are diagrams illustrating a result in charge.
Figure 51B:
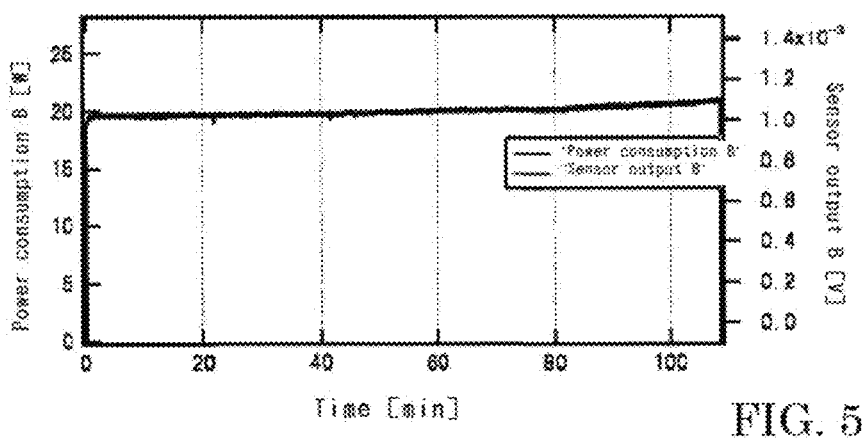
Figure 51C:
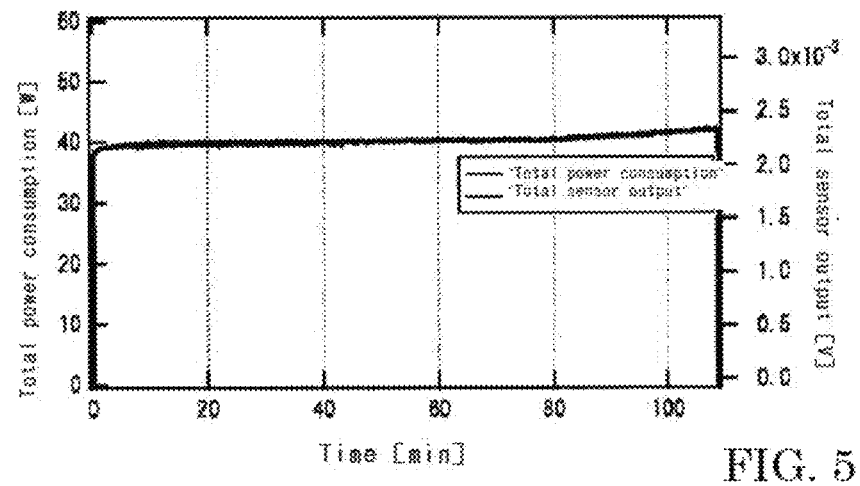

This time, 2 A constant-current discharge for discharge and 1.5 A constant current charge for charge are used, and the power of the battery A is measured by the sensor A, and the power of the battery B is measured by the sensor B. At this measurement, since the sensor output A is larger with the same power consumption in the previously conducted DC power measurement, a vertical bias magnetic field to be applied to the respective sensors is adjusted so that substantially the same sensor output is given with the same power consumption. FIG. 50 illustrate results of discharge and FIG. 51 illustrate results of charge.

FIG. 50(*a*) illustrates a relationship between power consumption and time of the battery A in discharge, FIG. 50(*b*) illustrates that of the battery B in discharge, and FIG. 50(*c*) illustrates that when the batteries A and B are in series. In any graph, a left vertical axis indicates power consumption (W), a right vertical axis indicates a sensor output (V), and a lateral axis indicates time (min).

Note that, though not shown, voltmeters are arranged at electrode terminals of the battery A and the battery B so that a current flowing throughout the measurement circuit can be measured, and charge power and power consumption (discharge power) of the battery A and the battery B can be measured individually.

By referring to FIG. 50, since the battery A is a new battery, constant power could be discharged during the measurement. Note that, when the power consumption and the sensor output are overlapped with each other, they indicate the same behavior which cannot be easily discriminated. Since the battery B is a deteriorated battery, power drop occurred in the second half of the measurement. In this case, too, it is known that the power consumption and the sensor output show exactly the same behavior.

When the batteries A and B are connected in series and they are seen entirely, the characteristics of the battery A and the battery B were added as they were, and at the portion where the discharge power of the battery B lowered, the entire characteristics also lowered. FIG. 51 are graphs similar to those in FIG. 50 except that charge is specified.

During discharge, discharge is performed for 70 minutes, while during charge, charge is performed for 110 minutes. It is known that power can be measured with accuracy both in charge and discharge. By mounting sensors in the individual batteries as in this measurement and by monitoring their outputs, if abnormality occurs in any of the batteries, it is possible to discover the battery with the abnormality, and it was shown that a role as a security sensor was performed.

As described above, a magneto-resistance effect type thin film power meter was used, and charge/discharge power measurement of an onboard battery was made. Prior to this, first, the magneto-resistance effect characteristic of the sensor to be used was measured, DC power measurement using the sensor was made, and confirmation of functioning as the power sensor, linearity of the sensor output, and accuracy was executed. The charge/discharge power measurement of the battery was made by using the two batteries, that is, the new battery and the battery deteriorated over time. It was confirmed that charge/discharge power could be measured with accurate sensor outputs.

In the above, only charge/discharge power measurement of the battery was used, but the thin film power sensor can also measure AC power (including harmonics) and N-th order harmonics. Such a multi-functional power sensing device was not present in the past. Moreover, since the sensor can be fabricated with the size of 5 mm×5 mm, the sensor can be incorporated in any home electrical appliances.

Figure 52A:
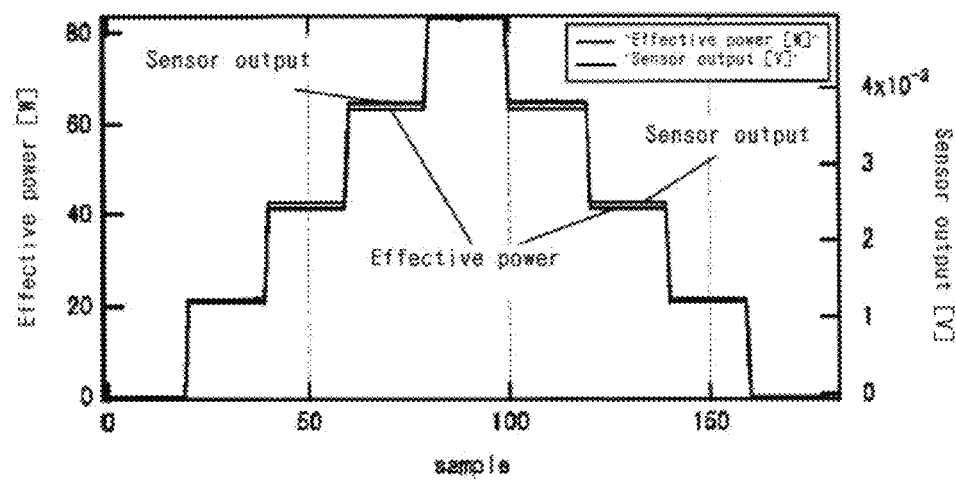
FIG. 52 are diagrams illustrating a power measurement result in the case of AC.
Figure 52B:
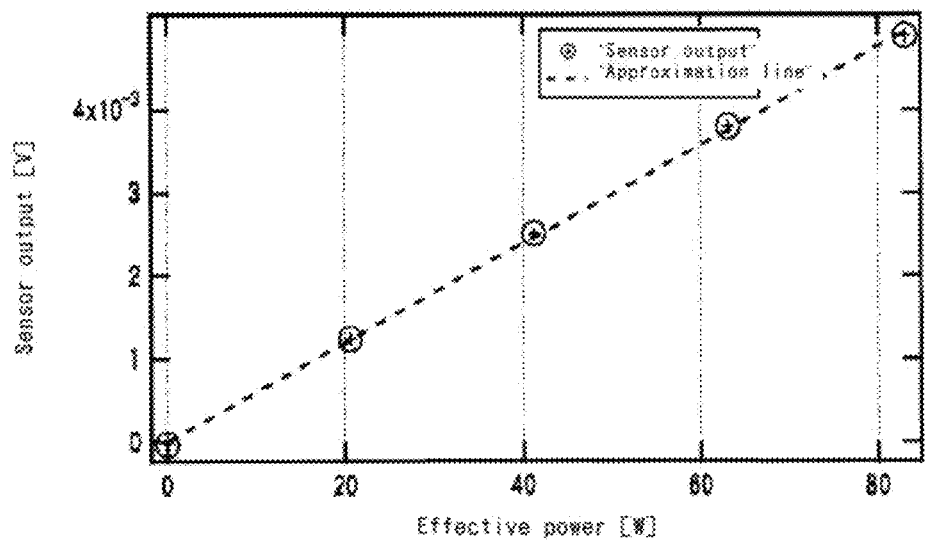

Note that in the circuit in FIG. 46, the DC power consumption was measured (FIGS. 47 and 48), but it was confirmed that AC could be similarly measured. FIG. 52 illustrate measurement result of cases in which a frequency is 60 Hz, a voltage is 20 V, and a current is 1 to 4 A. The measurement values at that time are shown in Table 4.

TABLE 4

| Effective power [W] | Average of sensor output [mV] | Converted value of sensor output [W] | Error [%] |
| --- | --- | --- | --- |
| 0.001025 | −0.0000305 | −0.595 | |
| 20.583 | 0.001239214 | 20.74108958 | 0.768058999 |
| 41.282125 | 0.002502578 | 41.97242356 | 1.672148802 |
| 63.15925 | 0.003801747 | 63.80547034 | 1.023160257 |
| 83.0765 | 0.004894998 | 82.17796789 | −1.08157194 |

Figure 53A:
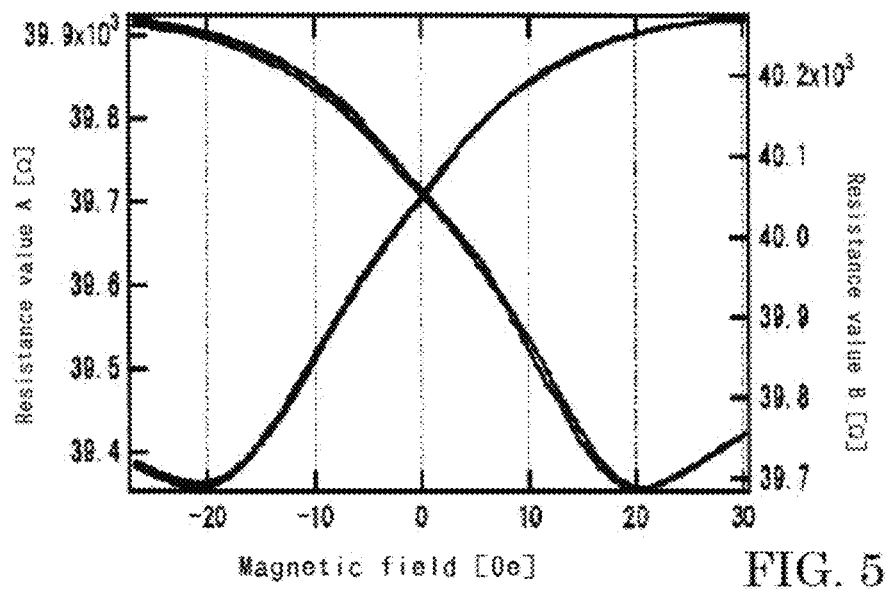
FIG. 53 are diagrams illustrating the magneto-resistance response curve when a size of a sensor is reduced.
Figure 53B:
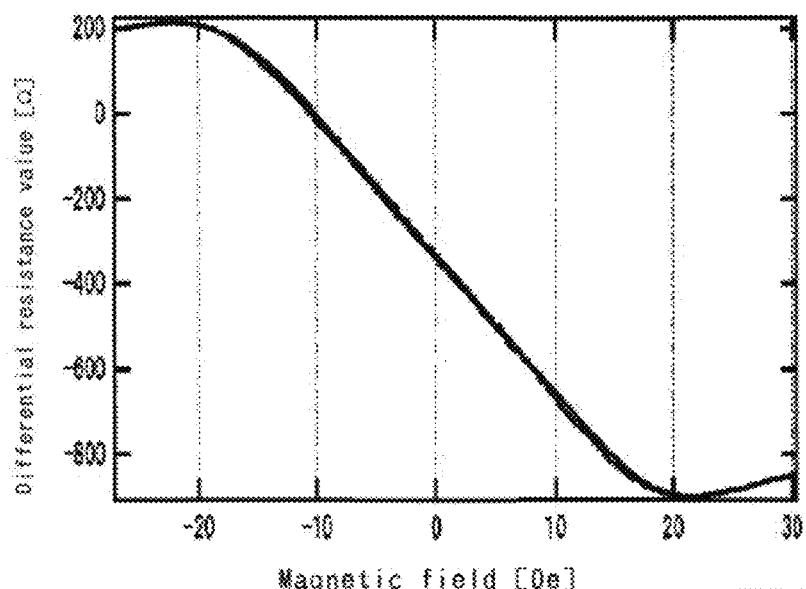
Figure 54A:
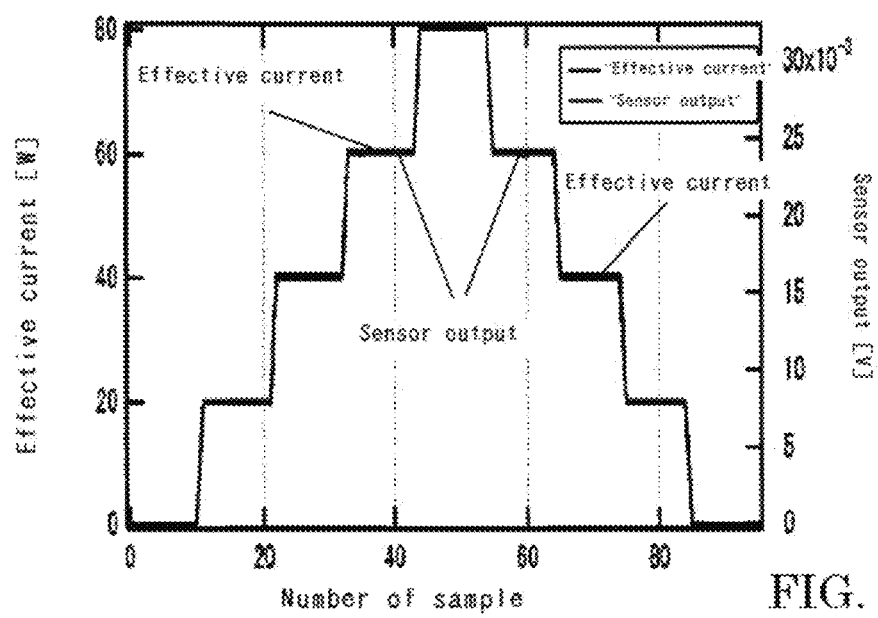
FIG. 54 are diagrams illustrating a power measurement result when the size of the sensor is reduced.
Figure 54B:
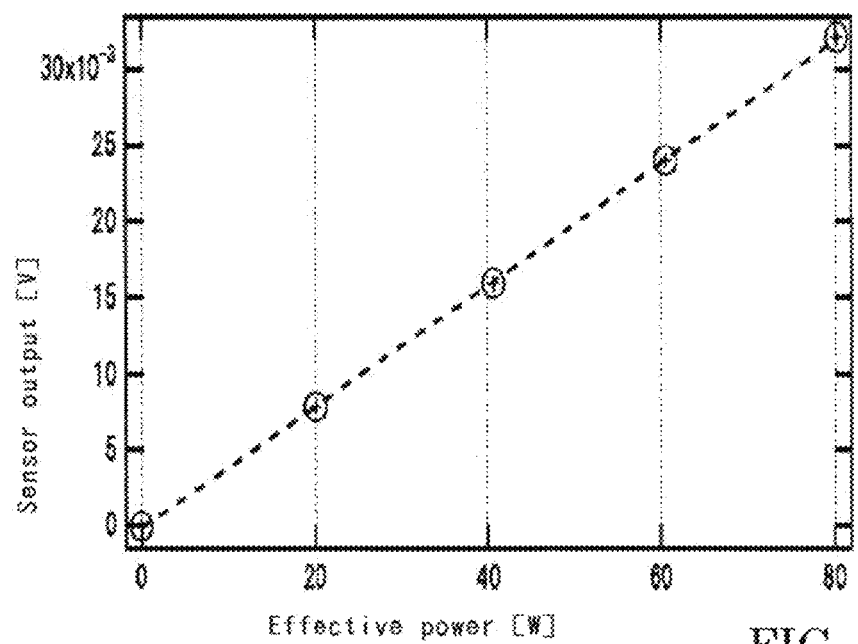

A sensor smaller (3 mm×3 mm) than the sensor in FIG. 45 was fabricated, and the similar characteristic could be obtained. The magneto-resistance response curve of the sensor is illustrated in FIG. 53, and the power measurement results in FIG. 54. Similarly to the case of DC, it is known that measurement could be made with favorable linearity.

INDUSTRIAL APPLICABILITY

The battery system of the present invention can be widely used as a power supply for those driven by using electricity such as an automobile, an aircraft, a ship and the like and an autonomously driven robot whether it is industrial or consumer use. Moreover, the charge/discharge measuring device according to the present invention can be used not only for a system using a battery but also for measurement of power consumption at a place where electricity is used whether it is industrial or consumer use.

REFERENCE NUMERALS

1 magnetic film power sensor
1*a* conductor film
1*b* insulating film
1*c* magnetic film
3 rectification circuit (bridge circuit)
4 charger
5 selector switch
26 sensor resistor
27 sensor voltmeter
28 conductor film
29 magnetic film
30 battery system
30*t*1, 30*t*2 external terminal
32 secondary battery
34 magnetic film power sensor
36 battery voltmeter
40 inspection resistor
42 inspection switch
44 connection switch
46 control portion
46*t* timer
48 display unit
50 charger
52 load
R1 load
R2 resistor
R3 dummy resistor
Rcu primary conductor
Rmr magnetic film

The invention claimed is:
1. A battery system comprising:
a secondary battery capable of charge/discharge;
an inspection resistor connected between terminals of the secondary battery via an inspection switch;

a pair of external terminals to which a charger that charges the secondary battery is connected;

a battery voltmeter for measuring a voltage between both electrodes of the secondary battery;

a serially connected magnetic film and a sensor resistor between the terminals of the secondary battery, the magnetic film being arranged close to a connection line between the secondary battery and the external terminals;

a sensor voltmeter for measuring a voltage of the magnetic film;

a timer for measuring charging time from a state in which a voltage between the electrodes of the secondary battery is a charge start voltage to a state in which the voltage between the electrodes of the secondary battery is a charge end voltage based on a measurement result of the battery voltmeter when the secondary battery is charged; and a control unit for controlling the inspection switch and calculating a remaining power amount of the secondary battery based on a measurement result of the timer and a power consumed by the inspection resistor measured by the sensor voltmeter.

2. A battery system comprising:

a secondary battery capable of charge/discharge;

a pair of external terminals to which a charger that charges the secondary battery is connected;

a battery voltmeter for measuring a voltage between both electrodes of the secondary battery;

a serially connected magnetic film and a sensor resistor between the terminals of the secondary battery, the magnetic film being arranged close to a connection line between the secondary battery and the external terminals;

a sensor voltmeter for measuring a voltage of the magnetic film; and a control unit for calculating a charge power amount during a state in which a voltage between the electrodes of the secondary battery is a charge start voltage to a state in which the voltage between the electrodes of the secondary battery is a charge end voltage based on measurement results of the battery voltmeter and the sensor voltmeter when the secondary battery is charged.

3. The battery system according to claim 1, wherein the control unit is configured to control the inspection switch so as not to flow a current in the inspection resistor when the secondary battery is charged;

control the inspection switch so as to flow a current in the inspection resistor when the charge is finished; and control the inspection switch so as not to flow a current in the inspection resistor after a measurement result due to a current flowing in the inspection resistor measured by the sensor voltmeter is obtained.

4. The battery system according to claim 1, wherein a direction of a current flowing in a connection line arranged close to the magnetic film is identical to a direction of a magnetization axis of the magnetic film.

5. The battery system according to claim 2, wherein the control unit accumulates a charge power for every microtime during the state in which the voltage between the electrodes of the secondary battery is the charge start voltage to the state in which the voltage between the electrodes of the secondary battery is the charge end voltage to calculate the charge power amount when the secondary battery is charged.

6. The battery system according to claim 2, wherein a gain of a magnetic film power sensor when the secondary battery is charged is identical to the gain when the secondary battery is discharged, the magnetic film power sensor comprised of a connection line arranged closed to the magnetic film, the sensor resistor, and the sensor voltmeter.

7. The battery system according to claim 2, wherein a direction of a current flowing in a connection line arranged close to the magnetic film is identical to a direction of a magnetization axis of the magnetic film.

8. A charge/discharge measuring apparatus comprising:

a load resistor comprising a first terminal and a second terminal, the first terminal being connected to a first electrode of a secondary battery;

a conductor film comprising a third terminal and a fourth terminal, the third terminal being connected to a second electrode of the secondary battery;

a switch configured to control which of the second terminal of the load resistor and a charger configured to charge the secondary battery is to be connected to the fourth terminal of the conductor film;

a magnetic film arranged in parallel with the conductor film and connected between the first electrode of the secondary battery and the second terminal thereof; and a voltage detector configured to detect a voltage change in the magnetic film.

* * * * *